(12) United States Patent
Percival

(10) Patent No.: US 11,579,171 B1
(45) Date of Patent: Feb. 14, 2023

(54) PROBE CARD FOR CHARACTERIZING PROCESSES OF SUBMICRON SEMICONDUCTOR DEVICE FABRICATION

(71) Applicant: Meta Platforms Technologies, LLC, Menlo Park, CA (US)

(72) Inventor: Christopher Percival, Cork (IE)

(73) Assignee: Meta Platforms Technologies, LLC, Menlo Park, CA (US)

( * ) Notice: Subject to any disclaimer, the term of this patent is extended or adjusted under 35 U.S.C. 154(b) by 115 days.

(21) Appl. No.: 16/538,723

(22) Filed: Aug. 12, 2019

Related U.S. Application Data

(60) Provisional application No. 62/806,656, filed on Feb. 15, 2019.

(51) Int. Cl.
  *G01R 1/067* (2006.01)
  *G01R 1/073* (2006.01)
  (Continued)

(52) U.S. Cl.
  CPC ......... *G01R 1/07342* (2013.01); *G01Q 60/40* (2013.01); *G01Q 70/06* (2013.01);
  (Continued)

(58) Field of Classification Search
  CPC ............ G01R 1/06727; G01R 1/06738; G01R 1/06744; G01R 1/07307; G01R 1/07342; G01R 31/2648; G01R 31/2831; G01R 31/2884; G01R 31/2889; G01R 33/0385; G01R 1/067; G01R 1/06711; G01R 31/2825; G01R 33/10; G01R 33/1223; G01Q 60/38; G01Q 60/42; G01Q 70/12; G01Q 70/16; G01Q 80/00; G01Q 10/06; G01Q 60/56; G01Q 40/02; H01L 2924/3011; H01L 2924/12041; H01L 2924/12044; H01L 41/1136;
  (Continued)

(56) References Cited

U.S. PATENT DOCUMENTS

| 5,020,219 A * | 6/1991 | Leedy ................ G01R 1/07307 |
| | | 216/11 |
| 5,323,107 A * | 6/1994 | D'Souza ........ G01R 31/318533 |
| | | 324/750.3 |
| 6,414,501 B2 * | 7/2002 | Kim ................... G01R 1/06727 |
| | | 324/755.07 |
| 6,724,204 B2 * | 4/2004 | Cho ................... G01R 1/07307 |
| | | 324/755.07 |

(Continued)

*Primary Examiner* — Vinh P Nguyen
(74) *Attorney, Agent, or Firm* — Shook, Hardy & Bacon LLP

(57) ABSTRACT

Probe cards for probing highly-scaled integrated circuits are provided. A probe card includes a backplane and an array of probes extending from the backplane. Each of the probes includes a cantilever member and a probe tip. A first end of the cantilever member is coupled to the backplane, such that the cantilever member extends from the backplane. The probe tip extends from a second end of the cantilever member. The probes are fabricated from semiconductor materials. Each probe is configured to transmit electrical signals between the backplane and a device under test (DUT), via corresponding electrodes of the DUT. The probes are highly-scaled such that the feature size and pitch of the probes matches the highly-scaled feature size and pitch of the DUT's electrodes. The probes comprise atomic force microscopy (AFM) probes that are enhanced for increased electrical conductivity, elasticity, lifetime, and reliability.

19 Claims, 23 Drawing Sheets

(51) Int. Cl.
*G01R 31/28* (2006.01)
*G01R 31/26* (2020.01)
*G01R 31/27* (2006.01)
*G01Q 60/40* (2010.01)
*G01Q 70/14* (2010.01)
*G01Q 70/06* (2010.01)
*G02B 27/01* (2006.01)

(52) U.S. Cl.
CPC ......... *G01Q 70/14* (2013.01); *G01R 1/06727* (2013.01); *G01R 31/2635* (2013.01); *G01R 31/275* (2013.01); *G01R 31/2887* (2013.01); *G01R 31/2891* (2013.01); *G02B 27/0172* (2013.01); *G02B 2027/0178* (2013.01)

(58) Field of Classification Search
CPC ............. H01L 2251/5338; H01L 2924/12043; H01L 41/047; H01L 41/094; H01L 2924/12036; H01L 29/66742; G01L 21/12; G01L 1/24; G01L 5/0047; G06F 11/0766; G06F 19/00; G01J 2001/446; G01J 1/44; G01B 5/28; G11C 13/025; G11C 2213/81; G11C 17/16; G11C 17/165; B82Y 10/00; B82Y 30/00; B82Y 35/00; B82Y 40/00; B82Y 15/00; H01J 2201/30469; B82B 1/00; G01N 27/127
See application file for complete search history.

(56) References Cited

U.S. PATENT DOCUMENTS

| | | | | |
|---|---|---|---|---|
| 6,871,528 | B2* | 3/2005 | Schlaf | B82Y 10/00 73/105 |
| 7,042,241 | B2* | 5/2006 | Tervo | G01R 1/06711 324/755.11 |
| 7,091,729 | B2* | 8/2006 | Kister | G01R 1/06733 324/755.07 |
| 7,396,564 | B2* | 7/2008 | Tai | G01Q 70/16 427/249.1 |
| 7,504,842 | B2* | 3/2009 | Schwindt | H01R 11/18 324/755.07 |
| 7,808,260 | B2* | 10/2010 | Tran | G01R 1/07357 324/754.01 |
| 7,952,377 | B2* | 5/2011 | Kister | G01R 1/06733 324/762.01 |
| 8,130,007 | B2* | 3/2012 | Eldridge | G01R 1/06716 324/755.01 |
| 8,272,124 | B2* | 9/2012 | Fang | G01R 3/00 29/877 |
| 8,726,411 | B1* | 5/2014 | Tseng | G01Q 70/14 850/58 |
| 2010/0252317 | A1* | 10/2010 | Gritters | H01L 25/0657 29/875 |
| 2011/0160088 | A1* | 6/2011 | Park | G01Q 60/42 506/16 |
| 2015/0067932 | A1* | 3/2015 | Neu | G01Q 60/38 850/33 |
| 2020/0241043 | A1* | 7/2020 | Shiv | G01R 1/06738 |

* cited by examiner

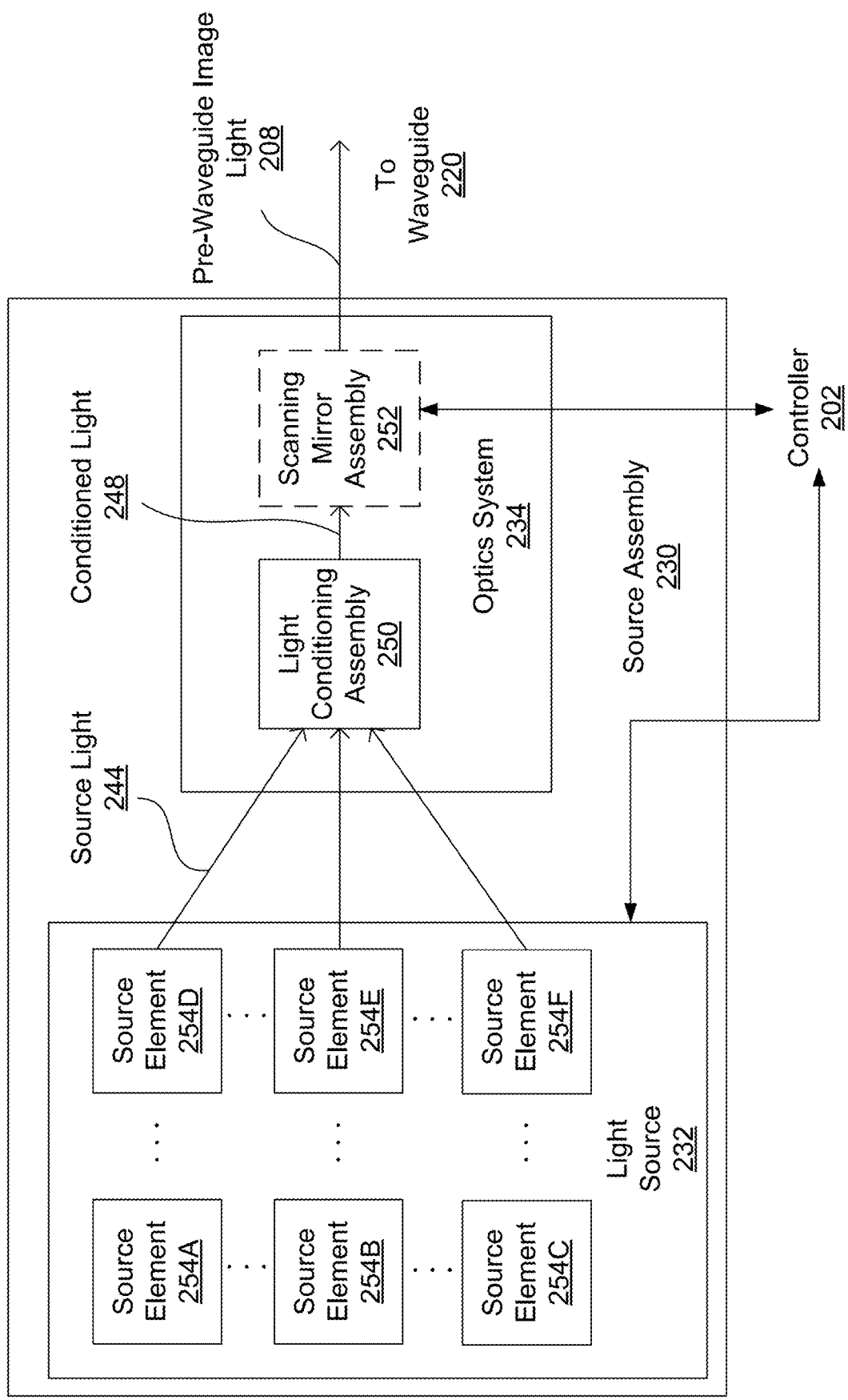

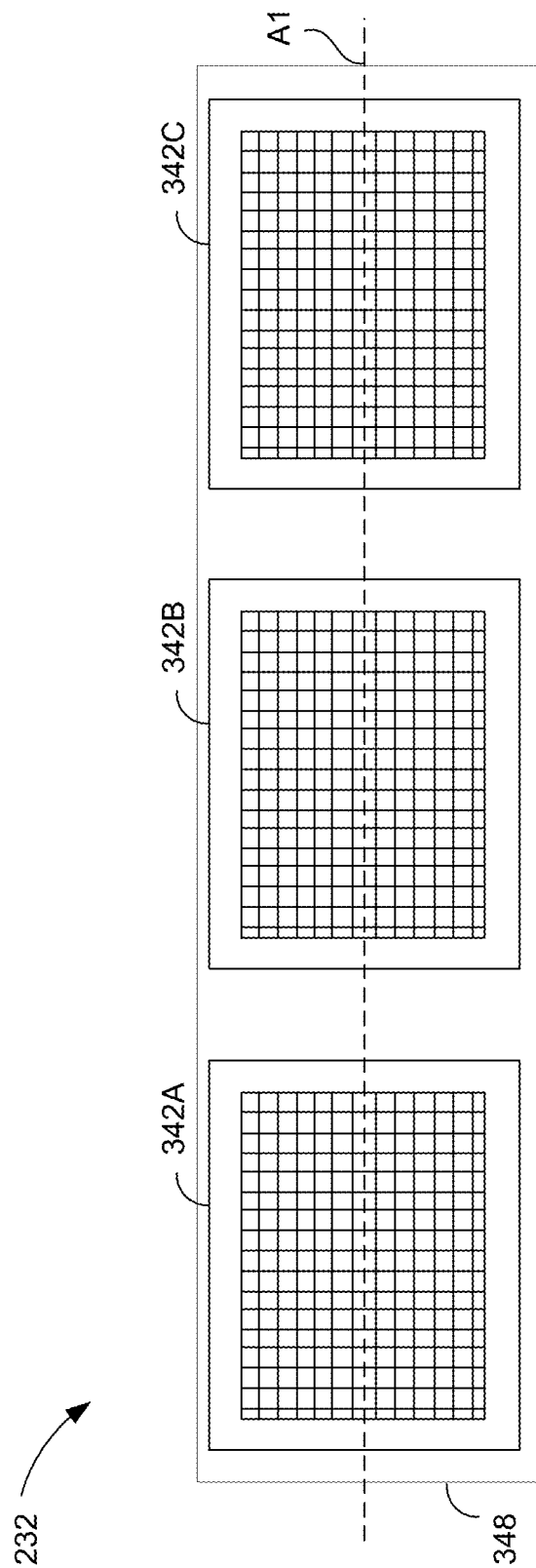

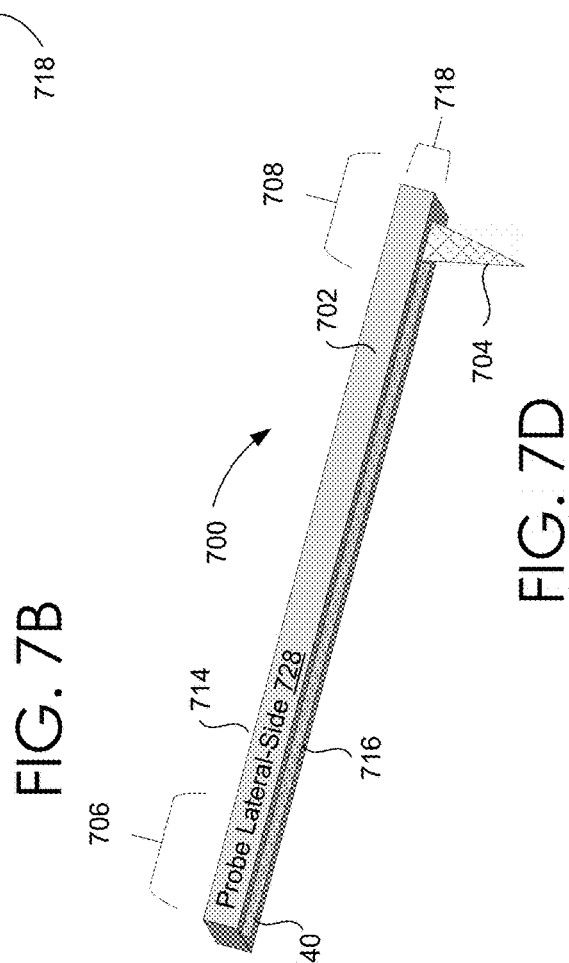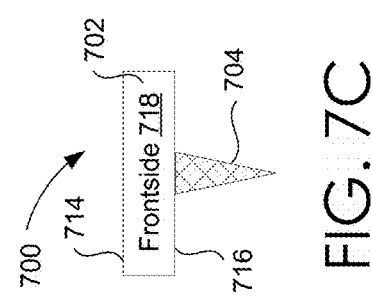

PROBE CARD FOR CHARACTERIZING PROCESSES OF SUBMICRON SEMICONDUCTOR DEVICE FABRICATION

CROSS-REFERENCE TO RELATED APPLICATIONS

This application claims priority to U.S. Provisional Patent Application 62/806,656 filed on Feb. 15, 2019, and entitled "ENHANCED PROBE TIPS AND ENHANCED ARRAYS OF PROBE TIPS FOR PROBING AND TESTING SEMICONDUCTOR DEVICES AND ARRAYS OF SEMICONDUCTOR DEVICES AT THE WAFER LEVEL," the contents of which are incorporated herein in their entirety.

BACKGROUND

The present disclosure relates to the manufacture and assembly of electronic display devices.

Electronic displays are a core component of many computing devices, such as smart phones, tablets, smartwatches, laptops, desktops, televisions (TVs), and head-mounted devices (e.g., virtual reality (VR) devices, augmented reality (AR) devices, and/or mixed-reality (MR) devices). Near-eye displays (NEDs), such as those included in head-mounted devices, benefit from a sufficiently high definition (i.e., a significant pixel density), as well as fast refresh rates and high luminance levels.

SUMMARY

Embodiments of the present invention relate to enhanced probe cards employable to characterize current and future fabrication processes of semiconductor foundries. The enhanced probe cards include individually-addressable probes that are scaled to feature sizes and densities of current fabrication processes, as well the as even more highly-scaled feature sizes and densities of the expected fabrication processes of the foreseeable future. In the various embodiments, large arrays of atomic force microscopy (AFM) probes may be fabricated on, or otherwise integrated into, a backplane of the probe card. The backplane is enabled to selectively address each individual AFM probe for receiving and/or sending (i.e., transmitting) test signals. Various electrical (e.g., electrical conductance and/or resistance) and mechanical (e.g., hardness, brittleness, and/or elasticity) properties of the AFM probes may be modified from that of conventional AFM probes based on the architecture of the devices-under-test (DUTs) and aspects of the characterization tests. Such considerations include, but are not limited to the required drive current and/or voltage of the tests signals, the temporal duration of the test signals, the number integrated circuits to be tested on the die, and the like. Thus, the various embodiments may be employed to properly and efficiently characterize current, as well as future, highly-scaled fabrication processes of current and future semiconductor foundries.

Embodiments are generally directed towards enhanced testing devices (e.g., enhanced probe cards) for testing and/or probing a DUT. The DUT may be a highly-scaled DUT. The DUT may include one or more rows of contact pads of small feature size and of significantly large numbers and/or density. In non-limiting embodiments, the DUT may include one or more light-emitting components, such as but not limited to a light-emitting diode (LED) or a microLED (μLED). A DUT may include >$10^6$ μLEDs integrated onto a single die. A DUT may include a semiconductor die that is not packaged, and the die's contact pads may be exposed for probing. In at least one embodiment, the characterization tests are performed on a die prior to the cutting (i.e., dicing) of the semiconductor wafer to physically separate the individual die. As such, the enhanced probe cards may be employable to probe DUTs at the wafer-level.

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

BRIEF DESCRIPTION OF THE DRAWINGS

The present invention is described in detail below with reference to the attached drawing figures, wherein:

FIG. 2C illustrates a block diagram of the source assembly of FIGS. 2A-2B, in accordance with various embodiment;

FIG. 4 shows a top view of a light source that includes a 1D configuration of emitter arrays, according to some embodiments;

FIGS. 7A-7D include diagrams illustrating an enhanced probe from various views, in accordance with various embodiments;

DETAILED DESCRIPTION

Figure 1A:
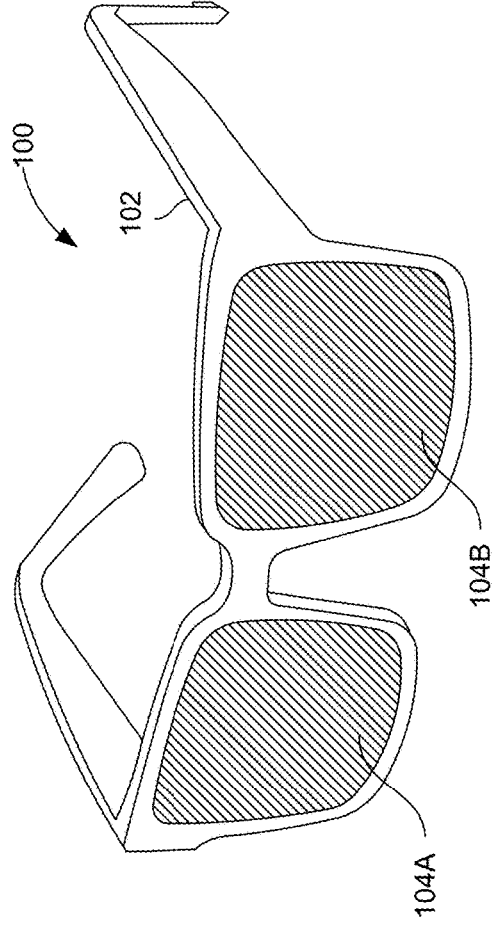
FIG. 1A is a diagram of a head-mounted device according to some embodiments.

In the semiconductor industry, the demand for smaller feature sizes and increased circuit density continues, and is expected to continue into the foreseeable future. For example, monolithic integrated circuits (IC) used to generate light for near-eye displays (NEDs) may include >$10^6$ individual light-emitting components (LECs) integrated on a single highly-scaled chip, with contact pad submicron feature sizes and pitches on the order of a few microns (μm). Micro light-emitting diodes (μLEDs) are a good candidate for the LECs for the pixels in such NEDs, at least due in part to their small mass and feature size, as well as their low power requirements.

Prior to utilizing a μLED as a light source within a NED, the μLED's fabrication process is typically characterized (e.g., acquiring statistics indicating the electrical and optical properties of the μLED fabricated from the process). That is, post-fabrication but prior to packaging the μLED and assembling the NED, the electrical and light-emitting properties of a statistically significant sample of μLED die from the same fabrication process are tested. To characterize the fabrication process, the contact pads of the die are exposed for probing and the test data is typically acquired from electrical and optical tests performed at the wafer level. To test an individual die (e.g., perform electrical and optical measurements on individual μLEDs integrated on the die), the die is electrically probed, via the exposed contact pads for each of the individual μLEDs. These electrical and optical measurements may be employed to generate statistical distributions that characterize the process used for fabricating the μLEDs.

For μLEDs utilized in NEDs, a single die may include upwards of a million individual μLEDs, arranged in 1D or 2D arrays. The pitch of the exposed contact pads may be less than 5 microns (μm), while the feature size of the contact pads may be submicron. The small feature size and high-density of the contact pads presents challenges that limit the ability to accurately, efficiently, reliably, and within a reasonable timeframe, probe the individual μLEDs of the die via conventional techniques and hardware.

To adequately characterize a fabrication process for such highly-scaled semiconductor devices (e.g., currently available and future semiconductor devices), probe cards with probes of feature sizes and densities similar to the feature size and densities of the contact pads of the semiconductor device to be tested, (i.e., the device-under-test (DUT)) are required. As discussed throughout, conventional architectures for probe cards cannot accommodate such highly-scaled probes. Thus, conventional probe cards are not adequate to properly and efficiently characterize even current fabrication processes, much less the more highly-scaled fabrication processes of the expected future.

To address such inadequacies of conventional probe cards, the embodiments disclosed herein are directed towards enhanced probe cards that overcome these and other limitations of conventional probe cards. The enhanced probe cards include individually-addressable probes that are scaled to feature sizes and densities of current fabrication processes, as well the as even more highly-scaled feature sizes and densities of the expected fabrication processes of the foreseeable future. In the various embodiments, large arrays of atomic force microscopy (AFM) probes may be fabricated on, or otherwise integrated into, a backplane of the probe card. The backplane is enabled to selectively address each individual AFM probe for receiving and/or sending (i.e., transmitting) test signals. Various electrical (e.g., electrical conductance and/or resistance) and mechanical (e.g., hardness, brittleness, and/or elasticity) properties of the AFM probes may be modified from that of conventional AFM probes based on the architecture of the DUTs and aspects of the characterization tests. Such considerations include, but are not limited to, the required drive current and/or voltage of the tests signals, the temporal duration of the test signals, the number of integrated circuits to be tested on the die, and the like. Thus, the various embodiments may be employed to properly and efficiently characterize current, as well as future, highly-scaled fabrication processes of current and future semiconductor foundries.

More specifically, embodiments are directed towards enhanced testing devices (e.g., enhanced probe cards) for testing and/or probing a DUT. The DUT may be a highly-scaled DUT, such as but not limited to any of the various semiconductor devices discussed throughout. The DUT may include one or more rows of electrodes, electrical contacts, and/or contact pads of small feature size and of significantly large numbers and/or density. In non-limiting embodiments, the DUT may include one or more LECs, such as but not limited to a light-emitting diode (LED) or a microLED (μLED). A DUT may include a semiconductor die that is not packaged, and the die's contact pads (i.e., the die's electrodes and/or electrical contacts) may be exposed for probing. In at least one embodiment, the characterization tests are performed on die prior to the cutting (e.g., dicing) of the semiconductor wafer to physically separate the individual die. As such, the enhanced probe cards may be employable to probe DUTs at the wafer-level.

The feature size of the die's electrodes or contact pads may be small (e.g., submicron), while the number and density of the electrodes may be significant. For instance, an individual die may include thousands, tens of thousands, hundreds of thousands, or even millions of individual μLEDs arranged in 1D or 2D arrays. In some embodiments, the contacts pads are arranged in one or more rows. Each row may include hundreds or even thousands of contact pads, with each contact pad corresponding to a microcircuit (e.g., an individual μLED) of the DUT. In some embodiments, more than one contact pad is associated with an individual microcircuit of the die, and simultaneous probing may be required for testing the performance of the microcircuit. For instance, to test a diode, such as but not limited to μLED, each of the diode's anode (e.g., p-contact) and cathode (e.g., n-contact) may be simultaneously probed with the enhanced probe cards herein.

A die may include hundreds or even thousands of rows of contact pads. Corresponding contact pads in two adjacent rows may include contact pads for the same microcircuit. For example, a first row of contact pads may include the anodes of the LEDs, while a second row of contact pads that is adjacent to the first row may include the cathodes of the LEDs. Thus, two corresponding contact pads in two adjacent rows (e.g., two contact pads in the same column and adjacent rows) may be simultaneously probed via the enhanced probe cards discussed herein. The feature size of individual contact pads may be submicron, while the pitch of the contacts pads (i.e., the distance between consecutive and/or adjacent contact pads within a row) may be as small as one or two microns (µm). The distance between adjacent rows (e.g., the pitch of the columns) may be similar, or different, to that of the pitch of a row.

The enhanced probe cards disclosed within, provide probes and probe tips that are scaled to numbers, feature sizes, pitches, and/or densities of such a DUT. Thus, in contrast to conventional probe cards, the enhanced embodiments are enabled to accurately, efficiently, and reliably probe the individual contact pads of DUTs with these small feature sizes and large numbers and densities of contact pads. Accordingly, the embodiments may be employed to characterize current and future fabrication processes.

More specifically, an enhanced probe card may include a backplane and an array of probes extending from the backplane. Each of the probes in the array may include a cantilever member and a probe tip. A first end of the cantilever member may be coupled to the backplane such that the cantilever member extends from the backplane. The probe tip may extend from a second end of the cantilever member. That is, a proximate portion of the cantilever member is coupled to the backplane and the probe tip is positioned on a distal portion of the cantilever member. The probes may be fabricated from one or more semiconductor materials, such as but not limited to silicon. In some embodiments of an enhanced probe, both the cantilever member and the probe tip are fabricated from the one or more semiconductor materials. The probe tip is an electrically-conductive probe tip. The electrically-conductive probe tip is electrically coupled to the backplane. In some non-limiting embodiments, the semiconductor material of the cantilever member may be relatively electrically-insulating. In such embodiments, the relatively electrically-insulating cantilever member may include one or more electrically-conductive tracks and/or traces that electrically couple the backplane to a probe's electrically-conductive probe tip. That is, an electrical signal may be transmitted between the backplane and the electrically-conductive probe tip. In other embodiments, the semiconductor material of cantilever member may be electrically-conductive, and thus, the cantilever member may transmit electrical signals between the backplane and the probe tip. Whether the signals are transmitted along the cantilever member via a conductive track/trace or the conductive material of the cantilever member itself, each probe may be configured to transmit electrical signals between the backplane and the DUT, via corresponding electrodes of the DUT's row of electrodes, when the probe's probe tip is in electrical contact with the corresponding electrode of the row.

In some non-limiting embodiments, each of the probes in the array of probes may be and/or include an atomic force microscopy (AFM) probe. In some embodiments, the AFM probes may be enhanced AFM probes, where various electrical and/or mechanical properties of the AFM probe have been modified and/or enhanced, from that of conventional AFM probes to accommodate the tests to be performed. For example, the electrical conductivity and elasticity of the probes (including the cantilever members, conductive traces/tracks, and/or the probe tips) may be enhanced to enable the transmission of large amounts of electrical current for longer amounts of time, and provide more durability to accommodate larger numbers of "touchdown" and "lift-off" events, than that of a conventional AFM probes. In some embodiments, an array of probes may include 64, 256, 512, or even more probes. In at least one embodiment, an array of probes includes 1028 probes. Some embodiments may include thousands of probes.

In contrast to the enhanced probe cards discussed herein, conventional probe cards are limited in the ability to accurately, efficiently, and reliably probe a DUT with such small contact pad feature sizes and pitches. Furthermore, for a DUT with such large numbers and densities of contact pads, a conventional probe card would be limited in the ability to probe each individual contact pad within a reasonable timeframe.

For example, the probe tips of conventional probe cards may be larger than the submicron contact pads of such DUTs. Even if some conventional probe tips are sized corresponding to submicron contact pads, the conventional shank that extends the probe tip to the contact pad is larger than the probe tip. Because of limitations on miniaturizing conventional shanks and conventional probe tips, such probe cards cannot match contact pads that are submicron in feature size or on the order of a few microns in pitch. For instance, conventional micro-electromechanical system (MEMS) probe cards are often fabricated in a bed-of-nails configuration, where metallic probe tips (in contrast to the semiconductor probe tips of the embodiments herein) are arranged in a row and coupled to the backplane of the probe card via an elastic element (e.g., a spring). Due to limitations of the fabrication process, these bed-of-nails configurations are limited to pitches on the order of 10 or 20 microns. Such conventional probe cards could not simultaneously contact adjacent contact pads that are separated by less than 10 microns. Thus, conventional MEMS probe cards would be limited to probing only a sample of the electrodes in a row of contact pads, or else require large numbers of "touchdown" events to test the entire row, which significantly increases the complexity and the time required to probe the entire row. At least because of the required numerous touchdown events, these conventional probe cards could not characterize a fabrication process within a reasonable amount of time.

In contrast to the limitations of conventional probe cards, by leveraging and enhancing semiconductor processes for fabricating AFM probes, the enhanced probe cards discussed herein include highly-scaled probe tips with feature sizes and pitches that correspond to the feature sizes and pitches of the above discussed DUTs. The number and density of the probes of the enhanced probe cards are scaled such that a one-to-one (or at least a near one-to-one) correspondence between adjacent probes and adjacent contact pads of a row is possible. That is, the spacing between adjacent probe tips (i.e., the pitch) substantially matches the spacing of adjacent contact pads of the DUT. Thus, an entire row (or at least a portion of a portion of the row) may be probed via a single touchdown event of the probe card. Accordingly, via the enhanced probe cards, the fabrication process may be characterized efficiently, within a reasonable time frame, and without excessive physical and/or electrical degradation of the probe tips due to an increased number of touchdown events required for the testing with a conventional probe card.

Furthermore, the backplane may be a multilayer backplane that includes signal drive and/or readout circuitry, as well as multiplexer (MUX) and demultiplexer (DEMUX) circuitry, such that each of the probes and the corresponding probe tips are individually addressable and the backplane may selectively send and/or receive test signals to and from individual probes. Accordingly, each contact pad (and the corresponding circuitry) of the DUT may be selectively probed when the enhanced electrically-conductive probe tips are in electrical contact with the contact pads. Some embodiments may include a 2D array of probes such that multiple rows of contact pads may be probed via a single touch event of the probe card.

Although the various embodiments discussed herein are directed towards probe cards for probing the contact pads of highly-integrated and highly-scaled µLEDs integrated on a die (e.g., a DUT), the embodiments are not so limited, and the enhanced probe cards may be employed to probe virtually any semiconductor device. In addition to an unpackaged die, at least some of the embodiments are enabled to probe packaged die, e.g., integrated chips (ICs). The term "probe" as used herein as a noun may refer to a component of a probe card that includes a probe tip and is configured and arranged to transmit (e.g., send and/or receive) one or more electrical signals between a backplane of the probe card and the probe tip of the probe. The term "probe" as used herein as a verb may refer to sending and/or receiving (i.e., transmitting) one or more electrical signals (e.g., test signals) to and/or from a contact pad of a DUT, via a probe of a probe card. A non-limiting example of the uses of the term probe may include: "when the probe tip of a probe is in electrical contact with an electrode of a DUT, the probe card may be utilized to probe one or more circuits of the DUT that correspond to the DUT's electrode." As used herein, the term "touchdown event" refers to the mechanically translating (e.g., lowering) at least one of a probe card or a DUT, such that the probe tips of the card come into electrical and/or mechanical contact with the corresponding contact pads of the die. The term "liftoff event" refers to mechanically translating (e.g., raising) at least one of a probe card or a DUT, such that an electrical and/or mechanical contact between probe tips of the card and the corresponding contact pads of the die is terminated. As used herein, the terms "contact pads," "electrodes," "interconnects," "bonding pads," and "electrical contacts" may be used interchangeably to refer structures of a DUT that enable the transmission of electrical signals to and from the microcircuits of the DUT.

The one or more sent and/or received electrical signals may be employed to test the electrical and/or optical performance of the DUT. Thus, probing a DUT, via an enhanced probe card, enables the characterization of the fabrication process that was employed to fabricate the DUT. In some non-limiting embodiments, the characterized fabrication process may be employed to fabricate semiconductor devices (e.g., µLEDs) employed in various near-eye displays (NEDs) and/or various head-mounted computing devices (HMDs) (e.g., virtual-reality, augmented-reality, and/or mixed-reality headwear or glasses), such as but not limited to the various embodiments of HMDs and/or NEDs discussed throughout.

As used herein, characterizing of a semiconductor process may include but is not limited to measuring various electrical and/or optical properties of a DUT fabricated with the semiconductor process, by generating and/or acquiring test data provided to the DUT and/or test data received from the DUT via an enhanced probe card. Such electrical properties include but are not limited to the electrical performance of microcircuits included in the DIT, e.g., I-V curves. Such optical properties include, but are not limited to luminosity and/or wavelength of light generated by a DUT, in response to receiving a current and/or a voltage, i.e., test signals. The enhanced probe cards discussed herein may be employed to probe the DUT to provide and/or receive such test data. Some of the test data may be acquired via other devices than a probe card. For example, when probed via an enhanced probe card, an µLED may generate light. The light may be received by a photo-detector, such as but not limited to photo-detector 1162 of FIG. 11. The photo-detector may generate a test signal that encodes the luminosity, frequency, and/or wavelength of the received light. As used herein, a feature size may refer to the at least approximate size of various structures of a DUT, a probe, or any other semiconductor devices. For example, the feature size of contact pads of a DUT may be discussed, as well as the feature size of the probe and/or probe tip. The term scaling may be used throughout, and may refer to the trends of feature size and/or feature densities, e.g., Moore's Law.

Exemplary Embodiment of a Head-Mounted Computing Device

Light-emitting components (e.g., micro light-emitting diodes) may be used in a near-eye display (NED) device included in a head-mounted device (HMD). As such, various embodiments, various embodiments of NEDs and HMDs will now be discussed. FIG. 1A is a diagram of a HMD 100 according to some embodiments. HMD 100 is one example embodiment of a head-mounted computing device. As such, HMD 100 may include a near-eye display (NED), which may include one or more display devices. The depicted embodiment includes a left display device 104A and a right display device 104B, which may be collectively referred to as the display device 104. The display device 104 may present content to a user. Examples of content presented by display device 104 may include, but are not limited to, one or more images, a series of images (e.g., a video), virtual objects, audio, or some combination thereof. As discussed throughout, display device 104 may include one or more arrays of light-emitting components, such as but not limited to one-dimensional (1D) or two-dimensional (2D) arrays of light-emitting diodes (LEDs). The light-emitting components may be affixed or bonded to a backplane of the display device 104.

In some embodiments, audio content may be presented via an audio device (e.g., speakers and/or headphones) of HMD 100. The audio device may receive audio content or information from the display device 104, a controller or processing unit of the HMD 100 (not shown), or an external device. The display device 104 may generally be configured to operate as an augmented-reality (AR) NED, such that a user can simultaneously view content projected (or otherwise presented) by the display device 104, and their real-world environment through the display device 104. In such embodiments, the display device 104 may augment views of a physical, tangible, and real-world environment with computer-generated (or virtual) elements (e.g., content including images, video, sound, and the like). However, in some embodiments, the display device 104 may be modified to additionally, or in the alternative, operate as a virtual-reality (VR) NED, a mixed-reality (MR) NED, or some combination thereof.

In addition to display device 104, HMD 100 may include a support or frame 102 that secures the display devices 104 in place on the head of a user. In some embodiments, the frame 102 may be a frame of eyewear glasses. HMD 100 may include at least one of a controller or a processing unit (e.g., a central processing unit, microcontroller, or microprocessor), a non-transitory, computer-readable storage device (e.g., volatile or non-volatile memory devices), and a communication transceiver (e.g., a wireless and/or wired network adaptor). As described herein in conjunction with some exemplary embodiments, the display device 104 may include a waveguide and holographic and/or volumetric Bragg gratings. The gratings may be generated by a process of applying one or more dopants or photosensitive media to predetermined portions of the surface of the waveguide, and subsequent exposure to ultraviolet (UV) light or other activating electromagnetic (EM) radiation. The various operations and/or functionalities of HMD 100 may be controlled via executing instructions on a processor device and/or controller device. When the instructions are executed, the processor device and/or controller device may cause the performance of various actions and/or steps. The instructions may be stored on a non-transitory computer-readable storage medium.

Figure 1B:
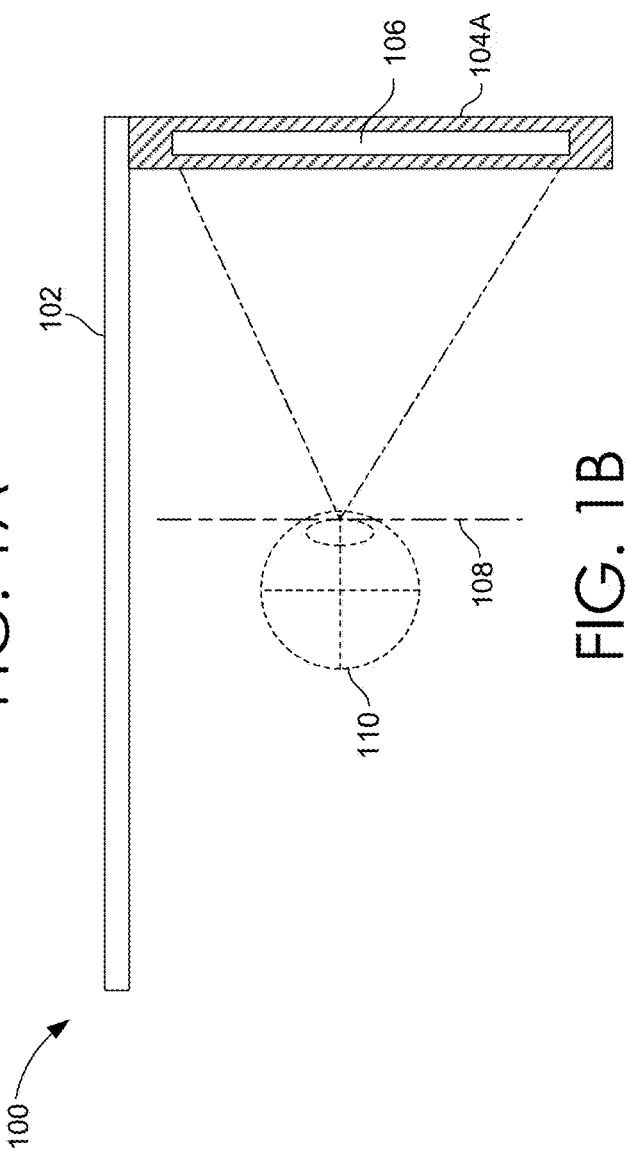
FIG. 1B illustrates a cross-sectional view of a portion of the head-mounted device of FIG. 1A, in accordance with some embodiments.

FIG. 1B illustrates a cross-sectional view of a portion of HMD 100, as shown in FIG. 1A, in accordance with some embodiments. The portion of the HMD 100 shown in FIG. 1B is associated with a single eye 110 of a user. The display device 104A may include at least one waveguide configuration 106. FIG. 1B shows an eye-box 108, which may be a location where the user's eye 110 is positioned when the user wears the HMD 100. When the eye 110 is aligned with the eye-box 108, the user may be visually provided a projected image, via the waveguide configuration 106. Waveguide configuration 106 directs the projected image towards the eye-box 108. The waveguide configuration 106 may receive and direct multiple pupil replications (i.e., replications of an image) towards the eye-box 108. For purposes of illustration, FIG. 1B shows a cross-section associated with a single eye 110 of the user and a single waveguide configuration 106. In some alternative embodiments, another waveguide configuration (which may be separate from the waveguide configuration 106 shown in FIG. 1B) may provide image light to another eye-box located with the other eye of the user, e.g., a waveguide configuration included in each of display devices 104A-104B of FIG. 1A.

The waveguide configuration 106, as illustrated in FIG. 1B, may be configured to direct image light (i.e., light that forms an image) to eye-box 108, which is positioned proximate the eye 110. The waveguide configuration 106 may be composed of one or more optical materials (e.g., plastic, glass, and the like) with one or more refractive indices that effectively minimize weight and widen a field-of-view (FOV) of the display device 104A. In alternative embodiments, the display device 104A may include one or more optical elements between the waveguide configuration 106 and the eye 110. The optical elements may act to manipulate light emitted from the display device 104A (e.g., image light emitted from display device 104A), perform one or more other optical adjustments to the light, or some combination thereof. Non-limiting examples of optical elements include an aperture, a Fresnel lens, a refractive (e.g., convex and/or convex) lens, a reflective surface, a filter, or any other suitable optical elements that manipulates light. Although not shown in FIG. 1B, the waveguide configuration 106 may include a waveguide with one or more sets of Bragg gratings.

In some embodiments, in order to achieve desired optical specifications or criteria, such as but not limited to a desired viewing angle, a maximum aperture size, a desired resolution, a minimum distortion level, a color correction, a back focal distance, and the like, the lenses (and other optical elements) described herein may include various designs. The lens or lenses may include a cylindrical lens, an anamorphic lens, a Fresnel lens, a gradient index lens, and the like. The lens may include a super lens, at least a portion of which having a negative index of refraction. The lens may include multiple lenses having various shapes. In some embodiments, the lens or lenses may include various optical materials. For example, a lens may include glass. In another non-limiting example embodiment, a lens can include a plastic material, such as but not limited to a CR-39 lens material, a urethane-based polymer, or a polycarbonate material.

Figure 2A:
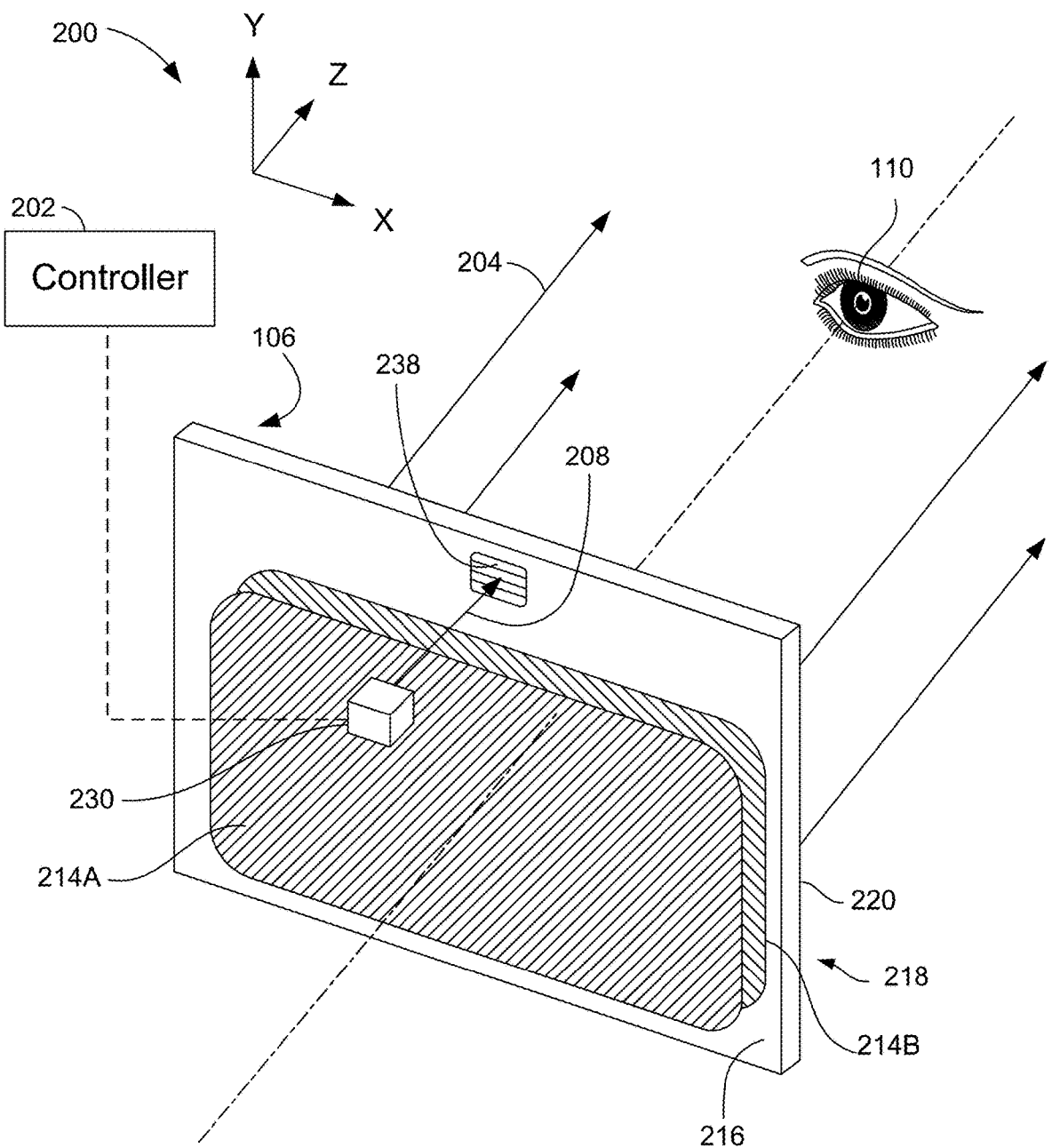
FIG. 2A illustrates an isometric view of an embodiment of a display device that is included in a head-mounted device.

FIG. 2A illustrates an isometric view of an embodiment of a display device 200 that is included in a head-mounted device. The various operations and/or functionalities of display device 200 may be controlled via executing instructions on a processor device and/or controller device. When the instructions are executed, the processor device and/or controller device may cause the performance of various actions and/or steps. The instructions may be stored on a non-transitory computer-readable storage medium.

Display device 200 may be included in HMD 100 of FIGS. 1A-1B. As such, display device 200 may be an embodiment of (or at least be similar to) display devices 104A-104B of FIGS. 1A-1B. In addition to the components discussed in conjunction with FIGS. 1A-1B, display device 200, or other components of HMD 100, may include source assembly 230, waveguide configuration 106, and controller 202. Waveguide configuration 106 may include at least a waveguide 220, a coupling element 238 a first (or top) decoupling element 214A, and a second (or bottom) decoupling element 214B. Waveguide 220 may include a top surface 216 and a bottom surface 218.

As shown in FIG. 2A, the bottom surface 218 of waveguide 220 and the second decoupling element 214B are facing the user's eye 110, while the top surface 216 of waveguide 220 and the first decoupling element 214A are facing towards the user's field-of-view (FOV) of the user's environment. Thus, the bottom surface 218 may be referred to as the user's surface of waveguide 220 and the second decoupling element 214B may be referred to as the user's decoupling element. In contrast, the top surface 216 may be referred to as the environment's surface of waveguide 220 and the first decoupling element 214A may be referred to as the environment's decoupling element. As discussed throughout, second decoupling element 214B outputs post-waveguide image light 204 to the user's eye 110. Thus, second decoupling element 214B may be referred to as the output decoupling element. As discussed in conjunction with FIGS. 2B-2C, source assembly 230 may include a light source and/or an optics system. In at least one embodiment, source assembly 230 may be referred to as a projector device, or simply a projector. Source assembly 230 may be an embodiment of (or at least be similar to) source assembly 230 of FIG. 2C.

Controller 202 may be an example of a central processing device (CPU), graphics processing unit (GPU), microcontroller, microprocessor, or some other logic-executing device, e.g., a field-programmable gate array (FPGA) or an application-specific integrated circuit (ASIC). Similar to FIG. 1B, display device 200 of FIG. 2A is associated with a single eye 110 of a user. As discussed in conjunction with FIG. 1A, another display device including HMD 100 may provide image light to the user's other eye. In some embodiments, one or more components of HMD 100 may be shared between the separate display devices for each eye. In still other embodiments, the single waveguide configuration 106 or display device 200 may provide post-waveguide image light 204 to both of the user's eyes. Waveguide 220 may be one of one or more waveguides included in waveguide configuration 106. Although only a single waveguide is shown in FIG. 2A, waveguide configuration 106 may include additional waveguides.

The source assembly 230 may generate pre-waveguide image light 208 that enters waveguide configuration 106, is transmitted via waveguide 220, and exits waveguide configuration 106, as post-waveguide image light 204. As used herein, prior to entering waveguide configuration 106, via coupling element 238, the image light may be referred to as pre-waveguide image light 208. After the transmitted image light exits waveguide configuration 106, via second decoupling element 214B, the image light may be referred to as post-waveguide image light 204. The pre-waveguide image light 208 may form one or more two-dimensional (2D) monochromatic or multi-chromatic images. The one or more images may be received by waveguide, via coupling element 238. The one or more images may be transmitted through waveguide 220 and outputted towards the user's eye 110, via waveguide 220 second decoupling element 214B. The post-waveguide image light 204 may provide the transmitted one or more 2D images to user's eye 110. In various embodiments, waveguide 220 is an output waveguide, because it outputs image light that is directed towards and received by the user's eye 110.

Figure 2B:
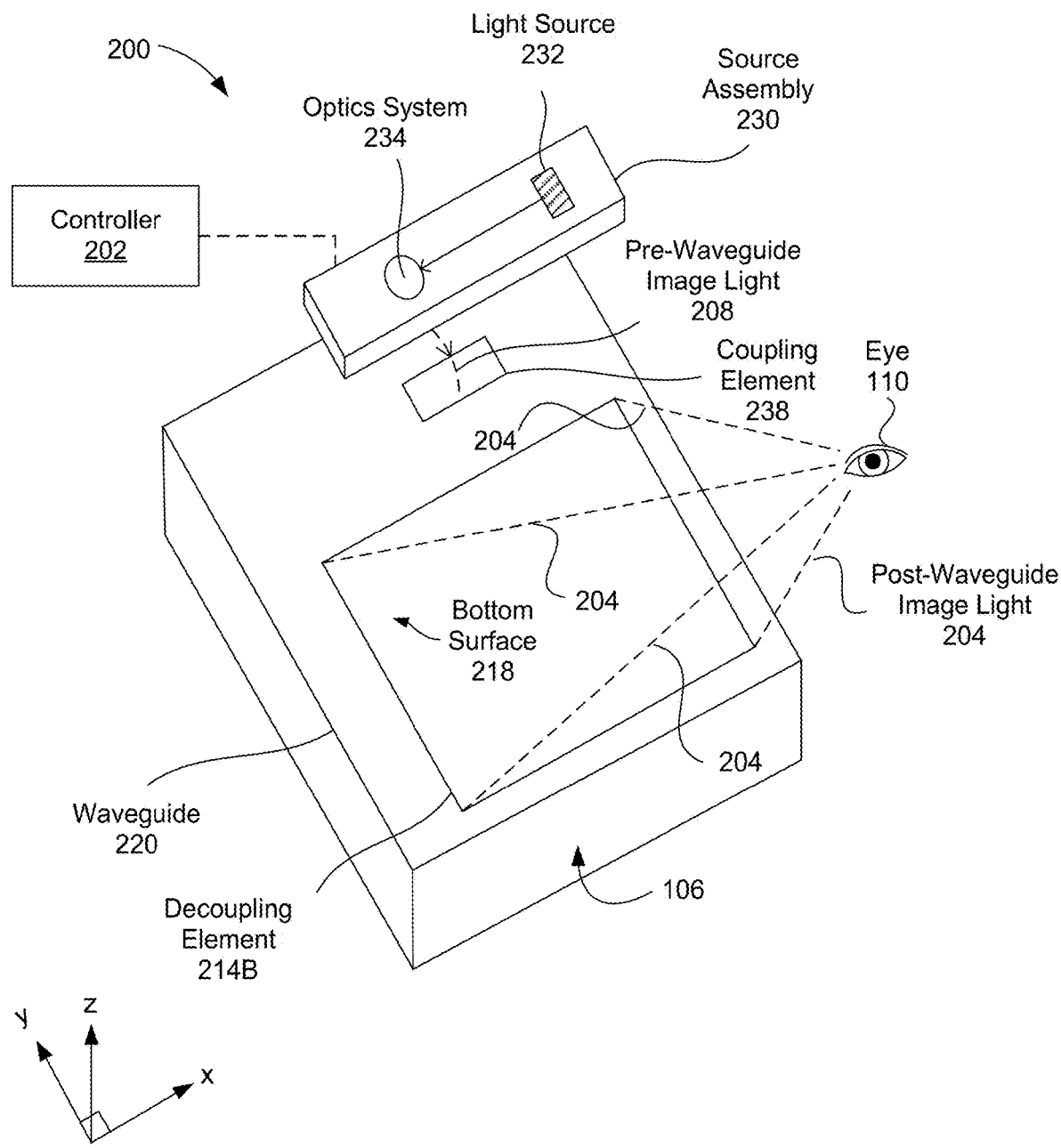
FIG. 2B illustrates a perspective view of another embodiment of a display device that is included in a head-mounted device.

Various embodiments of source assembly 230 are described in conjunction with at least FIGS. 2B-2C. As shown in FIGS. 2B-2C, source assembly 230 may include one or more 1D or 2D monochromatic or multi-chromatic light sources and an optics system. Various embodiments of light sources and optics systems are described in conjunction with at least FIGS. 2B-2C, 3, and 4. However, briefly here, light source (e.g., light source 232 of FIG. 2B-2C) may generate the pre-waveguide image light 208. The light source may include arrays (e.g., emitter arrays) of monochromatic or multi-chromatic light-emitting components (e.g., LEDs) which generate image light. The light-emitting components may be bonded to a backplane of source assembly 230. The light source may generate source light and the optics system may condition the source light to project the pre-waveguide image light 208 towards coupling element 238 located on the top surface 216 of the waveguide 220. The projected pre-waveguide image light 208 may include 2D image light that forms one or more 2D images.

In at least some embodiments, an optics system of the source assembly 230 may include a scanning mirror assembly that includes a scanning mirror that scans the generated pre-waveguide image light 208. The scan patterns of the scanning mirror assembly are such that the scanned pre-waveguide image light 208 forms the one or more 2D images. Such non-limiting embodiments may be referred to as scanning embodiments. The pre-waveguide image light 208 may propagate along a dimension or direction towards the coupling element 238, where the pre-waveguide image light 208 is received by and/or coupled to waveguide 220.

The waveguide 220 may be an optical waveguide that outputs 2D images, via 2D post-waveguide image light 204 that is directed to the eye 110 of the user. The waveguide 220 may receive pre-waveguide image light 208, projected via source assembly 230, at coupling element 238. The coupling element 238 may include one or more coupling elements located on the top surface 216 and/or within the body of waveguide 220. Coupling element 238 may guide and/or couple the received pre-waveguide image light 208 to a propagation area of the waveguide 220. Coupling element 238 may include a diffraction grating, a holographic grating, one or more cascaded reflectors, one or more prismatic surface elements, an array of holographic reflectors, a metamaterial surface, or some combination thereof. An exemplary, but non-limiting, embodiment of the coupling element 238 may include a grating having a pitch of approximately 300 nm to approximately 600 nm. The coupling element 238 may be understood as extending from the top surface 216 to the bottom surface 218 of the waveguide 220. The coupling element 238 may redirect received pre-waveguide image light 208, according to a first grating vector, into the propagation area of the waveguide 220. Waveguide 220 may be included in and/or formed in the body of waveguide configuration 106. Waveguide 220 may be positioned between the first and second decoupling elements 214A-214B.

The first decoupling element 214A may redirect internally reflected image light from the waveguide 220. The second de-coupling element 214B may decouple the image light from waveguide 220 and direct the image light towards eye 110. In some embodiments, the internally-reflected image light may be totally, or at least near totally, internally reflected. The first decoupling element 214A may be part of, affixed to, or formed in the top surface 216 of the waveguide 220. The second decoupling element 214B may be part of, affixed to, or formed in the bottom surface 218 of the waveguide 220, such that the first decoupling element 214A is opposed to the second decoupling element 214B. A light propagation area may extend between decoupling elements 214A-214B. In some embodiments, there may be an offset between the opposed decoupling elements 214A-214B. The offset may be along the x-axis and/or the y-axis of the 3D Cartesian coordinates illustrated in FIG. 2A. The decoupling elements 214A-214B may include a diffraction grating, a holographic grating, a volumetric Bragg grating, one or more cascaded reflectors, one or more prismatic surface elements, an array of holographic reflectors, or the like. The decoupling elements 214A-214B may form a decoupling area of HMD 100.

In scanning embodiments, display device 200 may be a scanning display device. Various embodiments of scanning display devices are discussed in conjunction with FIGS. 2C and 5A. However, briefly here, source assembly 230 may provide one or more 1D or 2D images via scanning projected light at a scanning rate sufficient to form an apparent image. As such, source assembly 230 may include one or more scanning mirrors. However, in other embodiments, the display device 200 is not a scanning display device, and display device 200 is not required to include a scanning mirror.

Whether a scanning embodiment or a non-scanning embodiment, source assembly 230 may project a 2D image on an image field through waveguide 220, via one or more arrays of light-emitting components (i.e., emitter arrays) included in source assembly 230. In some embodiments, the image emitted by emitter arrays may be conditioned and/or magnified by an optics system and/or light conditioning assembly (e.g., one or more lenses) before the pre-waveguide image light 208 is received by waveguide 220. Such optics systems are discussed in conjunction with at least optics systems 234 of FIGS. 2B-2C.

In various embodiments, an orientation and/or position of post-waveguide image light 204 exiting from waveguide 220 may be controlled by changing an orientation of the pre-waveguide image light 208 entering the coupling element 238. In such embodiments, scanning components included in an optics system of source assembly 230 may re-orient and/or re-position pre-waveguide image light 208 prior to image light entering coupling element 238.

In various embodiments, one or more logic devices (such as controller 202) may control the operations of source assembly 230. As noted above, controller 202 may include any logic device, such as but not limited to a microprocessor, microcontroller, central processing unit (CPU), graphical processing unit (GPU), gate arrays (e.g., an FPGA), an ASIC, or the like. The controller 202 may generate display instructions for the source assembly 230. The display instructions may include instructions to project one or more monochromatic or multi-chromatic images. Display instructions may include an image file (e.g., a bitmap). The display instructions may be received from another processing device included in HMD 100, a memory device of HMD 100, non-transitory computer-readable media, and/or a wireless/wired communication network. As described herein, the display instructions may further include instructions for moving (e.g., scanning) optical components within the source assembly 230, or individual light-emitting arrays included therein, or for moving the waveguide 220 by activating an actuation system. The controller 202 may include a combination of hardware, software, and/or firmware not explicitly shown herein so as not to obscure other aspects of the disclosure. The software and/or firmware may be stored via a storage device or non-transitory computer-readable media of HMD 100 or another computing device.

FIG. 2B illustrates a perspective view of another embodiment of display device 200. The embodiment of display device 200, shown in FIG. 2B, may also be included in a HMD, such as but not limited to HMD 100 of FIGS. 1A-1B. The embodiment of display device 200 shown in FIG. 2B may be an embodiment of (or at least similar to) any of display devices 104A-104B of FIGS. 1A-2A or display device 200 of FIG. 2A. Similarly to the embodiment shown in FIG. 2A, display device 200 includes various components, e.g., the waveguide configuration 106 or part of the waveguide configuration 106, controller 202, and source assembly 230. In alternative embodiments, the display device 200 is included in other HMDs, or in other systems that provide projected image light to a particular location.

Similar to the embodiment shown in FIG. 2A, display device 200 of FIG. 2B includes waveguide configuration 106. Waveguide configuration 106 includes waveguide 220, coupling element 238, and decoupling element 214B. Due to the perspective view of FIG. 2B, the bottom surface 218 of waveguide 220 is shown, but the top surface 216 of waveguide 220 is occluded by waveguide configuration 106. Similarly, the second decoupling element 214B is visible in FIG. 2B, but the first decoupling element 214A is occluded by the waveguide configuration 106. As shown in more detail in FIG. 2C, source assembly 230 may include light source 232 and optics system 234. Optics system 234 may include a light conditioning assembly 250. In various scanning embodiments, display device 200 may be a scanning display device. In such embodiments, optics system 234 may include a scanning mirror assembly 252.

Figure 5A:
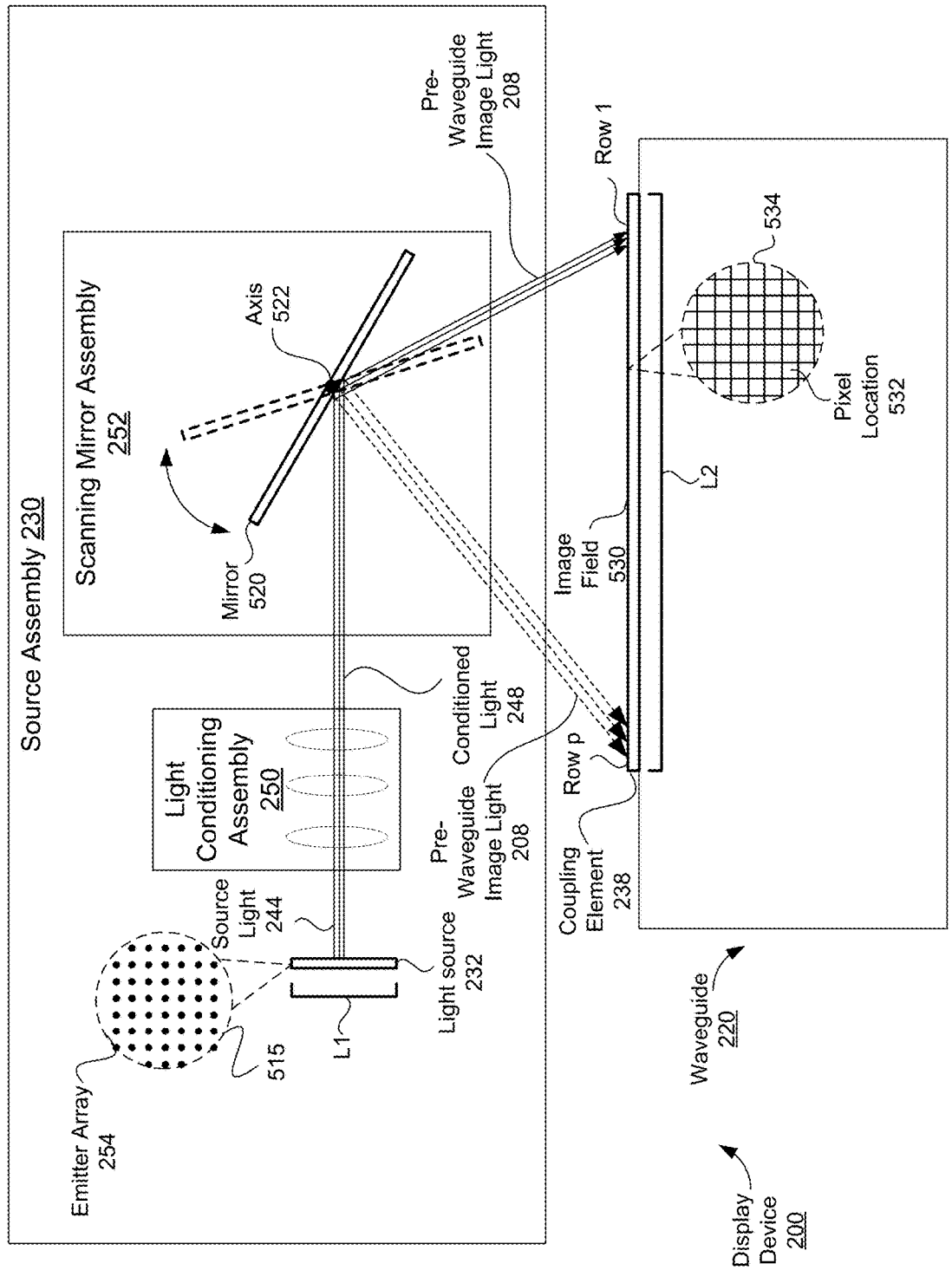
FIG. 5A is a diagram illustrating a scanning operation of a scanning embodiment of a display device, in accordance with an embodiment.

Various embodiments of a scanning display device are discussed in conjunction with at least FIG. 2C and FIG. 5A. However, briefly here, display device 200 may provide one or more 1D or 2D images via scanning projected light at a scanning rate sufficient to form an apparent image. As such, display device 200 may include one or more scanning mirrors. For instance, a scanning mirror assembly, which includes a scanning mirror, may be included in an optics system of source assembly 230. However, in other embodiments, the display device 200 is a non-scanning display device, and display device 200 need not include a scanning mirror assembly.

Figure 5B:
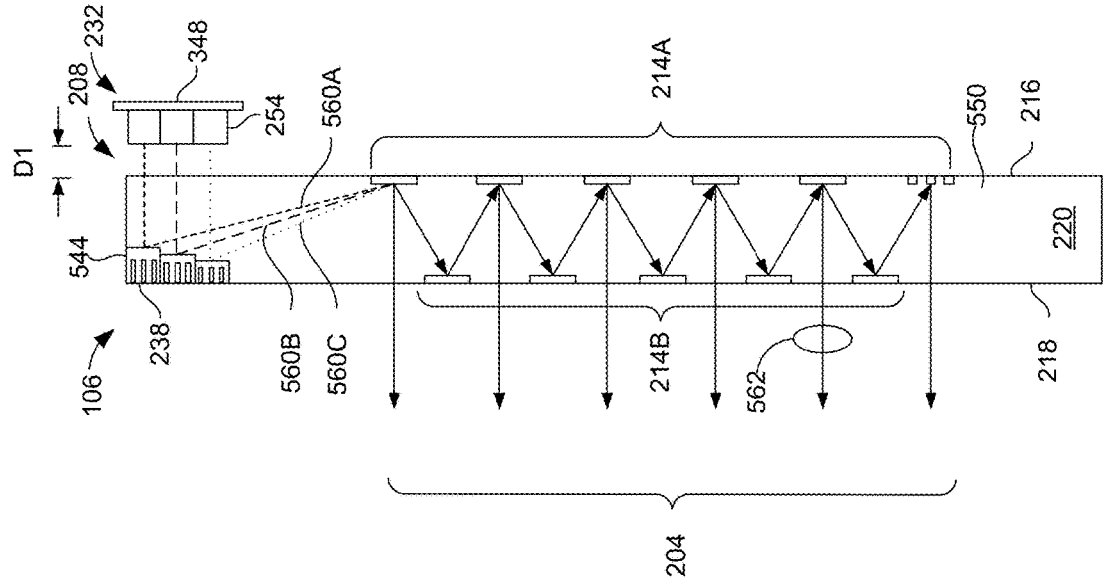
FIG. 5B illustrates a waveguide configuration of a display device that forms images and replications of images, in accordance with various embodiments.

As discussed in conjunction with at least FIG. 2A and FIGS. 5A-5B, the source assembly 230 may project (scanned or non-scanned) image light on an image field through waveguide configuration 106, via one or more 1D and/or 2D arrays of light-emitting components (i.e., emitter arrays) included in light source 232. In scanning embodiments, a scanning mirror may be employed to scan the pre-waveguide image light 208 in such a manner to form scanned images on the image field. In some scanning embodiments, as well as non-scanning embodiments, the image emitted by emitter arrays included in light source 232 may be conditioned and/or magnified by optics system 234 and/or light conditioning assembly (e.g., one or more lenses) before the light is received by coupling element 238 and coupled to waveguide 220 or a screen. Such optics systems are discussed in conjunction with at least optics systems 234 of FIG. 2C.

Similar to FIGS. 1B and 2A, display device 200 may provide images for both eyes or for a single eye 110. For purposes of illustration, FIG. 2B shows the display device 200 associated with a single eye 110. Another display device (not shown), that is separated (or at least partially separated) from the display device 200, may provide image light to another eye of the user. In a partially separated system, one or more components may be shared between display devices for each eye.

The source assembly 230 may be an embodiment of (or at least be similar to) source assembly 230 of FIG. 2C. As such, the source assembly 230 generates pre-waveguide image light 208. The source assembly 230 includes a light source 232 and an optics system 234. The light source 232 is an optical component that generates pre-waveguide image light 208 using a plurality of light emitters arranged in a matrix, i.e., emitter arrays composing light-emitting components (LECs) or light emitters. Each light emitter may emit monochromatic light emitter. The light source 232 generates pre-waveguide image light 208 including, but not restricted to, red (R) image light, blue (B) image light, green (G) image light, infra-red image light, or image light of any other wavelength. While RGB image light, LECs, and pixels are often discussed in this disclosure, embodiments described herein are not limited to using red, blue and green as primary colors. Other colors are also possible to be used as the primary colors of the display device 200. Also, a display device in accordance with an embodiment may use more than three primary colors. Light source 232 may be an embodiment of, or at least be similar to, one of light sources 300 of FIG. 3.

The optics system 234 performs a set of optical processes, including, but not restricted to, focusing, combining, conditioning, and scanning processes on the image light generated by the light source 232. In some embodiments, the optics system 234 includes a light conditioning assembly that conditions pre-waveguide image light 208. In scanning embodiments, optics system 234 may include a scanning mirror assembly, as described below in detail in conjunction with at least FIGS. 2C and 5A. The source assembly 230 generates and outputs pre-waveguide image light 208. Similar to display device of FIG. 2A, the pre-waveguide image light 208 is received by coupling element 238, as is coupled to, as well as transmitted by, the waveguide 220.

The waveguide 220 is an optical waveguide that outputs post-waveguide image light 204 to an eye 110 of a user. The waveguide 220 receives the pre-waveguide image light 208 at one or more coupling elements 238, and guides the received input image light to one or more decoupling elements 214B. The coupling element 238 may be, for example, a diffraction grating, a holographic grating, some other element that couples the pre-waveguide image light 208 into the waveguide 220, or some combination thereof. For example, in embodiments where the coupling element 238 is diffraction grating, the pitch of the diffraction grating is selected such that total (or at least near total) internal reflection occurs, and the pre-waveguide image light 208 propagates internally toward the decoupling element 214B. The pitch of the diffraction grating may be in the range of 300 nm to 600 nm.

The decoupling element 214B decouples and/or outputs the total (or near total) internally reflected image light from the waveguide 220. Thus, waveguide may be an output waveguide. The decoupling element 214B may be, for example, a diffraction grating, a holographic grating, some other element that decouples image light out of the waveguide 220, or some combination thereof. For example, in embodiments where the decoupling element 214B is a diffraction grating, the pitch of the diffraction grating is chosen to cause incident image light to exit the waveguide 220. In scanning embodiments, an orientation and position of the post-waveguide image light 204 exiting from the waveguide 220 may be controlled by changing an orientation and position of the pre-waveguide image light 208 entering the coupling element 238. The pitch of the diffraction grating may be in the range of 300 nm to 600 nm.

The waveguide 220 may be composed of one or more materials that facilitate total (or near total) internal reflection of the pre-waveguide image light 208. For example, the waveguide 220 may be composed of silicon, plastic, glass, or polymers, or some combination thereof. The waveguide 220 has a relatively small form factor. For example, the waveguide 220 may be approximately 50 mm wide along X-dimension, 30 mm long along Y-dimension and 0.5-1 mm thick along Z-dimension.

Similarly to controlling the operations of the embodiments of source assembly 230 of FIG. 2A, controller 202 may control the image rendering operations of the embodiment of source assembly 230 shown in FIG. 2B. The controller 202 determines instructions for the source assembly 230 based at least on the one or more display instructions. Display instructions are instructions to render one or more images. In some embodiments, display instructions may be an image file (e.g., bitmap). In another example, the display instructions may be received from a console of a augmented-reality (AR) system, a virtual-reality (VR) system, and/or a mixed-reality (MR) system, not shown in FIG. 2B. In scanning embodiments, display instructions may include scanning instructions that are used by the source assembly 230 to generate images via scanning pre-waveguide image light 208. For example, the scanning instructions may include a type of a source of image light (e.g., monochromatic, polychromatic), a scanning rate, an orientation of a scanning apparatus, one or more illumination parameters, or some combination thereof. The controller 202 includes a combination of hardware, software, and/or firmware not shown here so as not to obscure other aspects of the disclosure.

FIG. 2C illustrates a schematic block diagram of the source assembly 230 of FIGS. 2A-2B, in accordance with various embodiment. That is, source assembly 230 of FIG. 2C may be an embodiment of (or at least similar to) source assembly 230 of FIG. 2A and/or source assembly 230 of FIG. 2B. As such, source assembly 230 includes a light source 232 and an optics system 234. In some embodiments, source assembly 230 may be a scanning source assembly, while in other embodiments, source assembly 230 is a non-scanning source assembly. The various operations and/or functionalities of source assembly 230 may be controlled via executing instructions on a processor device and/or controller device. When the instructions are executed, the processor device and/or controller device may cause the performance of various actions and/or steps. The instructions may be stored on a non-transitory computer-readable storage medium.

Light source 232 includes a plurality of source elements, shown schematically as source elements 254A-254F. Source elements may include an array of light-emitting components (LECs), i.e., a source element may include and/or be an embodiment of an emitter array. Various embodiments of emitter arrays are discussed in conjunction with FIGS. 3-4. However, briefly here, an emitter array may be a 2D arrays of LECs, such as but not limited to light-emitting diodes (LEDs). As discussed below, the number, arrangement, and configuration of the plurality of source elements may vary based on whether the source assembly is a scanning source assembly, or a non-scanning source assembly.

Optics system 234 includes a light conditioning assembly 250. In scanning embodiments, in addition to light conditioning assembly 250, optics system 234 may include a scanning mirror assembly 252. In non-scanning embodiments of source assembly 230, the optics system 234 need not, but may, include scanning mirror assembly 252. Because the inclusion of scanning mirror assembly 252 is optional, depending upon whether source assembly 230 is a scanning or non-scanning embodiment, scanning mirror assembly 252 is indicated in FIG. 2C via a dashed box.

In non-scanning embodiments, light source 232 may include more source elements (e.g., emitter arrays), than in scanning embodiments. In non-scanning embodiments, there may exist a one-to-one mapping (or correspondence) between individual LECs included in the source elements and pixel regions of a display device, such as but not limited to pixel regions of display device 104 of FIGS. 1A-1B and/or display device 200 of FIGS. 2A-2B. In scanning embodiments, each LEC may be mapped to more than one pixel region of a display device. For example, a scanning mirror included in scanning mirror assembly 252 may be employed to scan light emitted by a single LEC to multiple pixels of the display device. Thus, via the scanning mirror assembly 252, a single LEC may illuminate multiple LECs, and thus less source elements may be required for scanning embodiments. For example, in a scanning embodiment of source assembly 230, light source 232 may include source elements 254A-254C, whereas in a non-scanning embodiment, light source 232 may include source elements 254A-254C, as well as source elements 254D-254F.

Because scanning embodiments may include less source elements, the source elements in a scanning embodiment may be referred to as a "1D" arrangement of source elements or emitter arrays. The source elements in a non-scanning embodiment may be referred to as a "2D" arrangement of source elements or emitter arrays. Note that even though the 1D and 2D nomenclatures are employed, each of the source elements (e.g., source element 254A) may include a 2D array of LECs. That is, in scanning embodiments that include source elements 254A-254C, but do not include source elements 254D-254F, the included source elements are said to be arranged in a 1D array, i.e., a 1D arrangement of 2D emitter arrays. In non-scanning embodiments that include source elements 254A-254F, the included source elements are said to be arranged in a 2D array, i.e., a 2D arrangement of 2D emitter arrays. It should also be noted that the 1D arrangement of source elements 254A-254C and the 2D arrangement of source elements 254A-254F are illustrative only, and the total number of, arrangements of, and configurations of source elements may vary from embodiment to embodiment. The source assembly 230 may generate light in accordance with scanning instructions from the controller 202.

The light source 232 is a source of light that generates image light. In some embodiments, the image light is collimated or at least partially collimated image light. In other embodiments, the image light need not be collimated. The light source 232 emits light in accordance with one or more illumination parameters received from the controller 202. As discussed above, the light source 232 includes one or more source elements 254A-254C, and/or source elements 254A-254F, either configuration which may be collectively referred to as source elements 254. Source elements may be comprised of light-emitting components (LECs), as discussed throughout.

The individual source elements 254 of an emitter array may include one or more compact, efficient and/or powerful sources of lights, e.g., LECs with at least ultra-high brightness, low power consumption, and a low footprint. The source elements 254 may include one or more arrays of light-emitting components (LECs), such as but not limited to light-emitting diodes (LEDs), e.g., µLEDs, organic LEDs (OLEDs), a superluminescent LED (SLED), and organic µLEDs. A µLED may be an LED with features sizes ranging between sub-microns to a hundreds of microns. Various embodiments of µLEDs are discussed in conjunction with FIGS. 6A-6B. In some embodiments, GaN-based inorganic LEDs can be made orders of magnitude brighter than OLEDs with a light emission area of few microns.

In one embodiment, the source elements 254 may be arranged in a concave curved fashion. For example, the source elements 254 may have a radius of curvature ranging from few millimeters to few centimeters depending on the display size and a length of few millimeters. An advantage of a curved array is that it is easier to form a compact lens to have high quality image on curved surface without correcting the field of curvature of the lens. In alternate embodiments, the source elements 254 may be arranged in a flat and/or linear fashion.

The source element 254 emits a source light 244 to the optics system 234. In some embodiments, the source light 244 may emit one or more colors (e.g. red, green, and blue). For example, the source element 254A may emit red source light, the source element 254B may emit blue source light, and the source element 254C emits green source light. In non-scanning embodiments that additionally include source elements 254D-254F, the source element 254AD may emit red source light, the source element 254E may emit blue source light, and the source element 254F emits green source light. Additionally, in some embodiments, one or more of the source elements may emit light in the infrared, or light of other non-visible wavelengths.

The optics system 234 may include a light conditioning assembly 250 and a scanning mirror assembly 252. The light conditioning assembly 250 conditions the source light 244 and emits conditioned light 248. In embodiments that include scanning mirror assembly 252, the conditioned light is provided to the scanning mirror assembly 252. In scanning embodiments, light condition assembly 250 may condition source light 244 for incidence on scanning mirror assembly 252. In non-scanning embodiments, light condition assembly 250 may condition source light 244 for being received by a waveguide configuration, such as but not limited to waveguide configuration of FIG. 1B and FIGS. 2A-2B. The light conditioning assembly 250 includes one or more optical components that condition the light from the light source 232. Conditioning light from the light source 232 may include, for example, expanding, collimating, correcting for one or more optical errors (e.g., field curvature, chromatic aberration, etc.), some other adjustment of the light, or some combination thereof. The light conditioning assembly 250 conditions the source light 244 and emits conditioned light 248. In non-scanning embodiments, conditioned light 248 may be outputted as pre-waveguide image light 208. In scanning embodiments, the conditioned light 248 may be received my scanning mirror assembly 252, and scanned and/or further conditioned being outputted as pre-waveguide image light 208.

The scanning mirror assembly 252 includes one or more optical elements that redirect image light via one or more reflective portions of the scanning mirror assembly 252. Where the image light is redirected towards is dependent upon specific orientations of the one or more reflective portions. In some embodiments, the scanning mirror assembly 252 includes a single scanning mirror that is configured to scan in at least two dimensions. In other embodiments, the scanning mirror assembly 252 may include a plurality of scanning mirrors that each scan in orthogonal directions to each other. The scanning mirror assembly 252 may raster scan (horizontally, or vertically). In some embodiments, the scanning mirror assembly 252 may perform a controlled vibration along the horizontal and/or vertical directions with a specific frequency of oscillation to scan along two dimensions and generate a two-dimensional projected line image of the media presented to user's eyes. For example, the scanning mirror assembly 252 may undergo an oscillation with peak-to-peak amplitude of few hundreds of nanometers per second along the vertical direction based on the desired frequency of oscillation. The scanning mirror assembly 252 emits a pre-waveguide image light 208 based on the conditioned light 248. The scanning mirror assembly 252 outputs the pre-waveguide image light 208 at a particular orientation (in accordance with the scanning instructions) and towards a waveguide configuration.

In some embodiments, the scanning mirror assembly 252 includes a galvanometer mirror. For example, the galvanometer mirror may represent any electromechanical instrument that indicates that it has sensed an electric current by deflecting a beam of image light with one or more mirrors. The galvanometer mirror may be configured to scan in at least one orthogonal dimension to generate the scanned pre-waveguide image light 208. The pre-waveguide image light 208 from the galvanometer mirror represents a two-dimensional line image of the media presented to user's eyes. As noted above, in non-scanning embodiments, source assembly 230 need not include scanning mirror assembly 252.

The controller 202 controls the light source 232 and/or the scanning mirror assembly 252. The controller 202 takes content for display, and divides the content into discrete sections. The controller 202 instructs the light source 232 to sequentially present the discrete sections. In scanning embodiments, the controller 202 instructs the scanning mirror assembly 252 to scan the presented discrete sections to different areas of a coupling element 238 of the waveguide 220. Accordingly, when scanned light 238 exits the waveguide 220, separate portions of scanned light 238 are presented in different locations of the coupling element 238. While each discrete section is presented at different times, the presentation and scanning of the discrete sections occurs fast enough such that a user's eye integrates the different sections into a single image or series of images. In non-scanning embodiments, the controller 202 instructs the light source 232 to present different areas of the coupling element 238 of the waveguide 220 into different discrete sections.

For example, in scanning embodiments, controller 202 segments the content into scan lines, via scanning instructions. The scan lines are scanned out to different areas of the coupling element 238 of the waveguide 220. When scanned pre-waveguide image light 208 exits the waveguide 220, each of the lines are presented at a different location, as post-waveguide image light 204, which a user's eye integrates into a single 2D image or series of 2D images.

For example, the scanning instructions may cause the source assembly 230 to scan out an image in accordance with a scan pattern (e.g., raster, interlaced, etc.). The scanning instructions control an intensity of light emitted from the light source 232, and the optics system 234 scans out the image by rapidly adjusting orientation of the emitted light. If scanned at a sufficient frequency, a human eye integrates the scanned pattern into a single 2D image. In non-scanning embodiments, the source assembly 230 may similarly generate 2D images without the need for a scan pattern because the light source 232 includes one or more LECs for each pixel of the display device. For example, based on display instructions, controller 202 may operate individual LECs included in source elements 254A-254F to illuminate pixels corresponding the 2D images.

Figure 3:
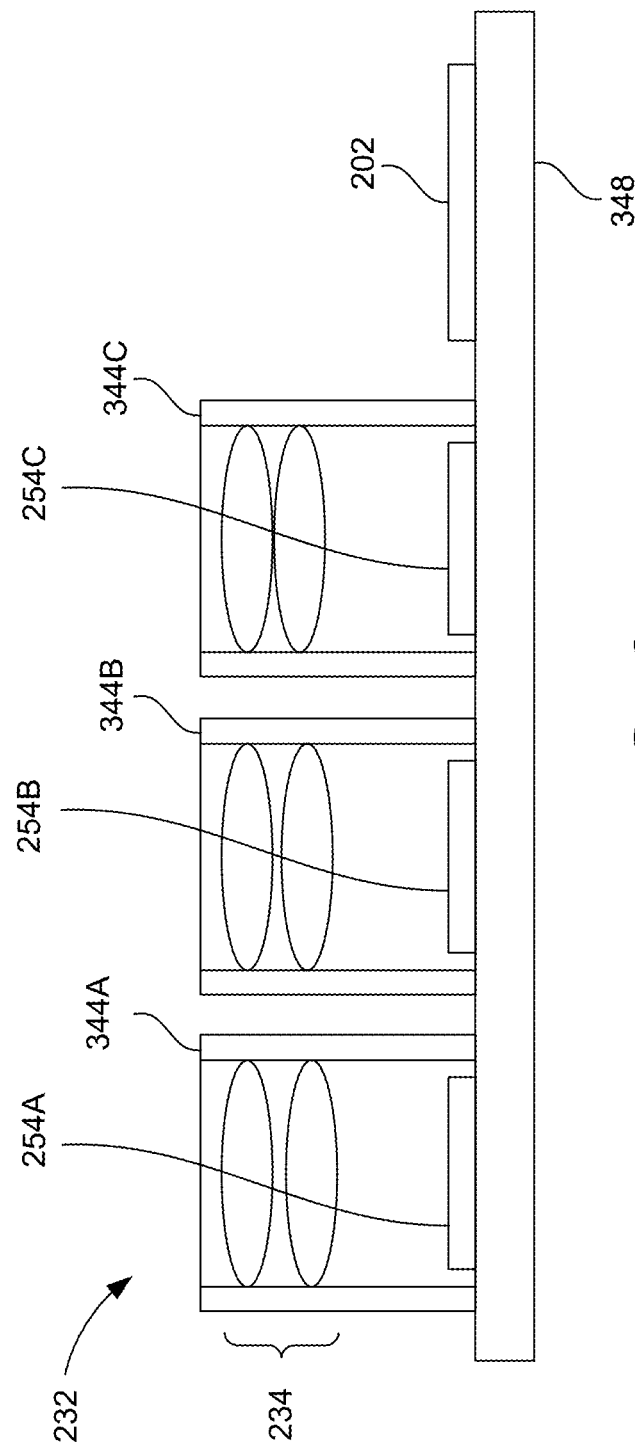
FIG. 3 illustrates a cross-sectional view of an embodiment of a light source included in the display device of FIGS. 2A-2C, in accordance with the various embodiments.

FIG. 3 illustrates a cross-sectional view of an embodiment of light source 232 included in the display device of FIGS. 2A-2C, in accordance with the various embodiments. As shown in FIG. 3, one embodiment of a light source 232 may include a first source element 254A, a second source element 254B, and a third emitter array 254C. As used herein, the terms source element and emitter array may be used interchangeably. Each of the emitter arrays 254A, 254B, and 254C may be disposed in an array housing 344A, 344B, and 344C, respectively. For convenience, the emitter arrays 254A-254C may be referred to collectively as emitter arrays 254, and also individually as emitter array 254. Similarly, the array housings 344A-344C may be referred to collectively as array housings 344, or individually as array housing 344. As discussed in conjunction with at least FIG. 2C, each of the emitter arrays 254 may include a 2D array of light-emitting components (e.g., LEDs). FIG. 3 illustrates a 1D arrangement of emitter arrays for a scanning embodiment. However, as discussed in conjunction with at least FIG. 2C, a 2D arrangement of emitter arrays may be employed for non-scanning embodiments.

Each of the array housings 344 may include an optics system 234, which may include one or more optical components, such as lenses (e.g., glass, plastic, or meta-material lenses), prisms, filters, scanning mirrors, and the like. As discussed in conjunction with FIG. 2C, optics system 234 may include a light conditioning assembly. In scanning embodiments, optics system 234 may additionally include a scanning mirror assembly, such as but not limited to scanning mirror assembly 252 of FIG. 2C. In other embodiments, the optics system 234 is not housed within housings 344. Each of the source elements 254A-254C may include a separate and/or distinct optics system.

As discussed in conjunction with at least FIG. 2C, the optics system 234 may condition and/or alter the direction or control other characteristics of source light 244 emitted by emitter arrays 254. As shown in FIG. 3, the emitter arrays 254 may be secured to a common structure, such as a backplane 348 or printed circuit board (PCB). The backplane 348 may include a logic device, such as but not limited to an ASIC, processor, FPGA, controller 202, or the like. Backplane 348 may include electrical contacts (e.g., leads) that electrically couple individual LECs of the emitter arrays 254 to controller 202. In other embodiments, the controller 202 may be disposed elsewhere on the HMD 100 of FIGS. 1A-1B, secured either directly or indirectly to the frame 102 of FIG. 1A.

Each of the emitter arrays 254 may be a monochromatic emitter array having a 1D or 2D configuration of individual emitters (e.g., LEDs) of a single color. As described herein, a green colored light may be understood as light composed of photons with a range of wavelengths between about 500 nanometers (nm) to about 555 nm. Furthermore, as described herein, red colored light may be understood as light composed of photons with a range of wavelengths between about 622 nm to about 780 nm. Blue colored light may be understood as light composed of photons with a range of wavelengths between about 440 nm to about 492 nm. A monochromatic emitter array 254 may emit light within a narrow wavelength range, rather than a single wavelength, in some embodiments. For example, a monochromatic emitter array 254 may emit colored light (e.g., red, green, or blue photons) within a narrow wavelength range of 5-10 nm in width.

One or more chromatic filters, which may facilitate a simplified projection lens design with reduced achromatic performance requirements, may be employed to further narrow the wavelength range of an emitter array. In some embodiments, the emitter array 254A may include only red light-emitting components, the emitter array 254B may include only green light-emitting components, and the emitter array 254C may include only blue light-emitting components. Under the direction of controller 202, each of the emitter arrays 254A-254C may produce a monochromatic 2D image according to the color produced by its respective emitters. Accordingly, the three monochromatic emitter arrays 254A-254C may simultaneously emit three monochromatic images (e.g., a red image, a green image, and a blue image composed of image light) towards optics system 234.

As discussed elsewhere, the three monochromatic images may be interposed, composited, or otherwise combined to generate a full color image. For example, the controller 202 may receive a full-color image to be displayed to a user and then decompose the full-color image into multiple monochromatic images, such as a red image, a green image, and a blue image. That is, the full-color image may be separated, or otherwise decomposed into three monochromatic images of primary colors. As described herein, the waveguide configuration 106 of FIG. 1B and FIGS. 2A-2B may combine (or recombine) the three monochromatic images to produce a full-color image or a poly-chromatic (or multi-chromatic) image, via post-waveguide image light 204 and directed toward the eye 110 of FIG. 1B and FIGS. 2A-2B. In yet other examples, one or more emitter arrays 254A-254C may produce light of multiple wavelengths, ranges of wavelengths, or other forms of light other than monochromatic light.

In some embodiments, a calibration and/or alignment system (not shown in FIG. 3) may be employed to align the multiple monochromatic images (e.g., via mechanical movement, or scanning, of one or more of the monochromatic emitter arrays 254A-254C or movement of the one or more of the monochromatic images by one or more pixels as emitted from their associated monochromatic emitters 254A-254C) to produce a desired or intended, properly aligned multi-chromatic image.

FIG. 4 shows a top view of light source 232 that includes a 1D configuration of emitter arrays 254A-254C, according to some embodiments. The 1D configuration shown in FIG. 4 is a linear configuration of 2D emitter arrays 254A-254C along the A1 axis. In the embodiment of FIG. 4, the individual emitter arrays 254A-254C have an aspect ratio greater than 1.0 (i.e., emitter arrays 254 are rectangular 2D arrays of LECs). However, in other embodiments, the aspect ratio of the emitter arrays 254A-254C may be equal to 1.0 (i.e., emitter arrays 254 are square 2D arrays of LECs). The particular linear configuration may be arranged according to a longer side of the rectangular arrays 254A-254C. While the emitter arrays 254A-254C may have a 1D configuration of the emitters (e.g., LEDs) in some scanning embodiments, in other non-scanning embodiments, the emitter arrays 254 may be arranged in a (square or rectangular) 2D configuration. In yet other embodiments, the emitter arrays 254A-254C may have other non-linear configurations (e.g., oval, circular, or otherwise round in some fashion) while defining a first dimension (e.g., a width) and a second dimension (e.g. a length) that is orthogonal to the first direction, with one dimension being equal or unequal to each other. The emitters included in emitter arrays 254A-254C may have a 2D emitter array configuration with more than 1000×1000 emitters. In some embodiments, the emitter arrays 254A-254C may be 1D emitter arrays, rather than 2D emitter arrays, as shown in FIG. 4. Various other combinations are also within the scope of the present disclosure. Emitter arrays 254A-254C may be bonded and/or electrically coupled to backplane 348.

Formation of an Image

Figure 5C:
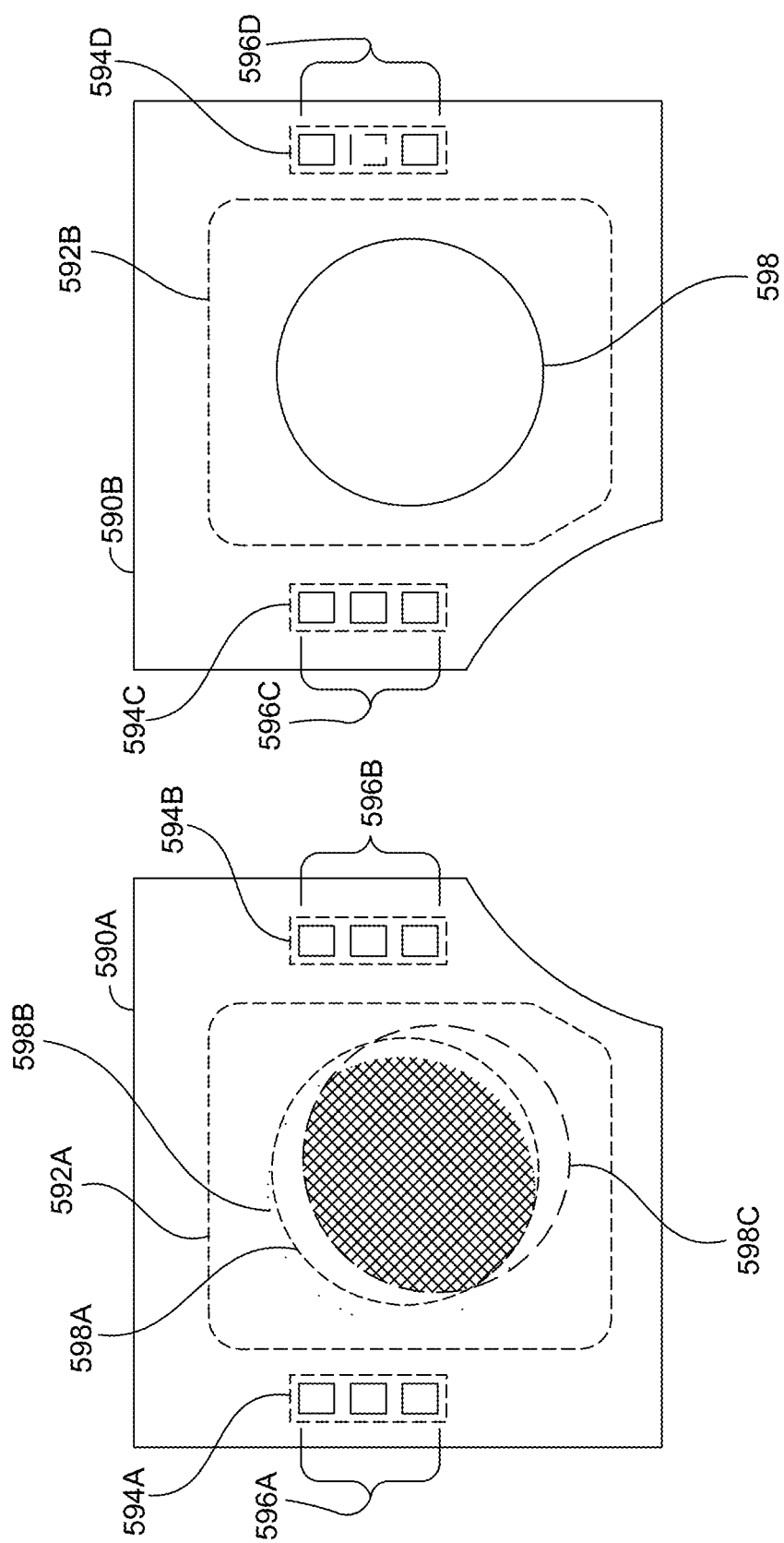
FIG. 5C is a top view of a display device, in accordance with some embodiments.

FIGS. 5A-5C illustrate how images and pupil replications are formed in display device 200 based on different structural arrangement of light emitters, in accordance with different embodiments. An image field 530 of coupling element 238 is an area of coupling element 238 that receives the pre-waveguide image light 208, emitted by the light source 232 and forms an image on the coupling element 238, which is transmitted via waveguide 220. For example, an image field 530 may correspond to a portion of the coupling element 238. Note that decoupling element 214B of FIGS. 2A-2B also includes an image field that outputs the post-waveguide image light 204 to the eye 110 of the user. In some cases, an image field is not an actual physical structure but is an area to which the pre-waveguide or post-waveguide image light is projected and which the image is formed. In one embodiment, the image field is a surface of the coupling element 238 of FIGS. 2A-2B and the image formed on the image field is magnified as light travels through the waveguide 220 of FIGS. 2A-2B. In another embodiment, an image field is formed after light passing through the waveguide which combines the light of different colors to form the image field. In some embodiments, the image field may be projected directly into the user's eyes.

FIG. 5A is a diagram illustrating a scanning operation of a scanning embodiment of display device 200, in accordance with an embodiment. Display device 200 of FIG. 5A may be a scanning embodiment of display device 104 of FIGS. 1A-1B and/or a scanning embodiment of display device 200 of FIGS. 2A-2B, or a scanning embodiment of any other display device discussed herein. As discussed in conjunction with at least FIGS. 2A-2C, display device 200 may include source assembly 230 and a waveguide configuration that includes waveguide 220 and coupling element 238. Coupling element 238 includes an image field 520, of length L2. The image field 520 may include a 2D arrays of pixel locations 532, represented by the blocks in inset 534. The 2D arrays of pixel locations 238 may include p rows, indexed via row 1 through row p. The source assembly 230 includes a light source 232 and a light condition assembly 250. Because display device 200 of FIG. 5A is a scanning display device, the source assembly of FIG. 5A additionally includes a scanning mirror assembly 252, which includes mirror 520, which is a scanning mirror.

As discussed throughout, the light source 232 includes a 1D configuration of emitter arrays (or source elements) 254. That is, light source 232 includes multiple rows and columns of light-emitting components (LECs) that are included in one or more 2D emitter arrays 254. Individual LECs included emitter array 254 are represented by the dots in inset 515. Thus, in some embodiments, emitter arrays may be comprised of one or more arrays of LECs, such as but not limited to light-emitting diodes (LEDs). Various embodiments of emitter arrays are discussed in conjunction with at least FIGS. 3-4. Various non-limiting embodiments of LEDs are discussed in conjunction with at least FIGS. 6A-6B.

In some embodiments, scanning light source 232 may include a 1D configuration of emitter arrays, wherein a separate emitter array 254 of the 1D configuration is dedicated to each primary color of the 2D images to the presented. In various embodiments, the light source 232 may include more than one emitter array 254 for each primary color. Light source 232 may emit source light 244 as a set of collimated beams of light. For example, FIG. 5A shows multiple beams of source light 244 that are emitted by one or more columns of LECs included in emitter array 254. As discussed in conjunction with at least FIGS. 2A-2C, light conditioning assembly 250 may condition source light 244 and transmit resulting conditioned light 248 to scanning mirror assembly 252.

Conditioned light 248 irradiates scanning mirror 520 of scanning mirror assembly 252. The mirror 520 reflects, scans, and projects pre-waveguide image light 208. The mirror 520 may rotate about an axis 522. The mirror 520 may be a microelectromechanical system (MEMS) mirror or any other suitable mirror. As the mirror 520 rotates about rotational axis 522, the pre-waveguide image light 208 is directed to a different part of the image field 530 of coupling element 238, as illustrated by the reflected part of the pre-waveguide image light 208 in solid lines and the reflected part of the pre-waveguide image light 208 in dash lines.

At a particular orientation of the mirror 520 (i.e., a particular rotational angle), the emitter arrays 254 illuminate a portion of the image field 530 (e.g., a particular subset of multiple pixel locations 532 on the image field 530). In one embodiment, the LECs of emitter arrays 254 are arranged and spaced such that a light beam from each emitter array 254 is projected on a corresponding pixel location 532. In another embodiment, small light emitters such as μLEDs are used for emitter arrays 254 so that light beams from a subset of multiple light emitters are together projected at the same pixel location 532. In other words, a subset of multiple emitter arrays 254 collectively illuminates a single pixel location 532 at a time.

The image field 530 may also be referred to as a scan field because, when the pre-waveguide image light 208 is projected to an area of the image field 530, the area of the image field 530 is being illuminated by the pre-waveguide image light 208. The image field 530 may be spatially defined by a matrix of pixel locations 532 (represented by the blocks in inset 534) in rows and columns. A pixel location here refers to a single pixel. The pixel locations 532 (or simply the pixels) in the image field 530 sometimes may not actually be additional physical structure. Instead, the pixel locations 532 may be spatial regions that divide the image field 530. Also, the sizes and locations of the pixel locations 532 may depend on the projection of the pre-waveguide image light 208 from the source assembly 230. For example, at a given angle of rotation of the mirror 520, light beams emitted from the light source 232 may fall on an area of the image field 530. As such, the sizes and locations of pixel locations 532 of the image field 530 may be defined based on the location of each light beam.

In some embodiments, a pixel location 532 may be subdivided spatially into subpixels (not shown). For example, a pixel location 532 may include a red subpixel, a green subpixel, and a blue subpixel. The red subpixel corresponds to a location at which one or more red light beams are projected, etc. When subpixels are present, the color of a pixel 532 is based on the temporal and/or spatial average of the subpixels.

The number of rows and columns of emitter arrays 254 of the light source 232 may or may not be the same as the number of rows and columns of the pixel locations 532 in the image field 530. In various 1D configurations of emitter arrays 254, the number of emitter arrays 254 in a row is equal to the number of pixel locations 532 in a row of the image field 530 while the number of emitter arrays 254 in a column is two or more, but fewer than the number of pixel locations 532 in a column of the image field 530.

In other 1D configurations of emitter arrays 254, the configuration of emitter arrays 254 of light source 232 has the same number of columns of emitter arrays 254 as the number of columns of pixel locations 532 in the image field 530, but has fewer rows than the image field 530. For example, in one specific embodiment, the light source 232 has approximately 1280 columns of emitter arrays 254, which is the same as the number of columns of pixel locations 532 of the image field 530. The light source 232 may have a first length L1, which is measured from the first row to the last row of emitter arrays 254. The image field 530 has a second length L2, which is measured from row 1 to row p of the scan field 530. In one embodiment, L2 is greater than L1 (e.g., L2 is 50 to 10,000 times greater than L1).

As noted, scanning embodiments of display device 200 include a 1D configuration of emitter arrays 254, where the number of rows of pixel locations 532 is larger than the number of rows of emitter arrays 254 in some embodiments, the display device 200 may employ the mirror 520 to project the light 502 to different rows of pixels at different times. As the scanning mirror 520 rotates and the pre-waveguide image light 208 scans through the image field 530 quickly, a scanned image is formed on the image field 530. In some embodiments, the light source 232 may have a smaller number of columns than the image field 530. The mirror 520 may rotate in two dimensions to fill the image field 530 with light (e.g., a raster-type scanning down rows then moving to new columns in the image field 530).

The display device 200 may operate in predefined display periods. A display period may correspond to a duration of time in which an image is formed. For example, a display period may be associated with the frame rate (e.g., a reciprocal of the frame rate). In the particular scanning embodiment shown in FIG. 5A, scanning mirror 520 mirror rotates as a particular rotational frequency, and the display period is as a scanning period that is dependent upon the rotational frequency of mirror 520. A complete cycle of rotation of the mirror 520 may correspond to the scanning period. A scanning period herein refers to a predetermined cycle time during which the entire image field 530 is completely scanned. The scanning of the image field 530 is controlled by the mirror 520.

The light generation of the display device 200 may be synchronized with the rotation of the mirror 520. For example, in one embodiment, the rotational movement of the mirror 520 from an initial position that projects light to row 1 of the image field 530, to the last position that projects light to row p of the image field 530, and then back to the initial position is equal to a scanning period. The scanning period may also be related to the frame rate of the display device 200. By completing a scanning period, an image (e.g., a frame) is formed on the image field 530 per scanning period. Hence, the frame rate may correspond to the number of scanning periods in a second.

As the mirror 520 rotates, light scans through the image field and images are formed. The actual color value and light intensity (brightness) of a given pixel location 532 may be an average of the color various light beams illuminating the pixel location during the scanning period. After completing a scanning period, the mirror 520 rotates back to the initial position to project light onto the first few rows of the image field 530 again, except that a new set of driving signals may be fed to the emitter arrays 254. The same process may be repeated as the scanning mirror 520 rotates in cycles. As such, additional images are formed in the scanning field 530 in different frames.

FIG. 5B illustrates a waveguide configuration 106 of a display device that forms images and replications of images, in accordance with various embodiments. Replications of images may be referred to as pupil replications. Waveguide configuration 106 may be employed in the scanning embodiments, as well as the non-scanning embodiments discussed herein. Waveguide configuration includes light source 232 and waveguide 220. Light source 232 may be included in a source assembly, such as but not limited to source assembly 230 of FIGS. 2B-2C and FIG. 5A. Thus, in scanning embodiments, light source 232 in a scanning light source, and in non-scanning embodiments, light source 232 is a non-scanning light source. As such, the light source 232 may comprise three separate emitter arrays 254, as described in conjunction with at least FIGS. 3-4. The primary colors of emitter arrays 254 may be red, green, and blue, or another combination of other suitable primary colors. The various operations and/or functionalities of waveguide configuration 106 may be controlled via executing instructions on a processor device and/or controller device. When the instructions are executed, the processor device and/or controller device may cause the performance of various actions and/or steps. The instructions may be stored on a non-transitory computer-readable storage medium.

In non-scanning embodiments, the number of light emitters (e.g., individual LECs) in emitter arrays 254 may be equal to the number of pixel locations within an image field (not shown in FIG. 5B). As such, each LEC included in emitter array 254 of a non-scanning embodiment may be dedicated to generating images at a particular pixel location of the image field. In scanning embodiments, the number of light emitters in emitter arrays 254 may be equal may be less than the number of pixel locations within the image field.

Thus, in scanning embodiments, each LEC included in emitter array 254 may be dedicated to generating images at multiple pixel locations of the image field. In still other embodiments, scanning and non-scanning configurations may be combined to generate multiple pupil replications.

Thus, the embodiments depicted in FIG. 5B may provide for the projection of many image replications (e.g., pupil replications) or decoupling a single image projection at a single point. Accordingly, additional embodiments of disclosed NEDs may provide for a single decoupling element. Outputting a single image toward the eye-box 108 of FIG. 1B may preserve the intensity of the coupled image light. Some embodiments that provide for decoupling at a single point may further provide for steering of the output image light. Such pupil-steering NEDs may further include systems for eye tracking to monitor a user's gaze. Some embodiments of the waveguide configuration 106 that provide for pupil replication, as described herein, may provide for one-dimensional replication, while other embodiments may provide for two-dimensional replication. For simplicity, FIG. 5B illustrates one-dimensional pupil replication. Two-dimensional pupil replication may include directing light into and outside the plane of FIG. 5B. FIG. 5B is presented in a simplified format. The detected gaze of the user may be used to adjust the position and/or orientation of the emitter arrays 254 individually or the light source 232 as a whole and/or to adjust the position and/or orientation of the waveguide configuration.

The waveguide configuration 106 is disposed in cooperation with a light source (not shown in FIG. 5B), which may include one or more monochromatic or polychromatic emitter arrays 254 secured. Bonded, and/or electrically coupled to a support structure 348 (e.g., a printed circuit board, a backplane, or another structure). The support structure 348 may be coupled to the frame 102 of FIG. 1A. The waveguide configuration 106 may be separated from the light source 232 by an air gap having a distance D1. The distance D1 may be in a range from approximately 50 μm to approximately 500 μm in some examples. The monochromatic or polychromatic images or images projected from the light source 232 (as pre-waveguide image light 208) may pass through the air gap toward the waveguide configuration 106. Any of the light source embodiments described herein may be utilized as the light source 232.

The waveguide 220 may be formed from a glass or plastic material. The waveguide 220 may include a coupling area 544 (which includes coupling elements 238) and a decoupling area formed by decoupling elements 214A on a top surface 216 and decoupling elements 214B on a bottom surface 218 in some embodiments. The area within the waveguide 220 in between the decoupling elements 214A and 214B may be considered a propagation area 550, in which light images (formed by pre-waveguide image light 208) received from the light source 232 and coupled into the waveguide 220 by coupling elements 238 included in the coupling area 544 may propagate laterally within the waveguide 220.

The coupling area 544 may include coupling elements 238 configured and dimensioned to couple light of a predetermined wavelength, e.g., red, green, or blue light. When a white light emitter array is included in the light source 232, the portion of the white light that falls in the predetermined wavelength may be coupled by each of the coupling elements 238. In some embodiments, the coupling elements 238 may be gratings, such as Bragg gratings, dimensioned to couple a predetermined wavelength of light. In some examples, the gratings of each coupling element 238 may exhibit a separation distance between gratings associated with the predetermined wavelength of light that the particular coupling element 238 is to couple into the waveguide 220, resulting in different grating separation distances for each coupling element 238. Accordingly, each coupling element 238 may couple a limited portion of the white light from the white light emitter array when included. In other examples, the grating separation distance may be the same for each coupling element 238. In some examples, coupling element 238 may be or include a multiplexed coupler.

As shown in FIG. 5B, pre-waveguide image light 208 may include a red image 560A, a blue image 560B, and a green image 560C. The images 560A-560C may be coupled by the coupling elements 238 of the coupling area 544 into the propagation area 550 and may begin traversing laterally within the waveguide 220. In one embodiment, the red image 560A, the blue image 560B, and the green image 560C, each represented by a different dash line in FIG. 5B, may converge to form an overall image that is represented by a solid line. For simplicity, FIG. 5B may show an image by a single arrow, but each arrow may represent an image field where the image is formed. In another embodiment, red image 560A, the blue image 560B, and the green image 560C, may correspond to different spatial locations.

A portion of the light may be projected out of the waveguide 220 (e.g., post-waveguide light 204) after the light contacts the decoupling element 214A for one-dimensional pupil replication, and after the light contacts both the decoupling element 214A and the decoupling element 214B for two-dimensional pupil replication. In two-dimensional pupil replication embodiments, the light may be projected out of the waveguide 220 at locations where the pattern of the decoupling element 214A intersects the pattern of the decoupling element 214B.

The portion of light that is not projected out of the waveguide 220 by the decoupling element 214A may be internally reflected off the decoupling element 214B. The decoupling element 214B may reflect all (or near-all) incident light back toward the decoupling element 214A, as depicted. Accordingly, the waveguide 220 may combine the red image 560A, the blue image 560B, and the green image 560C into a polychromatic image instance, which may be referred to as a pupil replication 562. The polychromatic pupil replication 562 may be projected toward the eye-box 108 of FIG. 1B and to the eye 110, which may interpret the pupil replication 562 as a full-color image (e.g., an image including colors in addition to red, green, and blue). Pupil replication 562 may include at least a portion of the post-waveguide image light 204. The waveguide 220 may produce tens or hundreds of pupil replications 562 or may produce a single replication 562.

In some embodiments, the waveguide configuration 106 may differ from the configuration illustrated in FIG. 5B. For example, the coupling area 544 may be different. Rather than including gratings as coupling element 238, an alternate embodiment may include a prism that reflects and refracts received image light, directing it toward the decoupling element 214A. Also, while FIG. 5B generally shows the light source 232 having multiple emitter arrays 254 coupled to the same support structure 348, other embodiments may employ a light source 232 with separate monochromatic emitter arrays 254 located at disparate locations about the waveguide configuration (e.g., one or more emitter arrays 254 located near a top surface of the waveguide configuration and one or more emitter arrays 254 located near a bottom surface of the waveguide configuration).

Also, although only three emitter arrays are shown in FIG. 5B (e.g., a scanning 1D configuration of emitter arrays), an embodiment may include more or fewer emitter arrays. For example, in one embodiment, a display device may include two red emitter arrays, two green emitter arrays, and two blue emitter arrays (e.g., a non-scanning 2D configuration of emitter arrays). In one case, the extra set of emitter panels provides redundant light emitters for the same pixel location. In another case, one set of red, green, and blue panels is responsible for generating light corresponding to the most significant bits of a color dataset for a pixel location while another set of panels is responsible for generating light corresponding the least significant bits of the color dataset.

FIG. 5C is a top view of a display system (e.g., an NED), in accordance with an embodiment. The NED may include a pair of waveguide configurations. The included waveguide configuration may be an embodiment of, or at least similar to, at least one of waveguide configuration 106 of FIG. 1B, the waveguide configuration of FIG. 2A, and/or waveguide configuration 106 of FIG. 5B. Each waveguide configuration projects images to an eye of a user. In some embodiments not shown in FIG. 5C, a single waveguide configuration that is sufficiently wide to project images to both eyes may be used.

The waveguide configurations 590A and 590B may each include a decoupling area 592A or 592B. In order to provide images to an eye of the user through the waveguide configuration 590, multiple coupling areas 594 may be provided in a top surface of the waveguide of the waveguide configuration 590. The coupling areas 594A and 594B may include multiple coupling elements to interface with light images provided by an emitter array set 596A and an emitter array set 596B, respectively. Each of the emitter array sets 596 may include a plurality of monochromatic light emitter arrays, as described herein. As shown, the emitter array sets 596 may each include a red emitter array, a green emitter array, and a blue emitter array. As described herein, some emitter array sets may further include a white emitter array or a emitter array emitting some other color or combination of colors.

The right eye waveguide 590A may include one or more coupling areas 594A, 594B, 594C, and 594D (all or a portion of which may be referred to collectively as coupling areas 594) and a corresponding number of emitter array sets 596A, 596B, 596C, and 596D (all or a portion of which may be referred to collectively as the light emitter array sets 596). Accordingly, while the depicted embodiment of the right eye waveguide 590A may include two coupling areas 594 and two emitter array sets 596, other embodiments may include more or fewer. In some embodiments, the individual emitter arrays of an emitter array set may be disposed at different locations around a decoupling area. For example, the emitter array set 596A may include a red emitter array disposed along a left side of the decoupling area 592A, a green emitter array disposed along the top side of the decoupling area 592A, and a blue emitter array disposed along the right side of the decoupling area 592A. Accordingly, emitter arrays of an emitter array set may be disposed all together, in pairs, or individually, relative to a decoupling area.

The left eye waveguide 590B may include the same number and configuration of coupling areas 594 and LED sets 596 as the right eye waveguide 590A, in some embodiments. In other embodiments, the left eye waveguide 590B and the right eye waveguide 590A may include different numbers and configurations (e.g., positions and orientations) of coupling areas 594 and emitter array sets 596. Included in the depiction of the left waveguide 590A and the right waveguide 590B are different possible arrangements of pupil replication areas of the individual emitter arrays included in one emitter array set 596. In one embodiment, the pupil replication areas formed from different color emitter arrays may occupy different areas, as shown in the left waveguide 590A. For example, a red emitter array of the emitter array set 596 may produce pupil replications of a red image within the limited area 598A. A green emitter array may produce pupil replications of a green image within the limited area 598B. A blue emitter array may produce pupil replications of a blue image within the limited area 598C. Because the limited areas 598 may be different from one monochromatic emitter array to another, only the overlapping portions of the limited areas 598 may be able to provide full-color pupil replication, projected toward the eye-box 108. In another embodiment, the pupil replication areas formed from different color emitter arrays may occupy the same space, as represented by a single solid-lined circle 598 in the right waveguide 590B.

In one embodiment, waveguide portions 590A and 590B may be connected by a bridge waveguide (not shown). The bridge waveguide may permit light from the emitter array set 596A to propagate from the waveguide portion 590A into the waveguide portion 590B. Similarly, the bridge waveguide may permit light emitted from the emitter array set 596B to propagate from the waveguide portion 590B into the waveguide portion 590A. In some embodiments, the bridge waveguide portion may not include any decoupling elements, such that all light totally internally reflects within the waveguide portion. In other embodiments, the bridge waveguide portion 590C may include a decoupling area. In some embodiments, the bridge waveguide may be used to obtain light from both waveguide portions 590A and 590B and couple the obtained light to a detection (e.g. a photo-detector), such as to detect image misalignment between the waveguide portions 590A and 590B.

Structure of a Light-Emitting Diode (LED)

Figure 6A:
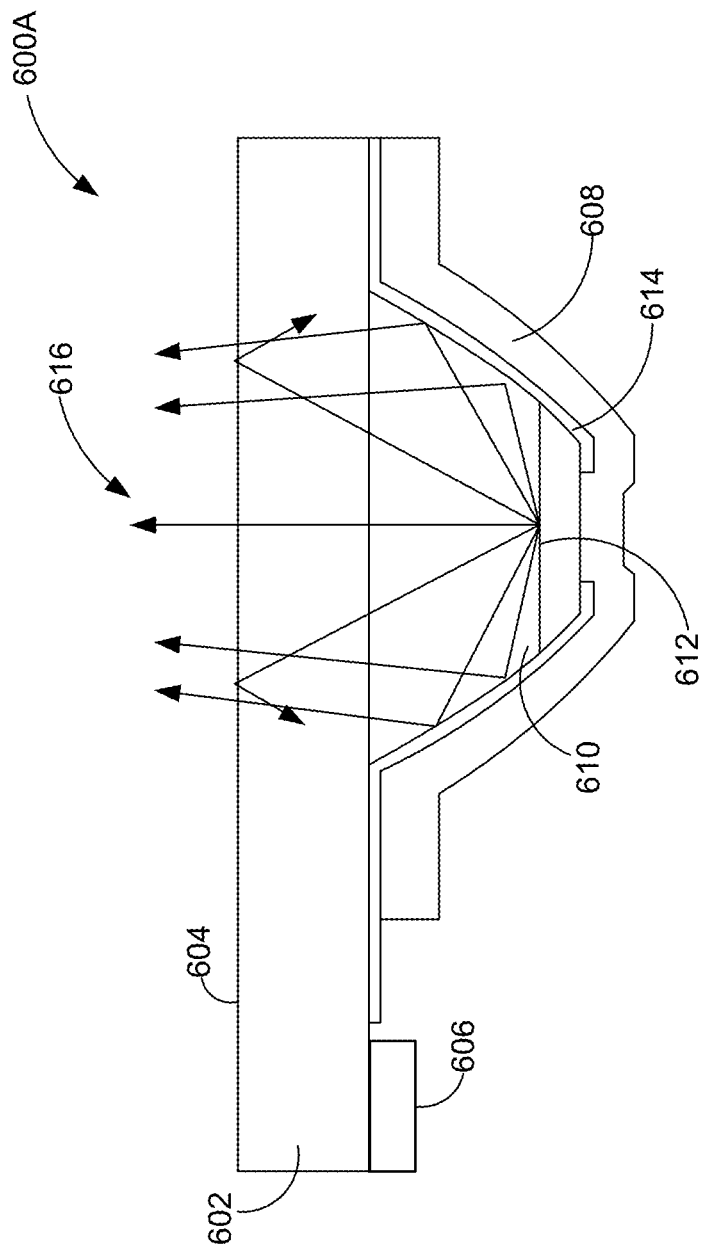
FIG. 6A is a cross-sectional diagram illustrating an embodiment of an LED, in accordance with one embodiment.

FIG. 6A is a cross-sectional diagram illustrating an LED 600A, in accordance with one embodiment. LED 600A may be a light-emitting component (LEC) included in any of the emitter arrays discussed herein. As such, LED 600A may be included in a head-mounted device (HMD), such as but not limited to HMD 100 of FIGS. 1A-1B. LED 600A may be an LED die. In various embodiments, LED 600A is a micro-LED (μLED), where the feature sizes are on the order of a few microns (μm) to hundreds of microns. In at least some embodiments, the feature size of LED 600A may be less than a micron (i.e., the feature size may be sub-micron). LED 600A is an example of an LED that may be positioned on and bonded to a surface of a display substrate (e.g., backplane 348 of FIGS. 3-4 or the target substrate 832 shown in FIGS. 8A-8B) to emit visible or invisible light. The target substrate may be a backplane for a display device, such as but not limited to backplane 348 of FIGS. 3-4.

In some embodiments, LED 600A is formed on a substrate layer (not shown in FIG. 6A), or semiconductor wafer, and includes, among other components a semiconductor layer 602, a dielectric layer 614 disposed on the semiconductor layer 602, a p-contact 608 disposed on a first portion of the dielectric layer 614, and an n-contact 606 disposed on a second portion of the semiconductor layer 602. The semiconductor layer 602 may be formed on a substrate layer, such as but not limited to a gallium substrate layer. Thus, semiconductor layer 602 may be a gallium (Ga) semiconductor layer. Note that semiconductor layer 602 may be formed of other semiconductor lattices or materials, such as gallium nitride (GaN), gallium phosphide (GaP), gallium arsenide (GaAS), or any other semiconductor material appropriate for the fabrication of an LED. Note that this discussion of LED 600A is non-limiting, and LED 600A may be formed via other semiconductor lattices other than gallium-based lattices. In some embodiments, the semiconductor layer 602 is formed on the substrate layer as an epitaxial layer.

The p-contact 608 and the n-contact 606 are the electrical contacts coupled to the p-type and n-type regions of LED 600A, respectively. That is, p-contact 608 may be employed to electrically couple the p-type region of LED 600A to other semiconductor devices, such as but not limited to a target substrate. Likewise, n-contact 606 may be employed to electrically couple the n-type region of LED 600A to other semiconductor devices. For example, p-contact 608 and n-contact 606 may be bonded to corresponding electrical contacts of a backplane to bond LED 600A to the backplane. P-contact 608 and n-contact 606 may singly, or collectively, be referred to as electrical contacts, electrical interconnects, electrical leads, or contact pads of LED 600A. In some embodiments, p-contact 608 and n-contact 606 may include metal bumps. In some non-limiting embodiments, p-contact 608 and n-contact 606 may be comprised of a copper-tin (CuSn) alloy.

LED 600A may be less than 100 microns in diameter with a parabolic structure etched onto the LED die during wafer processing to form a quasi-collimated light beam emerging from the light-emitting face 604. In at least one embodiment, LED 600A may be less than 100 microns in diameter. LED 600A may include highlight extraction efficiency and outputs quasi-collimated light because of its shape. As shown in FIG. 6A, semiconductor layer 602 may be shaped into a mesa-structure 610. An active (or light emitting) layer 612 (or 'active light-emitting area") is included in the mesa-structure 610. The active layer 612 may correspond to the region of the band gap of LED 600A. A voltage difference applied across the p-contact 608 and the n-contact 606 may result in the active layer 612 emitting visible or invisible photons (i.e., light). The mesa 610 has a truncated top, on a side opposed to the light-emitting face 604. The mesa 610 also has a curved or near parabolic shape to form a reflective enclosure for light within LED 600A. The arrows L show how light emitted from the active layer 612 is reflected off the walls of the mesa 610 toward the light-emitting face 604 at an angle sufficient for the light to escape the LED 600A (e.g., within the angle of total internal reflection).

The structure of LED 600A results in an increase in the efficiency of light emission when compared to unshaped or conventional LED chips. As such, the LED 600A produces light visible to the human eye with reduced current (e.g., nano-amps of drive current). LED 600A is an example of an LED die, although other types of LED dies may be assembled onto a backplane for a display, as discussed herein.

Figure 6B:
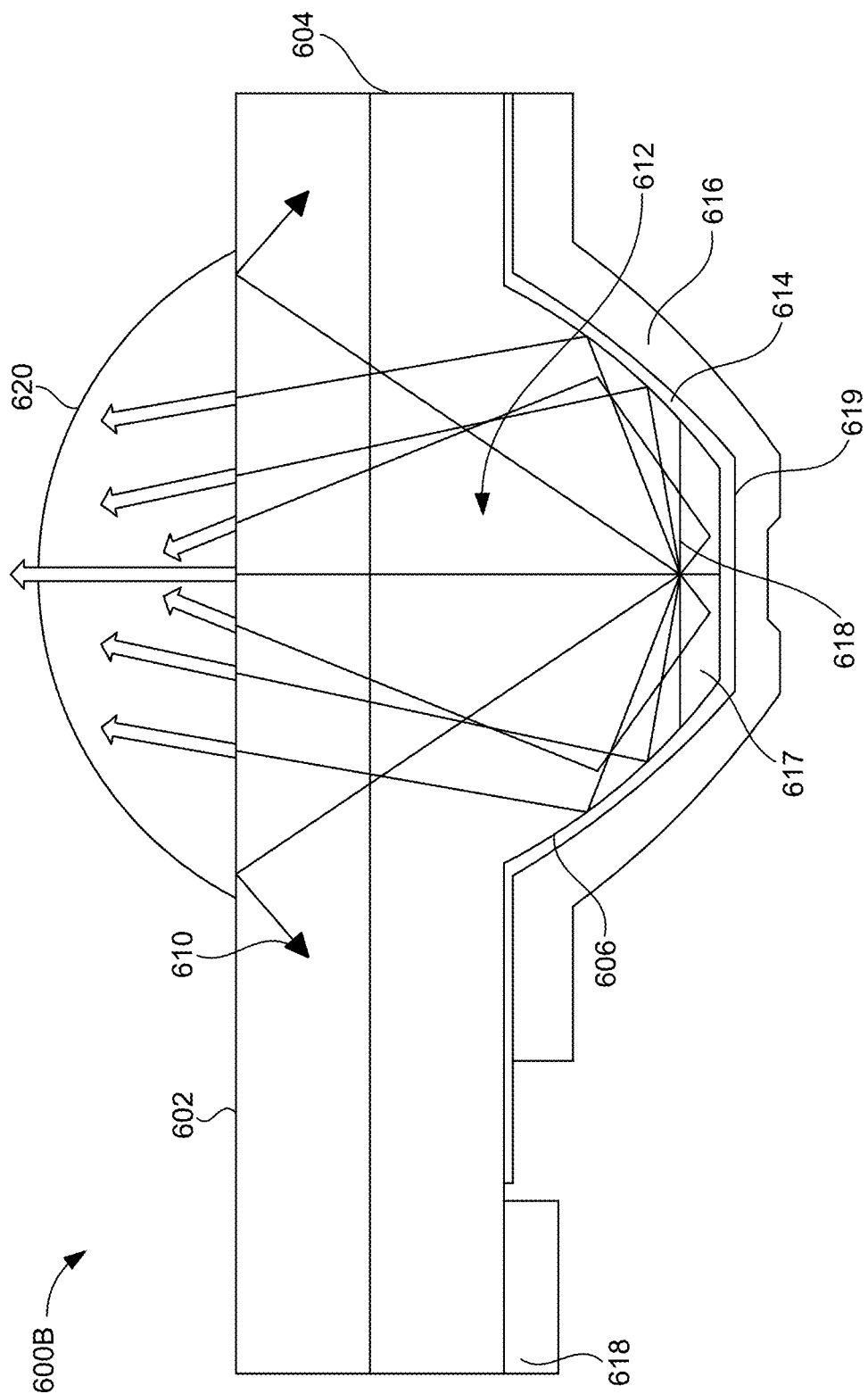
FIG. 6B is a cross-sectional diagram illustrating another embodiment of an LED, in accordance with one embodiment.

FIG. 6B depicts a μLED 600B that is similar in many respects to the μLED 600A of FIG. 6A. The μLED 600B may further include a μlens 620, which may be formed over the parabolic structure. In some embodiments, the μlens 620 may be formed by applying a polymer coating over the μLED 600A, patterning the coating, and reflowing the coating to achieve the desired lens curvature. The μlens 620 may be disposed over an emissive surface to alter a chief ray angle of the μLED 600B. In another embodiment, the μlens 620 may be formed by depositing a μlens material above the μLED 600A (for example, by a spin-on method or a deposition process). For example, a μlens template (not shown) having a curved upper surface can be patterned above the μlens material. In some embodiments, the μlens template may include a photoresist material exposed using a distributing exposing light dose (e.g., for a negative photoresist, more light is exposed at a bottom of the curvature and less light is exposed at a top of the curvature), developed, and baked to form a rounding shape. The μlens 620 can then be formed by selectively etching the μlens material according to the μlens template. In some embodiments, the shape of the μlens 620 may be formed by etching into the substrate 602. In other embodiments, other types of light-shaping or light-distributing elements, such as an annular lens, Fresnel lens, or photonic crystal structures, may be used instead of μlenses.

In some embodiments, μLED arrangements other than those specifically discussed above in conjunction with FIGS. 6A and 6B may be employed as a μLED in any of the various embodiments of emitter arrays discussed herein. For example, the μLED may include isolated pillars of epitaxially grown light-emitting material surrounded by a metal reflector. The pixels of an emitter array may also include clusters of small pillars (e.g., nanowires) of epitaxially grown material that may or may not be surrounded by reflecting material or absorbing material to prevent optical crosstalk.

In some examples, the μLED pixels may be individual metal p-contacts on a planar, epitaxially grown LED device, in which the individual pixels may be electrically isolated using passivation means, such as plasma treatment, ion-implantation, or the like. Such devices may be fabricated with light extraction enhancement methods, such as μlenses, diffractive structures, or photonic crystals. Other processes for fabricating the μLEDs of the dimensions noted above other than those specifically disclosed herein may be employed in other embodiments.

Enhanced Probes

As described, embodiments herein provide enhanced probe cards. An enhanced probe card may include a backplane and an array of enhanced probes extending from the backplane. Each of the probes of the array of probes may be fabricated from a semiconductor material. The probe tip may be fabricated from an electrically-conductive semiconductor material, while in other embodiments, the probe tip is fabricated from a relatively electrically-insulating semiconductor material. Whether the semiconductor material of the probe tip is electrically-conductive or -insulating, the electrically conductivity of the probe tip may be enhanced by various methods discussed herein. Each probe may include a cantilever member and a probe tip. The probe tip may be fabricated from an electrically-conductive semiconductor material, while in other embodiments, the probe tip is fabricated from a relatively electrically-insulating semiconductor material. Whether the semiconductor material of the probe tip is electrically-conductive or -insulating, the electrically conductivity of the probe tip may be enhanced by various methods discussed herein. Likewise, the cantilever member may be fabricated from an electrically-conductive semiconductor material, while in other embodiments, the cantilever member is fabricated from a relatively electrically-insulating semiconductor material. In embodiments, where the cantilever member is relatively electrically-insulating, the cantilever member may include one or more electrically-conductive tracks and/or traces, which carry various electrical signals along the cantilever member and to/from the electrically-conductive probe tip. The cantilever member may include a proximate portion and a distal portion, where the proximate portion may be coupled to the backplane and the probe tip may be positioned on the distal portion of the cantilever member. One or more electrically-conductive tracks and/or traces, which extend at least from the cantilever member's proximate portion to the cantilever member's distal portion, may electrically couple the backplane to the probe tip. In some embodiments, the cantilever member and the probe tip are fabricated from one or more equivalent and/or similar semiconductor materials. In other embodiments, the one or more semiconductor materials of the cantilever may be different and/or dissimilar to the one or more semiconductor materials of the probe tip.

FIGS. 7A-7D include diagrams illustrating an enhanced probe 700 from various views. Enhanced probe 700 may be employed in any of the array of probes and/or probe cards discussed herein. Probe 700 includes a cantilever member 702 and a probe tip 704. In various embodiments, probe 700 may be an enhanced atomic force microscopy (AFM) probe. Thus, cantilever member 702 may be an AFM cantilever member and probe tip 704 may be an AFM probe tip. In some embodiments, cantilever member 702 is an enhanced AFM cantilever member with various enhanced electrical and/or mechanical properties (e.g., increased electrical conductivity and increased elasticity) Likewise, probe tip member 704 may be an enhanced AFM probe tip with various enhanced electrical and/or mechanical properties (e.g., increased electrical conductivity and increased elasticity). FIG. 7A shows a side-view of probe 700. FIG. 7B shows a bottom-view of probe 700. FIG. 7C shows a front-view of probe 700. FIG. 7D shows an off-axis-view of probe 700.

As used throughout, various portions of the probe may be referred to. For example, probe 700 includes a proximate portion 706 and a distal portion 708. As discussed in conjunction with any of the probe cards discussed herein, including but not limited to enhanced probe card 800 and/or enhanced probe card 900 of FIGS. 8A-8C and FIGS. 9A-9B respectively, the proximate portion 706 of cantilever member 702 may be coupled to and extend from a probe card backplane. As shown in FIGS. 7A-7D, the probe tip 704 is positioned on the distal portion 708 of cantilever member 702. More specifically, probe tip 704 extends from the probe underside 716 (and/or the cantilever member underside) of the distal portion 708 of the cantilever member 702. Probe 700 also includes probe upper-side 714 (and/or the cantilever member upper-side), a probe front-side 718, and a probe lateral-side 728. Note that FIGS. 7A-7D are provided for illustrative purposes, and are non-limiting. For example, the ratios of physical dimensions (e.g., cantilever member's 702 height to width to length ratios, the ratio of the size of cantilever member 702 to that of probe tip 704, and the like) of probe 700 may vary across the embodiments.

In the embodiments shown in FIGS. 7A-7E, the cantilever member 702 is fabricated from a relatively electrically-insulating semiconductor material (e.g., silicon). As such, probe 700 includes an electrically-conductive track 740 and/or trace. The electrically-conductive track 740 and/or trace may be fabricated from aluminum, gold, silver, or any other electrically-conductive material. The track 740 may be a metallization layer on the cantilever member 702 and/or probe 700. Track 740 may extend at least between the proximate portion 706 to the distal portion 708 of cantilever member 702. Track 740 may electrically couple proximate portion 706 to the probe tip 704. In the non-limiting embodiments of FIGS. 7A-7D, track 740 is disposed or positioned on probe underside 716. In other embodiments, track 740 may be positioned on probe upper-side 714. See FIG. 10. In still other embodiments, trach 740 may be positioned and/or embedded within the body of cantilever member. See FIG. 11. The track 740 and/or trace is electrically coupled to probe tip 704, such that electrical signals may be transmitted to and from the electrically-conductive probe tip 704. Thus, cantilever member 702 may be an insulating cantilever member and probe tip 704 may be a conductive probe tip. In some embodiments, the cantilever member 702 may itself be electrically-conductive, and thus, electrically conductive track 740 and/or trace may not be required for such embodiments.

Figure 7E:
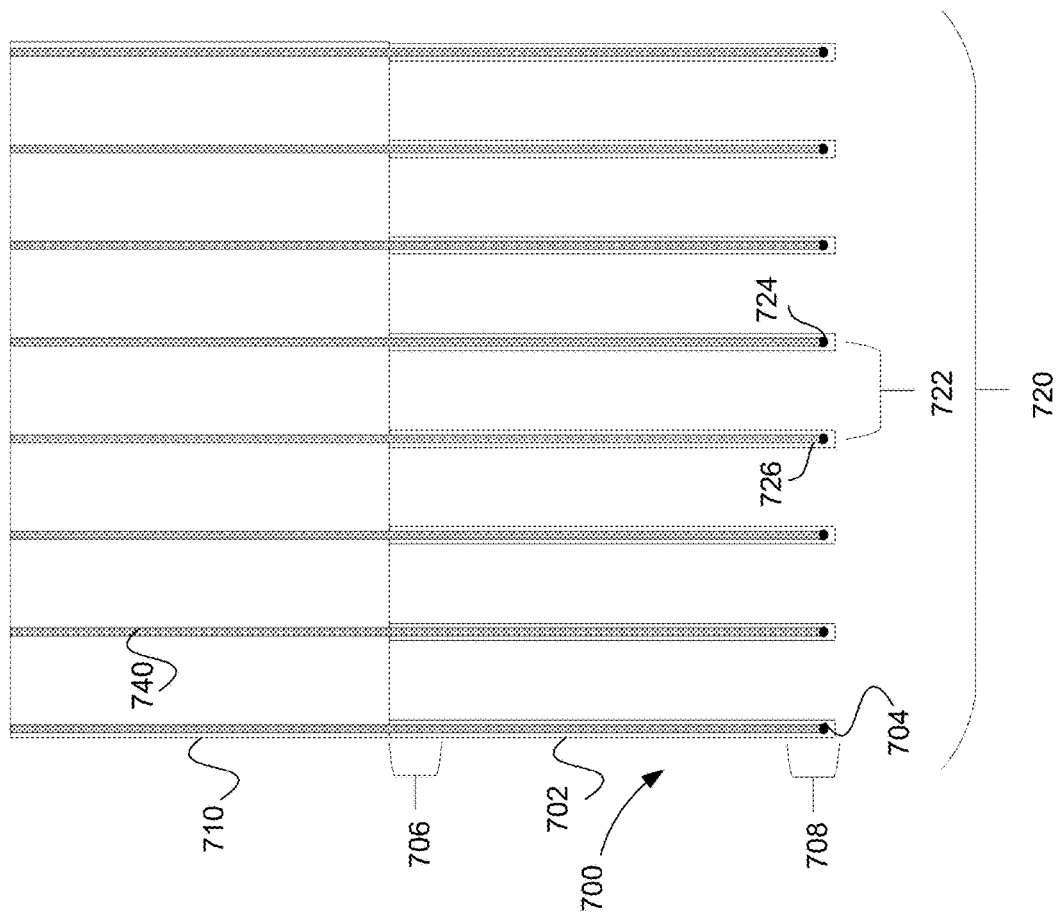
FIG. 7E includes a diagram illustrating an underside of an array of enhanced probes fabricated from a semiconductor backplane.

FIG. 7E includes a diagram illustrating an underside of an array of enhanced probes 720 fabricated from and/or fabricated on a semiconductor backplane 710. Each probe of the array of probes 720 may be, or at least be similar to, probe 700 of FIGS. 7A-7D. As such, probe 700 is included in the array of probes 720. Each probe of the array of probes 720 may include a cantilever member 702 and a probe tip 704. The distance 722 between adjacent and/or consecutive probe tips 726 and 724 may be referred to as the pitch of array 720. Each of cantilever members and probe tips, such as but not limited to cantilever member 702 and probe tip 704 of probe 700, may be comprised of a semiconductor material, such as but not limited to silicon (Si). The semiconductor material may be an electrically-conductive semiconductor material. The electrical conductivity, as well as the elasticity, of the probes may be enhanced and/or increased from that of conventional AFM probes. In some embodiments, the pitch of the array 720 may be constant across array 720. In other embodiments, the pitch may vary to accommodate DUTs with contact pads that vary in pitch across the DUT.

In various embodiments, the array of probes may be fabricated from and/or on a larger semiconductor backplane 710 that is larger in size than the probes themselves. The semiconductor backplane 710 may be comprised of silicon or any other semiconductor material. The semiconductor backplane 710 may be comprised of at least a portion of a semiconductor wafer and/or semiconductor film. Semiconductor backplane 710 may be referred to as a cantilever backplane. Various fabrication processes may be employed to fabricate the array of probes 720 from and/or on the semiconductor backplane 710. Furthermore, the probe tips may be grown and/or fabricated on the cantilever members via various means.

Note that the proximate portion 706 of cantilever member 702 is coupled to, and extends from, the semiconductor backplane 710. The probe tip 704 of probe 700 is positioned on the underside of the proximate portion 708 of cantilever member 702 and extends from the underside of cantilever member 702. The array of probes 720 extend from semiconductor backplane 710 in a parallel finger-like fashion. Semiconductor backplane 710 may be employed to position, transport, and/or install the array 720 into an enhanced probe card. In some embodiments, as discussed below, semiconductor backplane 710 may be modified to serve as a backplane in an enhanced probe card, such as but not limited to probe card backplane 810 of FIGS. 8A-8C and/or probe card backplanes 910/912 of FIGS. 9A-9B.

Also shown in FIG. 7E are the electrically-conductive tracks and/or traces (e.g., track 740) that electrically couple the probe tips (e.g., probe tip 704) to backplane 710. Similar to the cantilever member 702, the semiconductor backplane 710 may be fabricated from a relatively electrically-insulating semiconductor material (e.g., undoped silicon). As such, electrically-conductive track 740 may extend into from the cantilever member 702 and into backplane 710, in order to transmit electrical signals through backplane 710.

The array of probes 720 may be fabricated to correspond to contact pad feature size and pitch of a DUT to be tested. That is, array 720 may be fabricated such that a one-to-one mapping and/or correspondence between the probes of array 720 and the contact pads of the DUT exists. The feature size of the probe tip 704 may be submicron, or even in the nanometer range. In some embodiments, the pitch 722 of the array 720 may be on the order of 1-5 microns, based on the layout of the contact pads of a DUT of interest. In other embodiments, the pitch 722 of array 720 may be submicron. In still other embodiments, the pitch 722 of array 720 may be larger, and may be on the order of tens or even hundreds of microns, based on the DUT of interest.

The electrical conductivity of probe tip 704 and/or the cantilever member 702 may be enhanced (or conversely the electrical resistance may be attenuated) via an application of a semiconductor process, a conductive film, a conductive trace, and/or one or more layers of conductive bodies, such as but not limited to conductive nanoparticles, nanotubes, or the like. As noted above, the cantilever member 702 and backplane 710 may be relatively insulating, and one or more conductive tracks 740 and/or traces are employed to transmit electrical signals. In other embodiments, the conductive nanoparticles are grown and/or applied on the semiconductor material of backplane 710. For example, carbon or carbon-compound nanoparticles (or nanotubes) may be grown and/or applied semiconductor backplane 710 prior to fabrication of the array 720. In other embodiments, the nanoparticles may be applied to and/or grown on the cantilever members and probe tips of array 720 after the array 720 is fabricated from and/or on the semiconductor backplane 710. In some embodiments, the electrical conductivity of probe 700 is enhanced such that the cantilever member 702 (or track 740) and the probe tip 704 may repeatedly withstand currents of micro-amperes (µI), or even tens of micro-amperes, for tens or even hundreds of seconds, without significant degradation to the electrical properties and/or physical integrity of the cantilever 702 and probe tip 704.

In addition to electrical properties, the application of these, or other, semiconductor processes, films, and/or particles/nanotubes may be employed to modify various mechanical properties of the cantilever member 702 and probe tip 704. For example, nanoparticles or films may be applied to decrease the brittleness and/or hardness of probe tip 704, such that probe tip 704 can withstand a large number of touchdown events, without significant wear or damage from compressive and/or abrasive frictional forces. In some embodiments, the elasticity of the probe tip 704 and/or cantilever member 702 may be increased via semiconductor processes or other means. In other embodiments, the elasticity of cantilever member 702 and probe tip 704 may be increased and/or the brittleness/hardness may be decreased via various other fabrication processes. As discussed in conjunction with at least FIG. 10, decreased brittleness/hardness and/or increased elasticity of probe tip 704 and cantilever member 702 provides a more durable and reliable probe tip, via the reduction of compressive forces and abrasive frictional forces resulting from numerous touchdown events. For example, in some embodiments, an probe tip 704 with increased elasticity can withstand well over 10,000 touchdown events (and corresponding liftoff events), without significant degradation in electrical conductivity and/or degradation of the physical integrity of probe tip 704 via compressive and abrasive frictional forces. In some embodiments, the electrical and/or mechanical properties of probe 700 may be varied by other means, e.g., enhancements to the fabrication process of 700, varying doping concentrations and/or profiles, or the like.

Enhanced Probe Cards

Figure 8A:
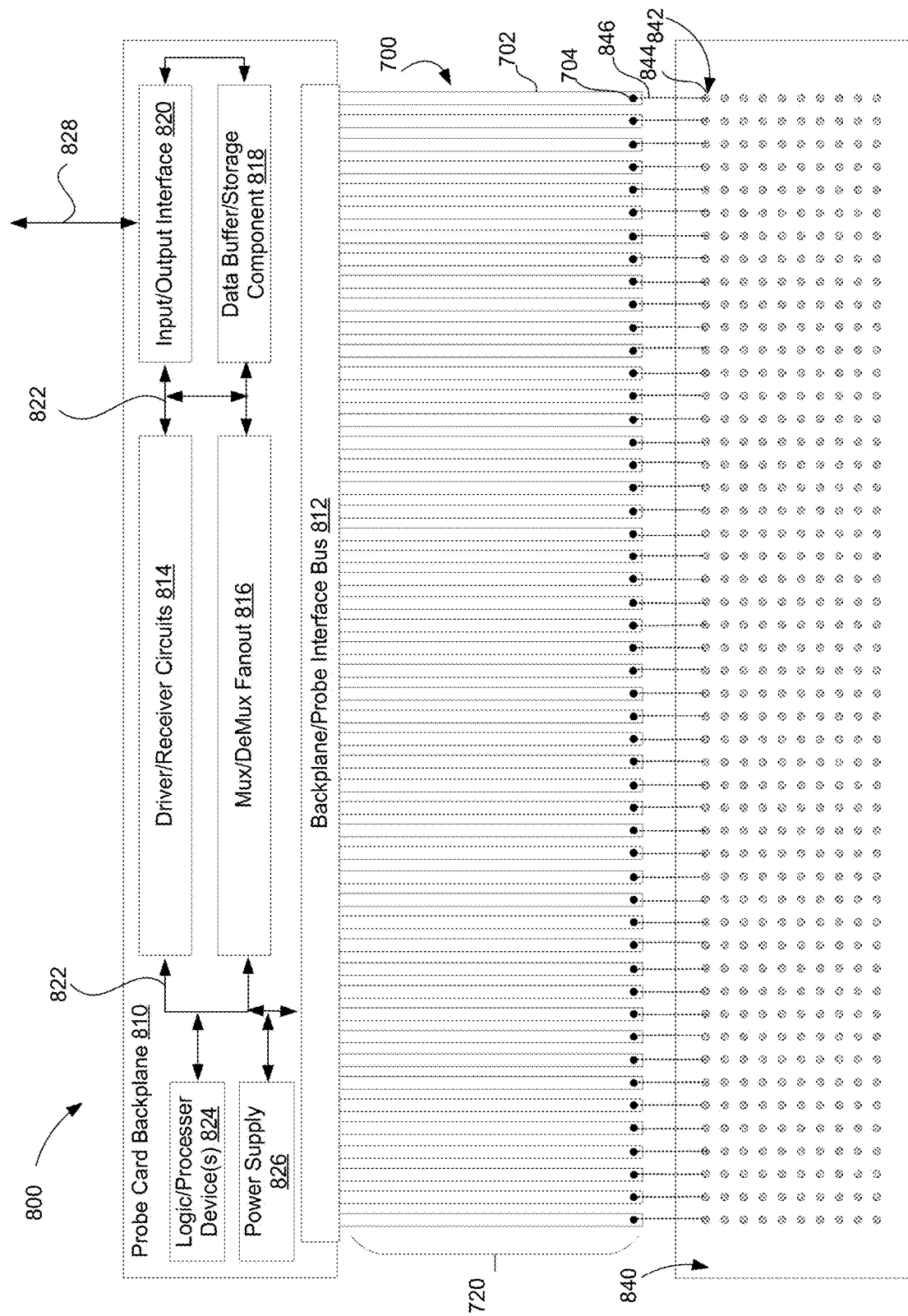
FIG. 8A includes a diagram illustrating a top-view schematic representation of an enhanced probe card and a device-under-test that is consistent with various embodiments.

FIG. 8A includes a diagram illustrating a top-view schematic representation of an enhanced probe card 800 and a DUT 840 that is consistent with various embodiments. Enhanced probe card 800 may be employed to characterize a current and/or future semiconductor fabrication process of a current and/or future semiconductor foundry, via testing DUT 840 fabricated from the process. Enhanced probe card 800 may be a testing device. Enhanced probe card 800 includes probe card backplane 810 and an array of probes 720 that are electrically coupled to and extend from the probe card backplane 810. As discussed throughout, each probe of the arrays of probes 720 may be equivalent to, or at least similar to, probe 700 of FIGS. 7A-7E. Furthermore, array of probes 720 may be equivalent to, or at least similar to, the array of probes 720 of FIG. 7E. Thus, each probe of the array of probes 720, including but not limited to probe 700, may be an enhanced AFM probe. As such, each probe may be fabricated from a semiconductor material, such as but not limited to silicon. The electrically conductivity of the prober tips may be enhanced via particles and/or beads (e.g., carbon nanoparticles). Electrical signals may be transmitted to and from the probe tips, via one or more electrically-conductive tracks and/or traces dispose on, underneath, or embedded within the cantilever members and/or backplane. For clarity, such conductive tracks and/or traces are not shown in FIG. 8A.

Each probe of the array 720, including probe 700, comprises a cantilever member, such as AFM cantilever member 702, and a probe tip, such as AFM probe tip 704. As shown in FIG. 8A, the proximate portion of the cantilever members are electrically and mechanically coupled to probe card backplane 810, and the probe tips are positioned on the underside of a distal portion of the cantilever members. As discussed below, and even though the view of FIG. 8A shows the top-side of probe card 800, the position of the probe tips on the underside of the distal portion of the cantilever members are shown as filled circles to illustrate a one-to-one mapping and/or correspondence between the probe tips and the contact pads of a row of contact pads. As also shown in FIG. 8A, the probes of the array of probe 720, and more particularly the cantilever members, extend from the probe card backplane 810 in a parallel and finger-like fashion.

FIG. 8A further shows a device-under-test (DUT) 840. DUT 840 may include any of the DUTs discussed throughout, including but not limited to an unpackaged die that includes numerous integrated circuits (IC), such as but not limited to micro-light emitting diodes (µLEDs) circuits. DUT 840 may be a die that is not yet cut from (e.g., diced) and/or separated from the fabrication wafer. That is, testing performed via probe card 800 may be wafer-level testing. Unpackaged DUT 840 may include one or more rows of exposed contact pads, such as row of contact pads 842. Each row of contact pads includes one or more exposed contact pads, such as but not limited to exposed contact pad 844 of contact pad row 842. In some embodiments, DUT 840 includes hundreds or even thousands of rows of contact pads. Each row of contact pads may include hundreds or even thousands of contact pads. Thus, DUT 840 may include tens of thousands, hundreds of thousands, or even millions of contact pads.

FIG. 8A illustrates a top-view of both enhanced probe card 800 and DUT 840. As noted above, the position of the probe tips on the distal portion of the cantilever members are shown as filled circles to illustrate a one-to-one mapping and/or correspondence between the probe tips and the contact pads of a row of contact pads. The correspondence is shown via the dashed lines. For example, probe tip 704 of probe 700 is in correspondence to contact pad 844 of row of contact pads 842. The pitch of the array of probes 720 is approximately equivalent to the pitch of the contact pads in row of contact pads 842, thus enabling the one-to-one correspondence. Accordingly, the spacing between adjacent and/or consecutive probe tips substantially matches the spacing between adjacent and/or consecutive contact pads in the row of contact pads. The pitch of the contact pads, as well as the matching pitch of the probes and/or probe tips, may be less 1-5 microns. In other embodiments, the pitches may be submicron. In some embodiments, array of probes 720 may include hundreds, or even thousands of probes. In some embodiments, array of probes 720 includes a probe for each and every contact pad in a row of contact pads. Thus, only a single touchdown event is required to probe each contact pad in a row. In other embodiments, the array of probes 720 includes less probes than the number of contact pads in a row of contact pads. Thus, in these embodiments, multiple touchdown events may be required to probe each and every contact pad of the row. In FIG. 8A, probe card 800 may be vertically above DUT 840, as shown in the front view of FIG. 8B.

Returning to FIG. 8A, probe card backplane 810 may include one or more of: backplane/probe interface bus 812, driver/receiver circuits 814, multiplexer (MUX) and/or demultiplexer (DEMUX) fanout 816, data buffer/storage component 818, input/output (I/O) interface 820, and a general communication bus 822. In some non-limiting embodiments, backplane 810 may include one or more logic and/or processor devices 824. In at least one embodiment, the backplane 810 may include an onboard power supply 826. These various components of the backplane 810 enable the generation and transmission of electronic signals (e.g., test signals or test data) between the backplane 810 and the DUT 840. Each individual probe of the array of probes 720 is separately addressable for the transmission of such electronic signals.

I/O interface 820 is generally responsible for transmitting data 828, or other information, to and from probe card 800. For example, test instructions and/or test signals may be received via I/O interface 820. Furthermore, test data may be offloaded to a computing device for analysis via I/O interface 820. Data 828 may include test data, test signals, test instructions, test vectors, or any other such information. In at least some non-limiting embodiments, I/O interface 820 may be a wireless I/O interface that includes one or more radios (e.g., WiFi, Bluetooth, Ziggbee, or any other wireless antenna/receiver combination). General communication bus 822 may include any communication bus that communicatively couples a component and/or circuit of backplane 810 to other components and/or circuits of the backplane 810. For example, communication bus 822 may transmit data 828, test data, test signals, test instructions, test vectors, and the like. The data 828, or any other information, may be stored, or at least temporarily buffered via data buffer/storage component 818, while it awaits for offloading via I/O interface 820.

Driver/receiver circuits 814 is generally responsible to generate and/or drive test signals (based on test instructions and/or test vectors), as well as receive any test data generated by DUT 840. In some embodiments, driver/receiver circuits 814 may receive test signals from a tester communicatively coupled to I/O interface 820, and selectively drive the received tests signals to the contact pads of the DUT 840 via the probes. Mux/Demux Fanout 816 is generally responsible for selectively providing and/or receiving the electronic signals from each of the separately and individually addressable probes. Mux/Demuc fanout 816 may include a plurality of switches and/or gates to selectively route the electronic signals to and from the individual probes. That is, Mux/Demux fanout 816 can separately address each of the probes included in the array of probes 720. Backplane/probe interface bus 812 generally serves as a communication bus between the Mux/Demux fanout 816 and the individually addressable probes. Mux/Demux fanout 816 may address the probes, via electrically-conductive tracks and/or traces included in the backplane and/or cantilever members (e.g., track 740 of FIGS. 7A-7E). Backplane/probe interface bus 812 may serve to impedance match between the probes (e.g., the electrically conductive tracks) and any other circuitry of the backplane 810, such as but not limited to general communication bus 822.

Logic/processor devices 824 may include, but are not limited to any of: a microprocessor, a microcontroller, a central processing unit (CPU), a graphical processing unit (GPU), a field of programmable gate arrays (FPGA), an application-specific integrated-circuit (ASIC), or any other such device. Logic/processor devices 824 may control and/or coordinate the operation of other component of the backplane 810. For example, logic/processor devices 824 may control a driver included in driver/receiver circuits 814 to generate individual test signals (or alternatively drive signals received via a test) that may be selectively provided to each of the probes of the array of probes 710, via the electronic switches included in Mux/Demux fanout 816. Logic/processer devices 824 may control the electronic switching of the Mux/Demux fanout 816. Similarly, a receiver of the driver/receiver circuits 814, may be controlled and/or operated via logic/processor devices 824, to receive one or more test signals. Logic/processor devices 824 may serve to process any data, such as but not limited to test data, test signals, test instructions, test vectors, or the like. In some embodiments, such logic and/or processor devices may serve to provide some data processing (or at least pre-processing services) of the test data prior to the test data being offloaded via I/O interface 820. In some embodiments, data 824 may be compressed, pruned, encrypted, or otherwise packaged for offloading or transmission via one or more of the logic/processor devices 824.

In at least one embodiment, backplane 810 may include an onboard power supply 826 that provides power to operate logic/processor devices 824, driver/receiver circuits 814, data buffer/storage 818, and the like. In some embodiments, power supply 826 may be a power receiver and distributor that receives power from an external power supply and distributes the received power to the other components of backplane 810 for operability. In still other embodiments, power may be received via the I/O interface 820 and distributed to the other components. In at least one embodiment, power supply 826 may include an onboard battery.

In some embodiments, probe card backplane 810 may include semiconductor backplane 710 of FIG. 7E. As such, probe card backplane may be fabricated from a semiconductor material, such as but not limited to silicon. The semiconductor backplane 710 may be fabricated, processed, or otherwise modified to include at least some of the components, circuitry, and/or functionality of probe card backplane 810. For example, semiconductor backplane 710 may undergo fabrication steps to include integrated circuitry, signal transmission lines, and the like. At least a portion of semiconductor backplane 710 and/or backplane 810 may include a printed circuit board (PCB). Semiconductor backplane 710 may be populated with one or more integrated circuit (IC) chips, or other electronic devices to modify backplane 710 to include various functionalities of probe card backplane 810. In other embodiments, the probes of the array of probes 720 may be separated from semiconductor backplane 710 and installed on probe card backplane 810.

Figure 8B:
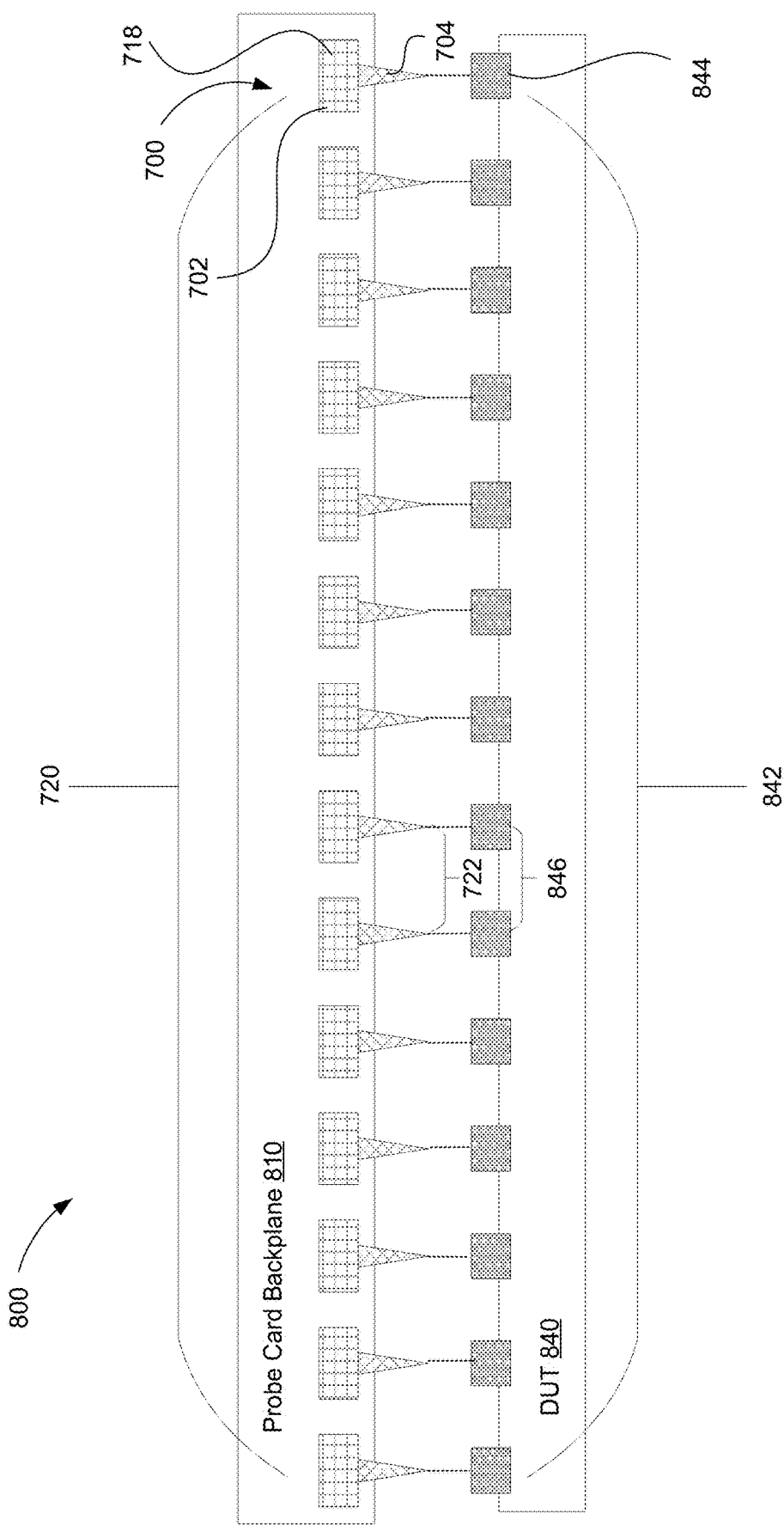
FIG. 8B shows a front view of the enhanced probe card and device-under-test of FIG. 8A, prior to a touchdown event.

FIG. 8B shows a front-view of the enhanced probe card 800 and DUT 840 of FIG. 8A, prior to a touchdown event. In FIG. 8B, probe card 800 has been aligned and positioned vertically above DUT 840. The one-to-one correspondence between the probes of the array 720 and the contact pads of the row of contact pads 842 is shown via the dotted vertical lines. For example, a dotted vertical line demonstrates the correspondence between probe 700 and contact pad 844 of row of contact pads 842. Note that probe card 800 has been aligned such that the probe tips are aligned with and vertically above the corresponding contact pad. In FIG. 8B, the vertical height (or thickness) of probe card backplane 810 may be exaggerated for illustrative purposes, and in other embodiments, backplane 810 may be thinner than shown in FIG. 8B. However, as discussed in conjunction with at least FIG. 12, backplane 810 may be a multilayered backplane, where the multiple layers are processed to enable at least some of the functionality of backplane 810. The front-sides of the probes, such as front-side 718 of probe 700, are shown in FIG. 8B.

The front-view of FIG. 8B demonstrates that the pitch 722 of the array of probes 720, substantially matches the pitch 846 of the row of contact pads 842. As discussed throughout, pitches 722 and 846 may be less than 5 microns. In some embodiments, the pitches 722 and 846 may be less than 2 microns. In still other embodiments, the pitches 722 and 846 may be submicron pitches. Note that the physical size of the probe tips are significantly less than the feature sizes of the contact pads, which may be submicron. In some embodiments, the feature size of the tips of the probe tips is on the order of nanometers.

Figure 8C:
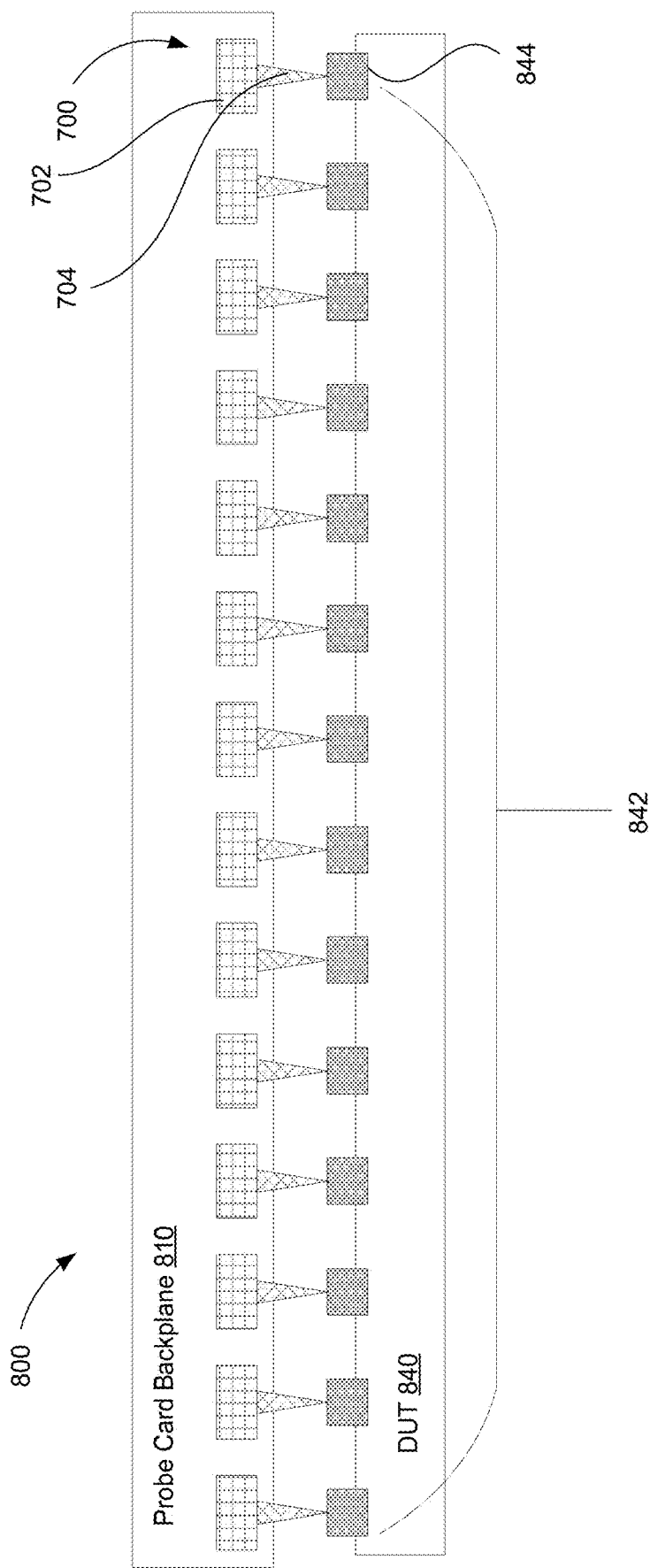
FIG. 8C shows a front view of the enhanced probe card and device-under-test of FIG. 8A, after a touchdown event.

FIG. 8C shows a front-view of the enhanced probe card 800 and DUT 840 of FIG. 8A, after a touchdown event. That is, in FIG. 8C, via the alignment and arrangement of FIG. 8B, probe card 800 has been lowered such that each of the probe tips is in electrical contact with its corresponding contact pad. Thus, FIG. 8C illustrates a touchdown event. Via the touchdown event, probe tip 704 is in electrical contact with corresponding contact pad 844 of row of contact pads 842. When a probe tip of a probe is in electrical contact with a corresponding (via the one-to-one mapping) contact pad of the row, the probe is configured to transmit (i.e., send and/or receive) electrical signals between the backplane 810 and the DUT 840. These signals may include test signals for the characterization of a fabrication process of the die and/or of the semiconductor foundry. Some of the test signals may be generated at the backplane 810 and provided to the microcircuits of DUT 810, via the electrical contact between a probe tip and the corresponding contact pad of the die. Other test signals may be generated by DUT 840, in response to receiving a test signal generated by the backplane 810. Still other test signals may be generated off-board and provided to the backplane 810, such that the backplane 810 can provide these test signals to the DUT 840, via the individually addressable probes. For example, an automated tester, such as but not limited to tester 1150 of FIG. 11, may generate and provide such test signals to the backplane 810, via and I/O interface of the backplane 810, such as but not limited to I/O interface 820 of FIG. 8A. These test signals generated by the DUT 840 may be provided to the backplane 810 via the probe and probe tip. Test signals generated by the backplane 810, or generated by the DUT 840, may be referred to as test data.

As indicated above, the lowering of probe card 800, such that each of the probe tips is in electrical (and physical) contact with the corresponding contacts pads may be referred to as a "touchdown" event, because the probe tips are lowered to touchdown (or land) on the contact pads. In response to receiving the electrical signals (e.g., test data) transmitted between the backplane 810 and the DUT 840, various characteristics of the microcircuits included in the DUT 840, and associated with the row of contact pads 842, may be determined. In various embodiments, various mechanical properties or characteristics (e.g., brittleness, hardness, elasticity, and the like) of the probe tips and/or the cantilever members may be modified such that the probe tips can withstand over 10,000 touchdown events without significant degradation of their electrical conductivity and/or physical integrity due to compressive forces and/or abrasive physical forces associated with the touchdown events. As noted throughout, various electrical properties (electrical conductance, resistance, and the like) of the probe tips and cantilever members may be modified to conduct relatively high levels of current for significant amounts of time, without degradation of the electrical properties or the physical integrity of the probes.

After the test data for row of contacts 842 is collected, probe card 800 may be lifted (e.g., a liftoff event) such that the electrical contact between each of the probe tips and the corresponding contact pad is terminated. The raised probe card 800 may be translated and aligned with another row of contact pads of the DUT 840, such that each of the probe tips is now above and aligned with corresponding contact pads of the other row of contact pads. Probe card 800 may then be lowered for another touchdown event, such that each of the probe tips is in electrical contact with the corresponding contact pads of the other row of contact pads. Additional electrical signals may be transmitted between the backplane 810 and the DUT 840, via the electrical contacts between the probe tips and the corresponding contact pads. Various characteristics of the microcircuits associated with the other row of contact pads may be determined, via the test data included in the transmitted electrical signals.

Figure 9A:
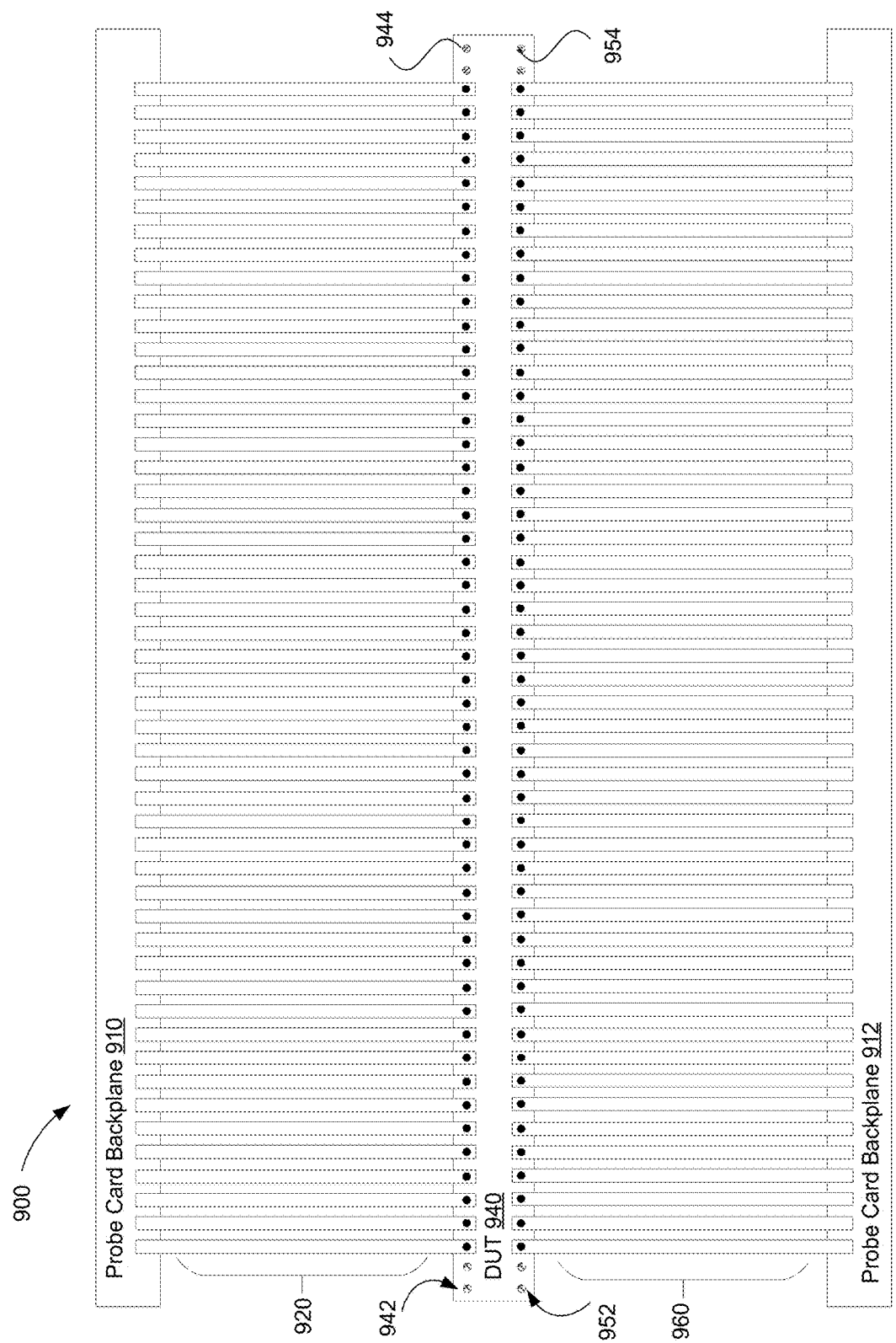
FIGS. 9A-9B include diagrams illustrating a top-view schematic representation of another embodiment of an enhanced probe card and various devices-under-test.
Figure 9B:
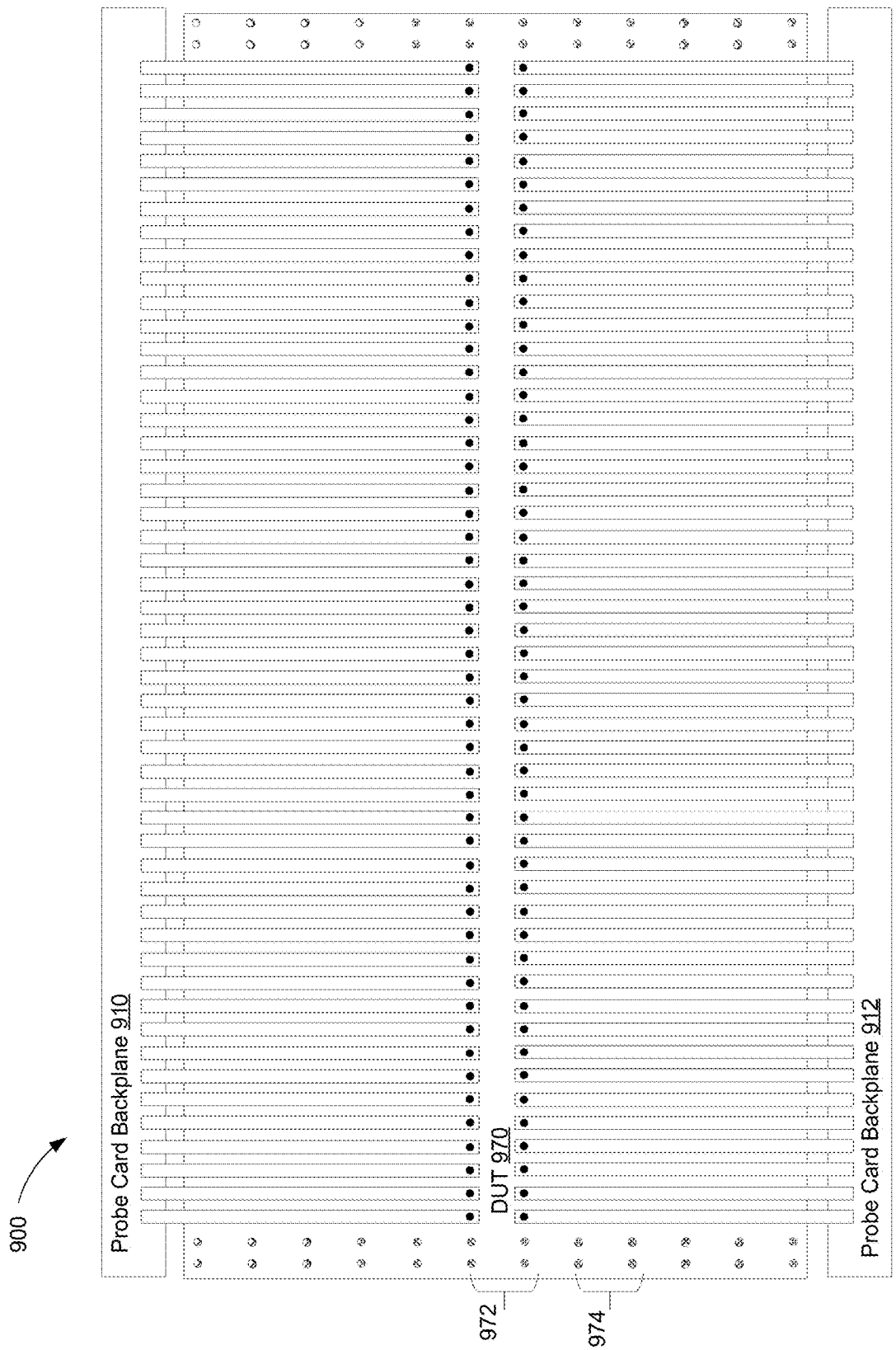

FIGS. 9A-9B include diagrams illustrating a top-view schematic representation of another embodiment of an enhanced probe card 900 and various DUTs. Probe card 900 may be a testing device. Probe card 900 of FIGS. 9A-9B is similar to probe card 800 of FIGS. 8A-8C, except for probe card 900 includes two separate arrays of probes: first probe array 920 and second probe array 960. First probe array 920 extends from a first backplane 910 and second probe array extends from a second backplane 912. In some embodiments, first and second backplanes 910/912 may be integrated into a single monolithic backplane. Each of backplanes 910/912 (or an integrated monolithic backplane) may be similar to backplane 810 of FIGS. 8A 8C. Likewise, each array probe 920/960 may be similar to the array of probes 720 of FIGS. 7E-8C. Note that the cantilever members of the second array of probes 960 are substantially parallel to, and in opposition with, the cantilever members of the first array of probes 920.

The top-view of FIG. 9A is similar to the top-view of FIG. 8A, in that a DUT 940 is shown. DUT 940 includes a first row of contact pads 942 and a second row of contact pads 952. In various embodiments, DUT 940 may include a 1D array of μLEDs, where the first row of contact pads 942 corresponds to the anodes (i.e., the p-contacts) of the μLEDs in the 1D array and the second row of contact pads 952 corresponds to the cathodes (i.e., the n-contacts) of the μLEDs in the 1D array. For example, first contact pad 944 of the first row of contact pads 942 may corresponds to the anode (or p-contact) of a first μLED of the 1D arrays of μLEDs. Likewise, second contact pad 954 of the second row of contact pads 952 may correspond to the cathode (or n-contact) of the first μLED.

As shown in FIG. 9A, via a single touchdown event (i.e., the lowering of each of the first array of probes 920 and the second array of probes 960), the first array of probes 920 may make electrical contact with the contact pads of at least a portion of the first row of contact pads 942 (the anodes or p-contacts), and the second array of probes 960 may make electrical contact with at least a portion of the contact pads of the second row of contact pads 952 (the cathodes or the p-contacts). As such, circuits for each μLED may be completed, and thus the μLEDs may be operated via signals generated by backplanes 910/912 and provided by the probes. Note that these signals may operate the μLEDs, such that the μLEDs may generate light. The generated light may be detected, as discussed in conjunction with at least testing system 1100 of FIG. 11, to test the optical performance of the μLEDs.

As shown in FIG. 9A, in some embodiments, each array of probes 920/960 may have fewer probes than the number of contact pads in first and second rows of contact pads 942/952. For example, for the first touchdown event shown in FIG. 9A, the first μLED of the 1D array that includes the first contact pad 944 of the first row of contact pads 942 and the second contact pad 954 of the second row of contact 952 cannot be tested. A second touchdown even may be performed to test the first μLED (as well as other μLEDs not shown in FIG. 9A), by lifting the probe card off the DUT 940 and translating probe card 900 down the rows of contacts pads. After translating the probe card 900 down the rows, the probes may be aligned with the corresponding contact pads. Once aligned, the probe card may be lowered for the second touchdown event, and thus those previously untested μLEDs may be tested via the second touchdown event.

Turning now to FIG. 9B, enhanced probe card is being employed to test DUT 970. DUT 970 may include a 2D array of μLEDs. A first row of μLEDs of the 2D array of μLEDs is being tested with a first touchdown event. The first row of μLEDs is associated with a first pair of rows of contact pads 972, which includes the anodes and cathodes of a first row of μLEDs of the 2D array of μLEDs. After testing the first row of μLEDs, a second row of μLEDs of the 2D array of μLEDs may be tested by lifting probed card 910 from DUT 970 and translating probe card 900 to another row of μLEDs, such as but not limited to an adjacent row of μLEDs. For example, a second touchdown event would make electrical contact with a second pair of rows of contact pads 974, which include the anodes and cathodes for an adjacent second row of μLEDs.

Figure 10:
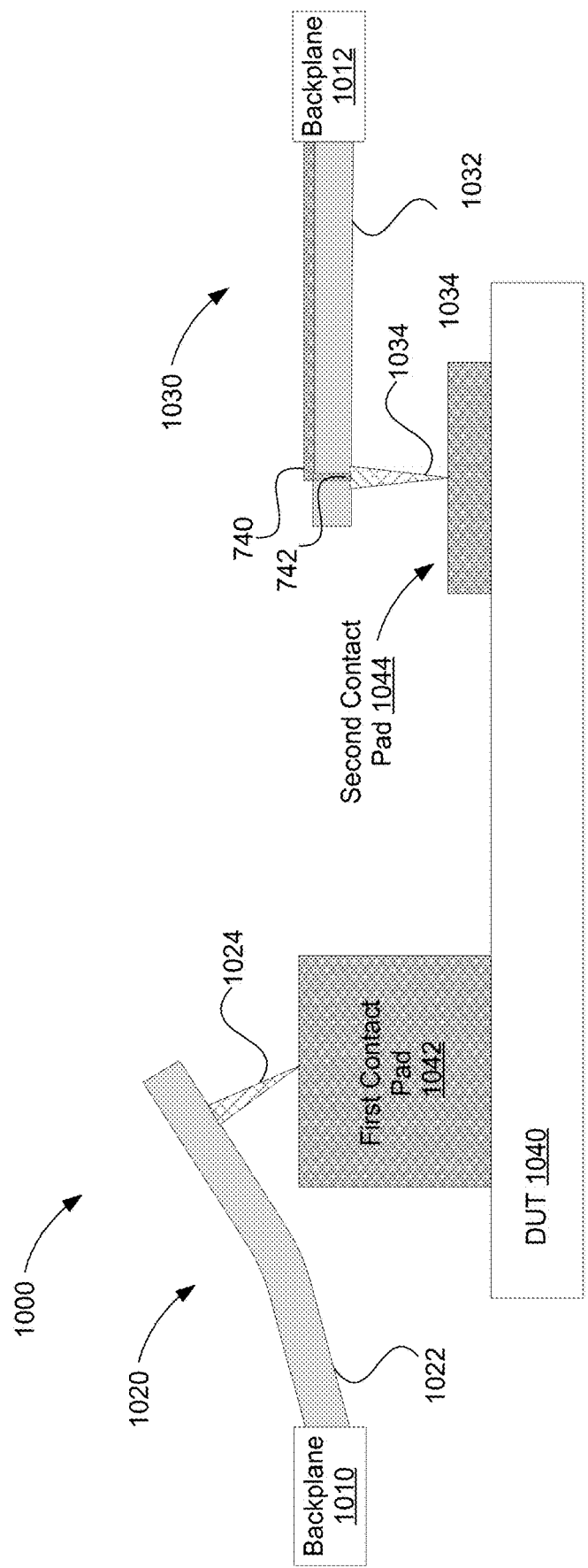
FIG. 10 includes a diagram illustrating a side-view schematic representation of an enhanced probe card and a device-under-test that demonstrates elastic properties of the probes.

FIG. 10 includes a diagram illustrating a side-view schematic representation of an enhanced probe card 1000 and a DUT 1040 that demonstrates elastic properties of the probes. Probe card 1000 may be a testing device. Enhanced probed 1000 includes a first probe 1020, extending from first backplane 1010, and a second probe 1030, extending from second backplane 1012. As previously noted, first and second backplanes 1010/1012 may be integrated into a monolithic backplane. First probe 1020 includes first cantilever member 1022 and first probe tip 1024. Second probe 1030 includes second cantilever member 1032 and second probe tip 1034. For illustrative purposes, electrically-conductive track 740 is shown on the upperside of cantilever member 1032. Thus, FIG. 10 illustrates an alternative embodiment to the embodiments shown in FIGS. 7A-7E, where track 740 was disposed on underside 716 of cantilever member 702. Also shown in FIG. 10 is the electrically conductive track and/or trace 742, which electrically couples conductive track 740 to conductive probe tip 1034.

Due to fabrication process variations, the contact pads of a DUT may be irregularly shaped and/or not uniform in shape and physical dimensions. DUT 1040 includes a first contact pad 1042 and a second contact pad 1044. As shown in FIG. 10, first and second contact pads 1042/1044 have dissimilar shapes and/or physical dimensions. The elastic properties of the cantilever members 1022/1032 and probe tips 1024/1034 prevent damage to the probes due to a touchdown event on contact pads with dissimilar shapes and/or physical dimensions. More particularly, a touchdown event where the first probe tip 1024 physically contacts with the larger-sized first contact pad 1042 and the second probe tip 1034 physically contacts the smaller-sized second contact pad 1034, will impart a compressive force of the first probe tip 1024. As shown in FIG. 10, and as a consequence of the elastic properties of the cantilever members 1022/1032 and probe tips 1024/1034, due to the compressive force, the first cantilever member 1022 and first probe tip 1024 will undergo an elastic deformation when the first probe tip 1024 is in physical and/or electrical contact with the larger-sized first contact pad 1042. The elastic deformation of the first cantilever member 1022 and/or the first probe tip 1024 will reduce the compressive force applied and/or imparted to the first probe tip 1024. As shown in FIG. 10, the elastic deformation deflects the distal portion of the first cantilever member 1024 and the first probe tip 1024, with respect to the DUT 1040 and/or backplane 1010. Furthermore, the various enhanced mechanical properties of the probe tips 1024/1034 will reduce physical degradation due to abrasive frictional forces imparted on the tips via numerous and repeated touchdown and lift-off events.

Figure 11:
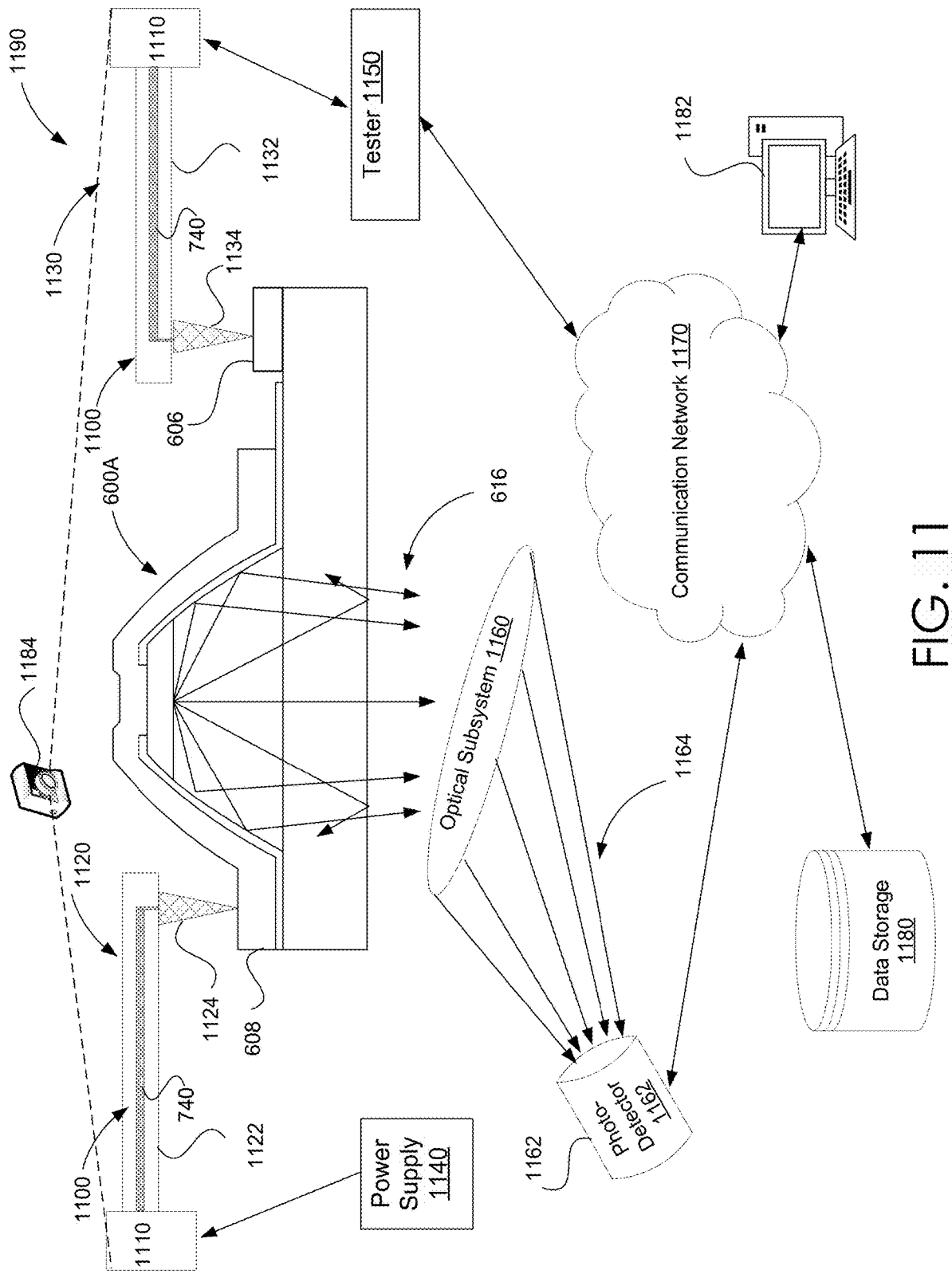
FIG. 11 includes a diagram illustrating an enhanced testing system that is employable to characterize a fabrication process of a semiconductor foundry.

FIG. 11 includes a diagram illustrating an enhanced testing system 1190 that is employable to characterize a fabrication process of a semiconductor foundry. Testing system 1190 includes an enhanced probe card 1100. Probe card 1100 may be a testing device. Probe card 1100 may be consistent with any of the probe card embodiments discussed herein, such as but not limited to probe card 800 of FIGS. 8A-8C, probe card 900 of FIGS. 9A-9B, and/or probe card 1000 of FIG. 10. As such, probe card 1100 includes a backplane 1110, a first probe 1120, and a second probe 1130. Each of first probe 1120 and second probe 1130 may be an enhanced AFM probe. As such, first probe 1120 may include a first cantilever member 1122 and a first probe tip 1124. Second probe 1130 may include a second cantilever member 1132 and a second probe tip 1134. Backplane 1100 may be similar to any of the backplanes discussed herein. For illustrative purposes, electrically-conductive tracks 740 are shown embedded within cantilever member 1122 and cantilever member 1132. Thus, FIG. 11 illustrates an alternative embodiment to the embodiments shown in FIGS. 7A-7E, where track 740 was disposed on underside 716 of cantilever member 702.

Testing system 1190 may additionally include at least one of a tester 1150, an external power supply 1140, and optical subsystem 1160, a photo-detector 1162, a communication network 1170, a data storage facility 1180, computing device 1182, and/or a camera device 1184. Testing system 1190 is being employed to test a DUT (e.g., LED 600A of FIG. 6A). First probe 1120 is probing p-contact 608 of LED 600A and second probe 1130 is probing n-contact 606 of LED 600A.

More particularly, first probe tip 1124 is in electrical contact with p-contact 608 and second probe tip 1134 is in electrical contact with n-contact 606. In order to probe LED 600A, camera device 1184 may be employed to align probe tips 1124/1134 with contacts 606/608, and enable the touchdown event that establishes electrical contact between the probes 1120/1130 and contacts 606/608.

Via power provided by external power supply 1140, backplane 1110 may generate one or more electrical signals (e.g., test signals). In at least one embodiment, at least a portion of the test signals may be generated by tester 1150 and provided to backplane 1110 via an I/O interface of the backplane 1110. In various embodiments, tester 1150 may include semiconductor automated test equipment (ATE). Tester 1150 may include various digital and/or analog test instrumentation, such as but not limited to a logic analyzer, an oscilloscope spectrum analyzer, various meters (e.g., a multi-meter), and the like. As discussed throughout, tester 1150 may generate test signals, via test vectors, and provide the test signals to the probe card 1100. Thus, first and second probes 1120/1130 may transmit one or more electrical signals (e.g., test signals) between backplane 1110 and LED 600A. The test signals may be generated onboard the probe card 1100 and/or generated by tester 1150. In response to the transmission of such test signals, LED 600A generates light 616, as represented by the arrows emerging from LED 600A. Various test signals (e.g., test signals generated by LED 600A and transmitted to backplane 1010) may be received at tester 1150 via the I/O interface included in backplane 1110. In some embodiments, tester 1150 may generate one or more additional test signals based on test signals received from backplane 1110.

Optical subsystem 1160 may receive the generated light 616, as well as focus and/or direct the light, such that focused light 1164 is received at photo-detector 1162. In response to receiving focused light 1162, photo-detector may generate one or more test signals. A generalized wired and/or wireless communication network 1170 communicatively couples at least a portion of photo-detector 1162, tester 1150, computing device 1182, and data storage facility 1180. The test data may be provided to and stored by data storage facility 1180. Computing device 1182 may access the stored test data, via data storage facility 1180 and communication network 1170. Computing device 1182 may analyze the test data, which may include data characterizing the electrical properties, as well as the optical properties (e.g., light-generation response and/or performance) of LED 600A. Thus, testing system 1190 may be employed to characterize the fabrication process for LED 600A.

Figure 12:
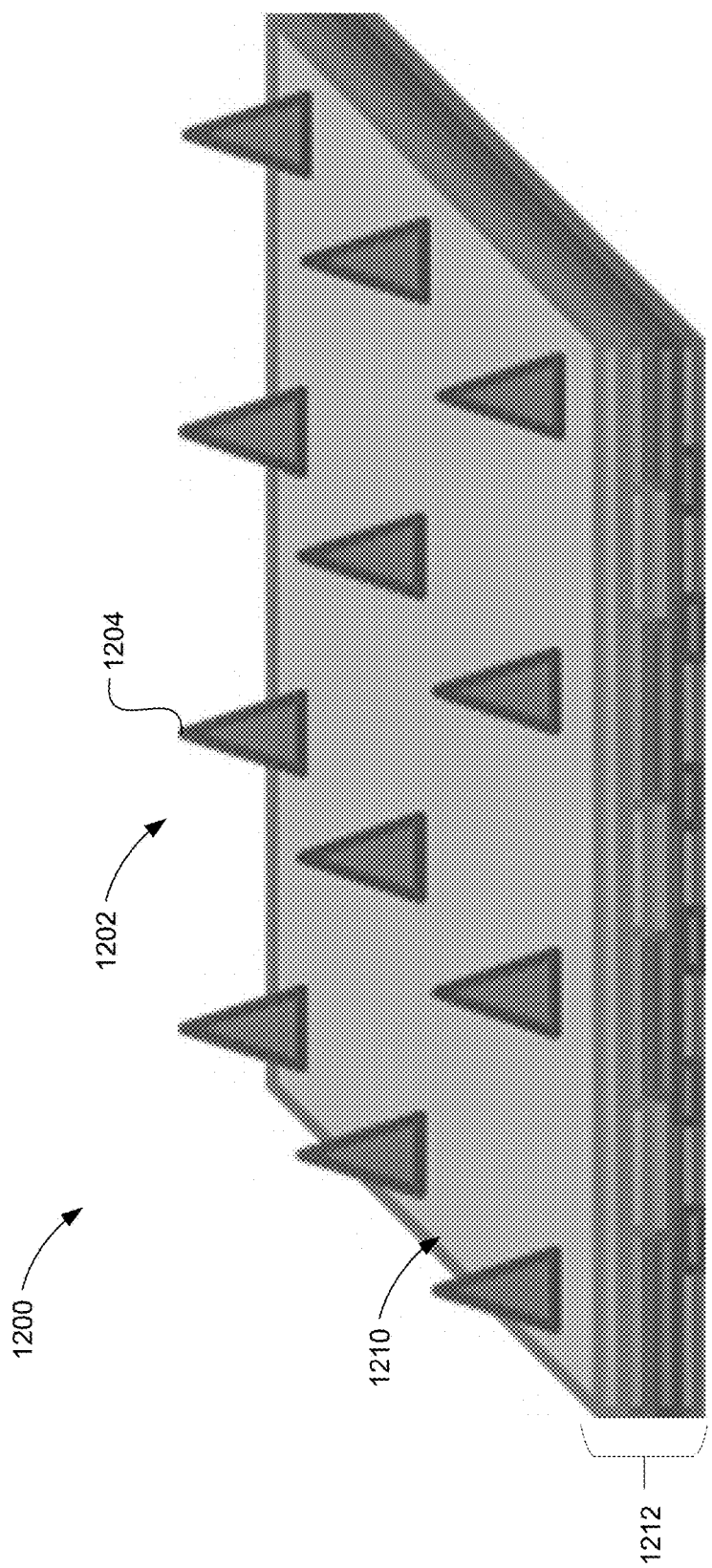
FIG. 12 includes a diagram illustrating a schematic representation of still another embodiment of an enhanced probe card that is consistent with various embodiments.

FIG. 12 includes a diagram illustrating a schematic representation of still another embodiment of an enhanced probe card 1200. Probe card 1200 may be a testing device. Enhanced probe card 1200 includes a 2D array of probe tips 1202 and a backplane 1210. Each probe tip in the 2D array of probe tips 1202, such as but not limited to probe tip 1204, may be an AFM probe tip, similar to the various embodiments of enhanced probe tips discussed herein. For example, the elasticity and electrical conductivity of probe tip 1204 may be enhanced via the various embodiments discussed herein. The arrangement of probe tips in the 2D array of probe tips 1202 substantially matches an arrangement of a 2D array of contact pads for a die. For example, the pitch (for both columns and rows) of the 2D array of probes 1202 may substantially match the pitch (for both columns and rows) of the 2D array of contact pads shown in any of DUTs 840 of FIG. 8A, DUT 940 of FIG. 9A, and/or DUT 970 of FIG. 9B. Thus, via the 2D array of probe tips 1202, at least a substantially large portion of a DUT may be probed via a single touchdown event.

Backplane 1210 may be a multilayer 1212 semiconductor backplane. That is, the multilayers 1212 of semiconductor material (or other device structures) may enable any of the various backplane elements discussed in conjunction with at least backplane 810 of FIG. 8A. For example, various semiconductor processes may be employed to fabricate and/or process any circuitry and/or components for implementing any of the backplane functionality discussed herein. It should be noted that any of the embodiments of backplanes discussed herein, including but not limited to backplane 710 of FIG. 7E, backplane 810 of FIGS. 8A-8C, backplanes 910/910 of FIGS. 9A-9B, backplanes 1010/1012 of FIG. 10, and/or backplane 1110 of FIG. 11 may be multilayer backplanes. Thus, such componentry, circuitry, and/or functionality may be fabricated, via a semiconductor process, on any backplane discussed herein.

Enhanced Processes for Characterizing Fabrication Processes of Foundries

Figure 13A:
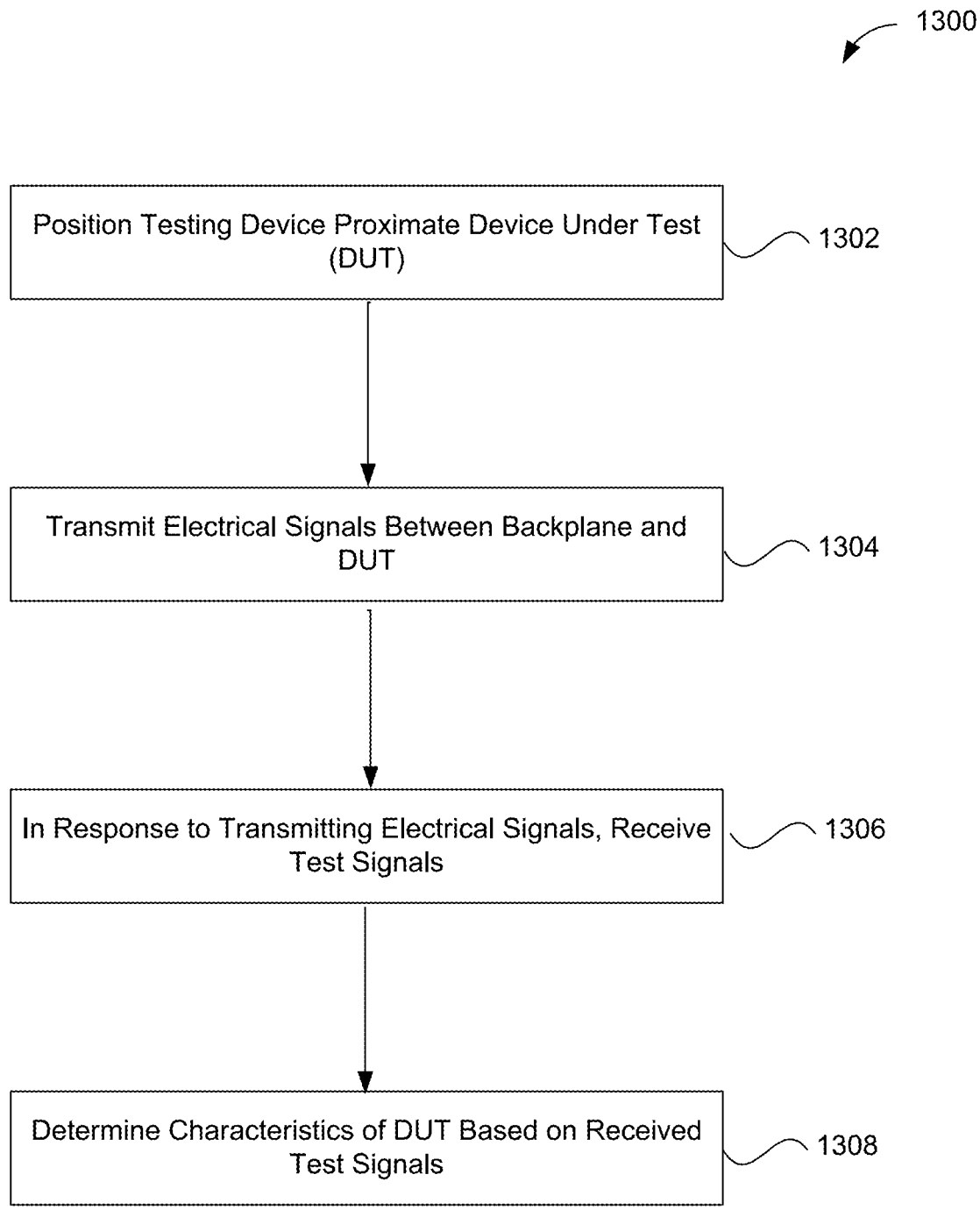
FIG. 13A illustrates one embodiment of an enhanced process flow for characterizing a fabrication process of a semiconductor foundry that is consistent with various embodiments.
Figure 13B:
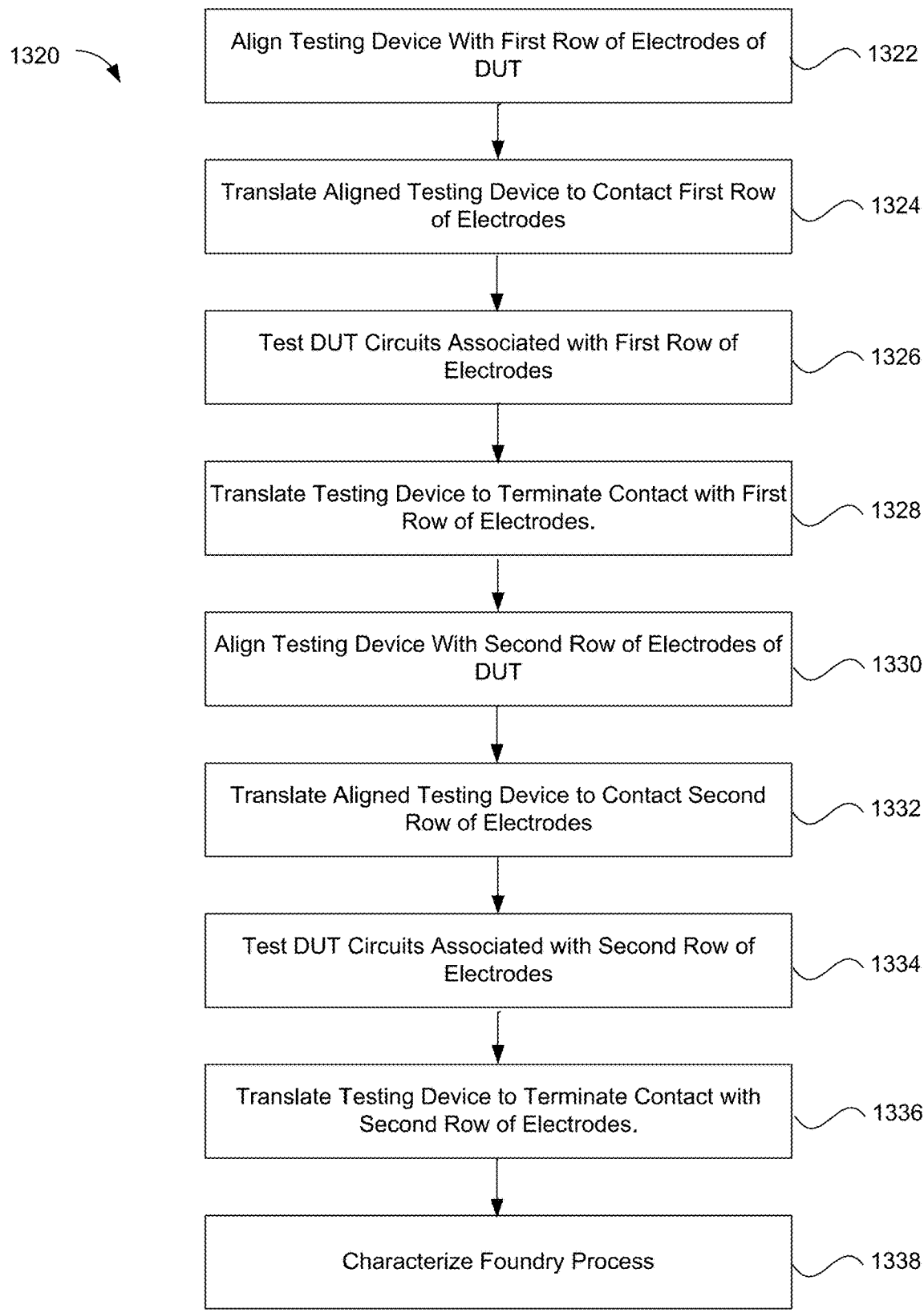
FIG. 13B illustrates another embodiment of an enhanced process flow for characterizing a fabrication process of a semiconductor foundry that is consistent with various embodiments.

FIG. 13A illustrates one embodiment of an enhanced process 1300 flow for characterizing a fabrication process of a semiconductor foundry. FIG. 13B illustrates another embodiment of an enhanced process 1320 flow for characterizing a fabrication process of a semiconductor foundry. That is, processes 1300 and 1320 may be employed to test the electrical and/or optical properties of semiconductor device (i.e., a DUT). In some non-limiting embodiments, the DUT (a semiconductor device) may be a light-emitting component (LEC), such as but not limited to a light-emitting diode (LED). In at least one embodiment, the LED may be a micro-LED (μLED). In other embodiments, the semiconductor device need not be a light-emitting device. For example, the semiconductor device may include a transistor, a non light-emitting diode, a resistive element, a capacitor, a microelectricalmechanical (MEMs) device, and the like. In some embodiments, the semiconductor device may include a logic device (e.g., a processors and/or an array of logic gates), a memory device (e.g., a SRAM, DRAM, and/or EEPROM), or any other integrated circuit (IC) device.

In embodiments where the DUT includes one or more μLEDs, the μLEDs may be included in any of the embodiments of head-mounted devices (HMDs) and/or near-eye display (NEDs) discussed herein. For example, a tested μLED may be included in a virtual-reality (VR) device, an augmented-reality (AR) device, and/or a mixed-reality (MR) device. The various operations, blocks, actions, and/or steps of processes 1300 and 1320 may be implemented via executing instructions on a processor device and/or controller device. When the instructions are executed, the processor device and/or controller device may cause the performance the various operations, blocks, actions, and/or steps of processes 1300 and 1320. The instructions may be stored on a non-transitory computer-readable storage medium and/or media.

As used herein, computer-readable storage media and/or medium can be any available media that can be accessed by a computing device and includes both volatile and nonvolatile media, and removable and non-removable media. By way of example, and not limitation, computer-readable media may comprise computer storage media and communication media. Computer storage media includes both volatile and nonvolatile, removable and non-removable media implemented in any method or technology for storage of information such as computer-readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by a computing device. Non-transitory computer-readable storage media does not comprise signals per se. Communication media typically embodies computer-readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above should also be included within the scope of computer-readable media.

Turning to FIG. 13A, process 1300 begins at block 1302, where a testing device (e.g., an enhanced probe card) is positioned proximate to the DUT. The DUT includes a row of electrodes. The testing device includes a backplane and an array of probes, wherein each probe includes a cantilever member and a probe tip. A probe may be an AFM probe. At block 1302, the testing device is translated (e.g., vertically and/or horizontally) such that the probe tip of each probe of the array is in electrical contact with a corresponding electrode of the row of electrodes. Various embodiments of positioning a testing device proximate a DUT are discussed at least in conjunction with FIG. 8C.

At block 1304, one or more electrical signals are transmitted between the testing device's backplane and the DUT, via the electrical contact between the probe tips and the corresponding electrodes. The electrical signals are transmitted at least along the cantilever member and the probe tip of at least one of the probes. The one or more electrical signals may include one or more test signals.

At block 1306, and in response to transmitting the one or more electrical signals at block 1306, one or more test signals are received. At least a portion of the received test signals may be received at the backplane, by one or more of the selectively addressable probes. The test signals may include additional one or more electrical signals generated by the DUT, and in response to the DUT receiving the test signals and/or electrical signals of block 1304. In some embodiments, at least a portion of the test signals may be generated in response to detecting light generated by the DUT, and in response to receiving the transmitted one or more electrical signals of block 1304. At block 1308, one or more characteristics of the DUT are determined based on the received test signals. In some embodiments, a process that fabricated the DUT is characterized based on the received test signals.

Turning now to FIG. 13B, where another embodiment of characterizing a fabrication process of a foundry is disclosed, process 1320 begins at block 1322, where a testing device is aligned with a first row of electrodes of the DUT. The testing device and DUT of process 1320 may be similar to any of the testing devices (e.g., enhanced probe cards) and DUTS discussed throughout, include but not limited to the testing device and DUT of process 1300 of FIG. 13A. The DUT of process 1320 may include at least a first row of electrodes and a second row of electrodes. Various embodiments of aligning the testing device with the first row of electrodes are discussed in conjunction with at least FIG. 8B. However, briefly here, at block 1322, the probe card is translated (e.g., vertically and/or horizontally) such that each of the probe tips of the array of probes is displaced from (e.g., above or below) and aligned with a corresponding electrode of the row of electrodes.

At block 1324, the aligned testing device is translated (e.g., vertically and/or horizontally) to electrical and/or physical contact the first row of electrodes. Translating the testing device at block 1324 may include lowering the testing device. Translating the testing device to contact the first row of electrodes may include positioning the test device proximate to the DUT, as discussed in conjunction with block 1302 of process 1300. Translating the device at block 1324 may include a touchdown event, as discussed throughout.

At block 1326, circuits of the DUT associated with the first row of electrodes are tested. Testing circuits of the DUT may include at least portions of transmitting electrical signals between the backplane and the DUT, as discussed in conjunction with block 1304 of process 1300, as well as at least portions of receiving test signals, as discussed in conjunction with at least block 1306. At block 1328, the testing device is translated (vertically and/or horizontally) to terminate the electrical and/or physical contact with the first row of electrodes. Translating the testing device at block 1328 may include lifting the testing device such that the electrical contact between each of the probe tips and the corresponding electrode is terminated. In some embodiments, translating the testing device at block 1328 may include a liftoff event.

At block 1330, the testing device is aligned with a second row of electrodes of the DUT. At block 1330, the testing device may be translated such that each of the probe tips of the arrays of probes is displaced from (e.g., above or below) and aligned with a corresponding electrode of the second row of electrodes. At block 1332, the testing device is translated to contact the second row of electrodes, similar to that of block 1324. At block 1332, the DUT circuits associated with the second row of electrodes are tested and/or probed, similar to that of block 1326. At block 1336, the testing device may be translated to terminate contact with electrodes of second row, similar to block 1328. At block 1338, the semiconductor process employed to fabricate the DUT may be characterized by the test data generated by process 1320.

From the foregoing, it will be seen that this invention is one well adapted to attain all the ends and objects set forth above, together with other advantages which are obvious and inherent to the system and method. It will be understood that certain features and subcombinations are of utility and may be employed without reference to other features and subcombinations. This is contemplated by and is within the scope of the claims.

The subject matter of the present invention is described with specificity herein to meet statutory requirements. However, the description itself is not intended to limit the scope of this patent. Rather, the inventors have contemplated that the claimed subject matter might also be embodied in other ways, to include different steps or combinations of steps similar to the ones described in this document, in conjunction with other present or future technologies. Moreover, although the terms "step" and/or "block" may be used herein to connote different elements of methods employed, the terms should not be interpreted as implying any particular order among or between various steps herein disclosed unless and except when the order of individual steps is explicitly described.

What is claimed is:

1. A testing device for electrically probing a device-under-test (DUT) that includes two rows[s] of electrodes, the testing device comprising:
   a backplane; and
   an array of probes extending from the backplane, another array of probes extending from the backplane, wherein each probe included in the another array of probes corresponds to one of the probes included in the array of probes, such that when a first probe of the array of probes is in electrical contact with a first anode of a row of anodes, a first probe of the another array of probes is in electrical contact with a first cathode of a row of cathodes, wherein the two rows of electrodes of the DUT comprises a row of anodes and the DUT includes another row of electrodes comprising a row of cathodes corresponding to the row of anodes, wherein the first cathode corresponds to the first anode, such that the first probe of the array of probes, the first probe of the another array of probes, and the backplane completes a circuit of the DUT that is operable by a transmitted electrical signal, wherein each probe of the array of probes and the another array of probes fabricated from a semiconductor material and including:
      a cantilever member with a proximate portion coupled to the backplane, wherein the cantilever member is electrically insulating and includes one or more electrically conductive traces: and
      a probe tip that includes a surface and a non-metallic conductive material located on the surface, wherein the probe tip is positioned on a distal portion of the cantilever member,
   wherein, each probe is configured to transmit the electrical signal between the backplane and the DUT, via the electrical signal passing through the non-metallic conductive material of the probe tip and a corresponding electrode of the row of electrodes, when the non-metallic conductive material located on the surface of the probe tip is in electrical and physical contact with the corresponding electrode[s], and wherein the electrical signal includes at least one of an electrical current or a voltage.

2. The testing device of claim 1, wherein a spacing between adjacent probe tips of the array of probes and the another array of probes substantially matches a spacing of the row of anodes and the row of cathodes.

3. The testing device of claim 1, wherein the cantilever member[s] of the probe[s] is an elastic member[s] such that, when the corresponding probe tip[s] are in electrical contact with the corresponding electrode[s] of the row of anodes and the row of cathodes, the cantilever member[s] reduce a compressive force applied to the corresponding probe tip[s] via an elastic deformation of the cantilever member[s] that deflects the distal portion[s] of the cantilever member[s] and the probe tip[s], with respect to the DUT.

4. The testing device of claim 1, wherein the DUT includes a row light-emitting diodes (LEDs) and when each probe of the array of probes and the another array of probes is concurrently in electrical contact with the corresponding electrode of the row of anodes and the row of cathodes, each LED of the row of LEDS is enabled for electrically probing.

5. The testing device of claim 1, wherein the backplane generates and receives separate electrical signals to each probe of the array of probes and the another array of probes.

6. A method for electrically probing a device-under-test (DUT) that includes two row[s] of electrodes, the method comprising:
   positioning a testing device proximate to the DUT, wherein the testing device includes a backplane and an array of probes extending from the backplane, another array of probes extending from the backplane, wherein each probe included in the another array of probes corresponds to one of the probes included in the array of probes, such that when a first probe of the array of probes is in electrical contact with a first anode of a row of anodes, a first probe of the another array of probes is in electrical contact with a first cathode of a row of cathodes, wherein the two rows of electrodes of the DUT comprises a row of anodes and the DUT includes another row of electrodes comprising a row of cathodes corresponding to the row of anodes, wherein the first cathode corresponds to the first anode, such that the first probe of the array of probes, the first probe of the another array of probes, and the backplane completes a circuit of the DUT that is operable by a transmitted electrical signal, wherein each probe of the array of probes and the another array of probes is fabricated from a semiconductor material and including a cantilever member, with a proximate portion coupled to the backplane, wherein the cantilever member is electrically insulating and includes one or more electrically conductive traces, and a probe tip positioned on a distal portion of the cantilever member that includes a surface and a non-metallic conductive material located on the surface, the testing device positioned proximate to the DUT such that each probe tip of each probe of the array of probes is in electrical contact with a first anode of the row of anodes and the another array of probes is in electrical contact with a first cathode of the row of cathodes; and
   transmitting one or more electrical signals between the backplane of the testing device and the DUT, via the corresponding electrode, the cantilever member of the probe[s], and the non-metallic conductive material of the probe tip[s], when the non-metallic conductive material located on the surface of the probe tip[s] is in physical contact with the two corresponding electrodes on a row of anodes and a row of cathodes and the one or more electrical signals includes at least one of an electrical current or a voltage.

7. The method of claim 6, wherein the DUT includes a row of micro light-emitting diodes (uLEDS), each uLED of the row of uLEDs being in electrical contact with one anode of the row of anodes and one cathode of the row of cathodes, and wherein there is a one-to-one correspondence between each probe of the array of probes and the another array of probes and each uLED of the row of uLEDs.

8. The method of claim 6, wherein positioning the testing device proximate to the DUT includes:
   aligning the testing device with the DUT such that each of the probe tips of the array of probes and the another array of probes is above and aligned with a corresponding electrode of the row of anodes and the row of cathodes;
   translating the testing device such that each of the probe tips is in electrical contact with the corresponding anode of the row of anodes and the corresponding cathode of the row of cathodes; and
   in response to the one or more electrical signals transmitted between the backplane of the testing device and the DUT, determining one or more characteristics of circuits included in the DUT and associated with the row of anodes and the row of cathodes.

9. The method of claim 8, wherein the DUT includes another row of electrodes and the method further comprises:
- translating the testing device such that the electrical contact between each of the probe tips and the corresponding anode of the row of anodes and the corresponding cathode of the row of cathodes is terminated;
- aligning the testing device with the DUT such that each of the probe tips of the array of probes is above and aligned with a different anode of the row of anodes and a different cathode of the row of cathodes;
- translating the testing device such that each of the probe tips is in electrical contact with the corresponding different anode of the row of anodes and the different cathode of the row of cathodes;
- transmitting additional electrical signals between the backplane and the DUT, via the electrical contact between the probe tips, the cantilever members, and the different anode of the row of anodes and the different cathode of the row of cathodes; and
- in response to transmitting the additional electrical signals between the backplane and the DUT, determining one or more characteristics of additional circuits, included in the DUT and associated with the another row of electrodes.

10. The method of claim 6, wherein each of the probes of the array of probes and the another array of probes is an atomic force microscopy (AFM) probe, and the probe tips are fabricated on the cantilever members such that an electrical conductivity and an elasticity of the probe tips are increased.

11. The method of claim 6, wherein the array of probes and the another array of probes is configured such that the cantilever members extend from the backplane as parallel cantilever members.

12. The method of claim 6, further comprising:
- using the testing device to characterize a process of a semiconductor foundry.

13. The method of claim 6, where a distance between adjacent probe tips is less than 10 microns.

14. A system for electrically probing a device-under-test (DUT) that includes two rows[s] of electrodes, the system comprising:
- a backplane; and
- an array of probes extending from the backplane, another array of probes extending from the backplane, wherein each probe included in the another array of probes corresponds to one of the probes included in the array of probes, such that when a first probe of the array of probes is in electrical contact with a first anode of a row of anodes, a first probe of the another array of probes is in electrical contact with a first cathode of a row of cathodes, wherein the two rows of electrodes of the DUT comprises a row of anodes and the DUT includes another row of electrodes comprising a row of cathodes corresponding to the row of anodes, wherein the first cathode corresponds to the first anode, such that the first probe of the array of probes, the first probe of the another array of probes, and the backplane completes a circuit of the DUT that is operable by a transmitted electrical signal, wherein each probe of the array of probes and the another array of probes is an atomic force microscopy (AFM) probe that is fabricated from a semiconductor material and including:
  - a cantilever member with a proximate portion coupled to the backplane, wherein the cantilever member is electrically insulating and includes one or more electrically conductive traces; and
  - a probe tip that includes a surface and a non-metallic conductive material located on the surface, and the probe tip is positioned on a distal portion of the cantilever member, wherein each probe is configured to transmit an electrical signal between the backplane and the DUT, via the electrical signal passing through the non-metallic conductive material of the probe tip and the corresponding electrode, when the non-metallic conductive material located on the surface of the probe tip is in electrical and physical contact with a corresponding anode of the row of anodes or a corresponding cathode of the row of cathodes, and wherein the electrical signal includes at least one of an electrical current or a voltage.

15. The system of claim 14, wherein the another array of probes extends
- from the backplane, where cantilever members of the another array of probes are substantially parallel to and in opposition with the cantilever members of the array of probes.

16. The system of claim 14, wherein the backplane includes a multiplexer component that separately addresses each probe of the array of probes.

17. The system of claim 14, wherein the backplane includes a plurality of drivers that drive separate electronic signals through each probe of the array of probes.

18. The system of claim 14, wherein the semiconductor material includes silicon.

19. The system of claim 14, wherein the probe tips are fabricated on the cantilever members and the non-metallic conductive material includes carbon compound nanoparticles.

* * * * *